(12) United States Patent
Kunita et al.

(10) Patent No.: US 6,716,565 B2
(45) Date of Patent: Apr. 6, 2004

(54) POSITIVE IMAGE-FORMING MATERIAL

(75) Inventors: Kazuto Kunita, Shizuoka (JP); Kenichiro Sato, Shizuoka (JP)

(73) Assignee: Fuji Photo Film Co., Ltd., Minami Ashigara (JP)

(*) Notice: Subject to any disclaimer, the term of this patent is extended or adjusted under 35 U.S.C. 154(b) by 24 days.

(21) Appl. No.: 10/043,135

(22) Filed: Jan. 14, 2002

(65) Prior Publication Data
US 2003/0057610 A1 Mar. 27, 2003

(30) Foreign Application Priority Data

Jan. 12, 2001 (JP) ................................. P.2001-005178
Apr. 13, 2001 (JP) ................................. P.2001-115595

(51) Int. Cl.$^7$ .............................................. G03F 7/604
(52) U.S. Cl. ..................................... 430/270.1; 430/905
(58) Field of Search .............................. 430/270.1, 905

(56) References Cited

U.S. PATENT DOCUMENTS

| 2,850,445 | A |   | 9/1958  | Oster |   |
|-----------|---|---|---------|-------|---|
| 4,708,925 | A |   | 11/1987 | Newman |   |
| 6,080,524 | A | * | 6/2000  | Choi  | 430/270.1 |
| 6,537,718 | B2 | * | 3/2003 | Nishiyama et al. | 430/170 |

FOREIGN PATENT DOCUMENTS

| EP | 0 544 264 A1 | 6/1993 |
| EP | 0 702 271 A1 | 3/1996 |
| EP | 0 949 539 A2 | 10/1999 |
| EP | 1 053 999 A2 | 11/2000 |
| EP | 1 091 247 A2 | 4/2001 |
| JP | 44-20189     | 8/1969 |
| JP | 2000 131847 A | 5/2000 |

* cited by examiner

Primary Examiner—Rosemary Ashton
(74) Attorney, Agent, or Firm—Burns, Doane, Swecker & Mathis, LLP

(57) ABSTRACT

The positive image-forming material comprises a resin including a repeating unit corresponding to a specific monomer having an α-heteromethyl structure.

21 Claims, No Drawings

POSITIVE IMAGE-FORMING MATERIAL

FIELD OF THE INVENTION

The present invention relates to a positive image-forming material applicable to image-forming materials such as three-dimensional modeling by light, holography, lithographic printing plates, color proofs, photoresists and color filters, and inks, paints and adhesives. In particular, the invention relates to a positive image-forming material favorably usable as the so-called direct lithographic printing plate material capable of plate-making directly from digital signals in a computer with various kinds of lasers, or suitably usable as photoresist materials.

BACKGROUND OF THE INVENTION

These years, it has become easy to acquire a compact and high power model of a solid laser, a semiconductor laser and a gas laser irradiating ultraviolet light, visible light or infrared light ranged from 300 nm to 1200 nm. These lasers are very useful as a recording light source when a printing plate is directly made by using digital data in a computer or the like.

Many studies have been done on recording materials responsive to these various kinds of laser beams. Typical ones are as follows:

First, for materials which can be recorded by an infrared laser irradiating 760 nm or more in photosensitive wavelength, positive recording materials described in U.S. Pat. No. 4,708,925 are mentioned.

Secondly, for recording materials responsive to ultraviolet light or visible light ranged from 300 nm to 700 nm, there are many materials such as radical polymerization-based negative recording materials described in U.S. Pat. No. 2,850,445 and Japanese Patent Publication No. 20189/1969.

On the other hand, materials responsive to short wavelength light of 300 nm or less and electron beams are particularly important for photoresist materials. In recent years, integrated circuits have endlessly been improved to a higher scale of integration. In manufacture of semiconductor boards with ULSIs (ultra-large scale integrated circuits), processing with ultra-fine pattern of 0.5 micrometer or less in line width is needed. In order to meet such a need, the wavelength of light in an exposure apparatus used for photolithography has become shorter to utilize far ultraviolet light or excimer laser light (XeCl, KrF or ArF), and further, formation of ultra-fine patterns by means of electron beams has come under investigation. In particular, electron beams are regarded as a promising light source for pattern formation techniques in the next generation.

The problem in common with all these image-forming materials is to obtain compatibility between film strength of the photosensitive layer and storage stability.

From viewpoint of printing durability, recording materials for lithographic printing plate materials need strong film strength. However, it is a difficult problem to obtain compatibility between film strength and storage stability of the photosensitive layer. With conventional arts, results to be sufficiently satisfied have not been obtained yet. Innovative techniques have, therefore, been desired.

On the other hand, recording materials for photoresist materials need strong film strength from viewpoint of etching resistance. Also in this case, it is a difficult problem to obtain compatibility between film strength and storage stability of the photosensitive layer. With prior arts, results to be sufficiently satisfied have not been obtained yet. Innovative techniques have, therefore, been desired.

SUMMARY OF THE INVENTION

The object of the present invention is, particularly regarding positive image-forming materials in the field of image-forming technology, to provide a positive image-forming material having advantages in film strength of the photosensitive layer and storage stability.

In particular, the object of the invention is to provide a positive image-forming material suitable to a lithographic printing plate material capable of plate-making directly by recording digital data in a computer with a solid laser or a semiconductor laser irradiating ultraviolet light, visible light or infrared light as well as to result in being excellent in film strength of the photosensitive layer and storage stability.

In the results of diligent investigations by the inventors of the invention, it has been found that the above objects can be achieved by using a polymer obtained by polymerizing specific monomer in a positive image-forming material. The invention has the following constitution.

(1) A positive image-forming material comprising a resin including a repeating unit corresponding to a monomer having a structure represented by formula (I):

wherein $Q^1$ represents a cyano group (CN) or a group represented by $—COX^2$; $X^1$ and $X^2$ each independently represents a hetero atom or a halogen atom; $R^a$ and $R^b$ each independently represents a hydrogen atom, a halogen atom, a cyano group or an organic residual group; and each of $X^1$ and $X^2$, $R^a$ and $R^b$, $X^1$ and $R^a$, and $X^1$ and $R^b$ may combine each other to form a cyclic structure.

(2) The positive image-forming material as described in item (1), wherein the resin contains an aliphatic cyclic structure in at least one of the main chain and the side chain.

(3) The positive image-forming material as described in item (1), wherein the resin further contains a repeating unit corresponding to a monomer having an aliphatic cyclic structure.

(4) The positive image-forming material as described in item (1), wherein the resin contains the repeating unit corresponding to a monomer having a structure represented by formula (I) in an amount of 5 mol % or more based on the entire repeating units.

(5) The positive image-forming material as described in item (2), wherein the resin contains a repeating unit having an aliphatic cyclic structure in an amount of 10 mol % or more based on the entire repeating units.

(6) The positive image-forming material as described in item (1), wherein the resin contains an alkali-soluble group.

(7) The positive image-forming material as described in item (1), which comprises the resin in an amount of 5 wt % to 100 wt % based on the amount of entire resins in the positive image-forming material.

(8) The positive image-forming material as described in item (1), which further comprises a photosensitive agent.

(9) The positive image-forming material as described in item (1), which further comprises a water-insoluble and alkali-soluble resin.

(10) The positive image-forming material as described in item (1), wherein $X^1$ and $X^2$ in formula (I) each independently represents a halogen atom or a non-metallic atom.

(11) The positive image-forming material as described in item (10), wherein the non-metallic atom is an oxygen atom, a sulfur atom, a nitrogen atom or a phosphor atom.

(12) The positive image-forming material as described in item (10), wherein the non-metallic atom has a substituent.

(13) The positive image-forming material as described in item (1), wherein $X^1$ represents a halogen atom, a hydroxyl group, a substituted oxy group, a mercapto group, a substituted thio group, an amino group, a substituted amino group, a sulfo group, a sulfonato group, a substituted sulfinyl group, a substituted sulfonyl group, a phosphono group, a substituted phosphono group, a phosphonato group, a substituted phosphonato group, a nitro group or a heterocyclic group.

(14) The positive image-forming material as described in item (1), wherein $X^2$ represents a halogen atom, a hydroxyl group, a substituted oxy group, a mercapto group, a substituted thio group, an amino group, a substituted amino group or a heterocyclic group.

(15) A lithographic printing plate precursor comprising an image-forming layer containing the positive image-forming material as described in the item (1).

(16) An acid-decomposable photosensitive composition comprising: a photo-acid generator; and a resin including a repeating unit corresponding to a monomer having a structure represented by formula (I):

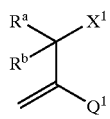

(I)

wherein $Q^1$ represents a cyano group (CN) or a group represented by —$COX^2$; $X^1$ and $X^2$ each independently represents a hetero atom or a halogen atom; $R^a$ and $R^b$ each independently represents a hydrogen atom, a halogen atom, a cyano group or an organic residual group; and each of $X^1$ and $X^2$, $R^a$ and $R^b$, $X^1$ and $R^a$, and $X^1$ and $R^b$ may combine each other to form a cyclic structure.

(17) An acid-decomposable lithographic printing plate precursor comprising a photosensitive layer containing the acid-decomposable photosensitive composition as described in the item (16).

In the positive image-forming material of the invention, it is preferable that the resin containing repeating units corresponding to monomer having a structure represented by Formula (I) has an aliphatic cyclic structure. The resin is more preferably a resin obtained by copolymerization of monomer having a structure represented by Formula (I) and monomer shaving an aliphatic cyclic structure, thereby the effects of the invention become more remarkable.

As starting monomers for a macromolecular binder, acrylic acid esters, acrylic acid amides, methacrylic acid esters and methacrylic acid amides, which have high polymerizability, have generally been used heretofore. On the contrary, itaconic acid esters and styrenes have low polymerizability.

For example, in such a case as a printing plate which needs strong film strength, it is important that the material can be polymerized to have a high molecular weight. Highly polymerizable monomers: acrylic and methacrylic systems are preferable for this purpose. However, when a polymer obtained from these systems is used as a binder for a photosensitive composition, the compatibility of the polymer with other low molecular weight components tends to become worse unfortunately in proportion to the increase of molecular weight of the polymer. This is apt to cause such a problem against storage stability that segregation may occur during storage.

On the other hand, α-hetero-substituted methylacrylates have been known as groups which have polymerizability equivalent to those of acrylic systems. In results of diligent investigations by the inventors of the invention to prepare polymers containing this material, it has been found that the compatibility of the polymer with other low molecular weight components tends hardly to become worse.

The reason is considered as that α-hetero methyl structures and ester or amide structures hang to the main chain of macromolecule as pendants making a projecting form to prevent aggregation among macromolecules one another, and that interaction with a low molecular weight compound is strengthened by the effect of the α-hetero group.

DETAILED DESCRIPTION OF THE INVENTION

For the positive image-forming material of the invention, any modes may be suitable as long as the material contains a resin (preferably the resin has aliphatic cyclic structures in the main or side chain) having repeating units corresponding to monomers having a structure represented by Formula (I) and an area treated by light and/or heat is removed with an aqueous solution (including an alkaline solution and water) or converted in polarity (convert from lipophilicity into hydrophilicity).

Preferable examples are specifically mentioned as follows.

(i) A positive image-forming material comprising: a water-insoluble and alkali-soluble resin which contains a repeating unit corresponding to a monomer having a structure represented by Formula (I); and a compound which decreases the alkali-solubility by interaction with the resin (e.g., interaction through hydrogen bonding) and increases the alkali-solubility by releasing the interaction by action of light or heat (a compound having the so-called positive action)

More preferable examples among modes in (i) are mentioned as follows.

(i-i) The positive image-forming material described in [i] in the above, where in a water-insoluble and alkali-soluble resin which contains a repeating unit corresponding to a monomer having a structure represented by Formula (I) has aliphatic cyclic structures in its molecule.

(i-ii) The positive image-forming material described in (i) in the above, which comprises: a water-insoluble and alkali-soluble resin which contains a repeating unit corresponding to a monomer having a structure represented by Formula (I); a water-insoluble and alkali-soluble resin as other component; and a compound which decreases alkali-solubility by interaction with either of the resins and increases the alkali-solubility by releasing the interaction by action of light or heat(a compound having the so-called positive action)

Other preferable examples are mentioned as follows.

(ii) A positive image-forming material comprising a low water-solubility or low alkali-solubility resin: containing a repeating unit corresponding to a monomer having a structure represented by Formula (I); and having a function that increases the alkali-solubility by action of light or heat.

Further, more preferable examples among modes in (ii) are mentioned as follows.

(ii-i) The positive image-forming material described in (ii) in the above, which comprises a low water-solubility or low alkali-solubility resin: containing a repeating unit corresponding to a monomer having a structure represented by Formula (I); containing a aliphatic cyclic structure; and having a function that directly or indirectly increases an alkali-solubility by action of light or heat.

(ii-ii) The positive image-forming material described in (ii) in the above, which comprises a low water-solubility or low alkali-solubility resin which contains: a repeating unit corresponding to a monomer having a structure represented by Formula (I); and a resin having an aliphatic cyclic structure as other component, wherein either of these resins has a function that directly or indirectly increases alkali-solubility by action of light or heat.

The acid-decomposable (positive) photosensitive composition of the present invention comprises a resin including a repeating unit corresponding to a monomer having a structure represented by formula (I). Acid-decomposable groups in the composition are decomposed by an acid generated by action of light in an exposed area to change the area from being hydrophobic to being hydrophilic and to make the area removable with an aqueous solution (including an alkaline solution and water)

Preferable examples are specifically mentioned as follows.

(iii) An acid-decomposable photosensitive composition comprising a resin including: a repeating unit corresponding to a monomer having a structure represented by formula (I); and an acid-decomposable group.

(iv) An acid-decomposable photosensitive composition comprising: a resin including a repeating unit corresponding to a monomer having a structure represented by formula (I), wherein the resin does not include an acid-decomposable group; and an acid-decomposable compound as another component.

(v) An acid-decomposable photosensitive composition comprising:
  a resin including: a repeating unit corresponding to a monomer having a structure represented by formula (I); and an acid-decomposable group; and
  an acid-decomposable compound as another component.

(vi) An acid-decomposable photosensitive composition comprising a resin including a repeating unit corresponding to a monomer having a structure represented by formula (I), wherein the resin is cross-linked with an acid-decomposable connecting group.

The constitutional components of the positive image-forming material of the invention will be described in detail hereinafter.

1) <Resin Containing a Repeating Unit Corresponding to a Monomer having a Structure Represented by Formula (I)>

The resin characterized in the invention is a polymer obtained by polymerizing monomers having a structure represented by Formula (I), according to necessity, together with copolymerization components. The resin is a polymer polymerized with a double bond adjacent to $Q^1$ as described in the above. It is preferable that the resin further has an aliphatic cyclic structure in the main or side chain.

The resin may be in various modes according to a mode of the image-forming material.

The structure represented by Formula (I) may be a one-valent substituent, or $R^a$, $R^b$, $X^1$ and $X^2$ in Formula (I) all may represent terminal groups to form a compound themselves.

In Formula (I), $Q^1$ is a cyano group (—CN) or a group represented by a formula: —$COX^2$. $X^1$ and $x^2$ each independently represent a hetero atom or a halogen atom. These group may be terminal group or connecting group. For the hetero atom, anon-metallic atom is preferred. Specifically, an oxygen atom, a sulfur atom, a nitrogen atom and a phosphor atom are mentioned. For the halogen atom, a chlorine atom, a bromine atom, an iodine atom and a fluorine atom are mentioned.

$X^1$ preferably represents a halogen atom or a connecting group having other substituent including a hydroxyl group, a substituted oxy group, a mercapto group, a substituted thio group, an amino group, a substituted amino group, a sulfo group, a sulfonato group, a substituted sulfinyl group, a substituted sulfonyl group, a phosphono group, a substituted phosphono group, a phosphonato group, a substituted phosphonato group, a nitro group, or a heterocyclic group (provided that these are connected at the hetero atom thereof to the bone structure of the structure represented by formula (I)).

$X^2$ preferably represents a halogen atom or a connecting group having other substituent including a hydroxyl group, a substituted oxy group, a mercapto group, a substituted thio group, an amino group, a substituted amino group or a heterocyclic group (provided that these are connected at the hetero atom thereof to the bone structure of the structure represented by formula (I)).

$X^1$ or $X^2$ may act as a connecting group to which other substituent may be connected.

Further, $X^1$ and $X^2$ may combine each other to form a ring structure.

$R^a$ and $R^b$ each independently and more preferably represent a hydrogen atom, a halogen atom, a cyano group, or as an organic residual group, a hydrocarbon group which may have a substituent and may contain an unsaturated bond, a substituted oxy group, a substituted thio group, a substituted amino group, a substituted carbonyl group and a carboxylato group. Further, $R^a$ and $R^b$ may combine each other to form a ring structure.

Examples of each substituent described in the above in $X^1$, $X^2$, $R^a$ and $R^b$ in Formula (I) will be indicated hereinafter.

For the hydrocarbon group which may have a substituent and may contain an unsaturated bond, mentioned are an alkyl group, a substituted alkyl group, an aryl group, a substituted aryl group, an alkenyl group, a substituted alkenyl group, an alkynyl group and a substituted alkynyl group.

For the alkyl group, an alkyl group having 1 to 20 carbon atoms in a straight or branched chain form or in a cyclic form can be mentioned. Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, in isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, an alkyl group having 1 to 12 carbon atoms in a straight chain form, an alkyl group having 3 to 12 carbon atoms in a branched chain form and an alkyl group having 5 to 10 carbon atoms in a cyclic form are more preferable.

The substituted alkyl group is formed by bonding between a substituent and an alkylene group. For the substituent, a one-valent non-metallic atomic group except a hydrogen atom is used. Preferable examples of the substituted alkyl group include a halogen atom (—F, —Br, —Cl and —I), a hydroxyl group, an alkoxy group, an aryloxy group, a mercapto group, analkylthio group, an arylthio group, an alkyldithio group, an aryldithio group, an amino group, an N-alkylamino group, an N, N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and its conjugated base group (hereinafter called as a carboxylato group), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter called as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and its conjugated base group, an N-alkylsulfonylsulfamoyl group [—SO$_2$NHSO$_2$(alkyl)] and its conjugated base group, an N-arylsulfonylsulfamoyl group [—SO$_2$NHSO$_2$(aryl)] and its conjugated base group, an N-alkylsulfonylcarbamoyl group [—CONHSO$_2$(alkyl)] and its conjugated base group, an N-arylsulfonylcarbamoyl group [—CONHSO$_2$(aryl)] and its conjugated base group, an alkoxysilyl group [—Si(O-alkyl)$_3$], an aryloxysilyl group [—Si(O-aryl)$_3$], a hydroxysilyl group [—Si(OH)$_3$] and its conjugated base group, a phosphono group [—PO$_3$H$_2$] and its conjugated base group (hereinafter called as a phosphonato group), a dialkylphosphono group [—PO$_3$ (alkyl)$_2$], a diarylphosphono group [—PO$_3$(aryl)$_2$], an alkylarylphosphono group [—PO$_3$(alkyl) (aryl)], a monoalkylphosphono group [—PO$_3$H (alkyl)] and its conjugated base group (herein after called as an alkylphosphonato group), a monoarylphosphono group [—PO$_3$H(aryl)] and its conjugated base group (hereinafter called as an arylphosphonato group), a phosphonoxy group [—OPO$_3$H$_2$] and its conjugated base group (hereinafter called as a phosphonatoxy group), a dialkylphosphonoxy group [—OPO$_3$(alkyl)$_2$], a diarylphosphonoxy group [—OPO$_3$(aryl)$_2$], an alkylarylphosphonoxy group [—OPO$_3$(alkyl) (aryl)], a monoalkylphosphonoxy group [—OPO$_3$H (alkyl)] and its conjugated base group (hereinafter called as an alkylphosphonatoxy group), a monoarylphosphonoxy group [—OPO$_3$H(aryl)] and its conjugated base group (hereinafter called as an arylphosphonatoxy group), a cyano group, a nitro group, an aryl group, an alkenyl group and an alkynyl group.

For specific examples of the alkyl group in these substituents, alkyl groups described in the above can be mentioned. Specific examples of the aryl group in these substituents include a phenyl group, a biphenyl group, a naphthyl group, a tolyl group, a xylyl group, a mesityl group, a cumenyl group, a fluorophenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group. Further, specific examples of the alkenyl group include a vinyl group, a 1-propenyl group, a 1-butenyl group, a cinnamyl group and a 2-chloro-1-ethenyl group. Specific examples of the alkynyl group include an ethynyl group, a 1-propynyl group, a 1-butynyl group, a trimethylsilylethynyl group and a phenylethenyl group.

In the acyl group (R4CO—) described in the above, those in which R4represents a hydrogen atom or the alkyl, aryl, alkenyl or alkynyl group described in the above can be mentioned.

On the other hand, for the alkylene group in the substituted alkyl group, those in which any one of hydrogen atoms on the alkyl group having 1 to 20 carbon atoms is removed to form a two-valent organic group can be mentioned. Preferably, an alkylene group having 1 to 12 carbon atoms in a straight chain form, an alkylene group having 3 to 12 carbon atoms in a branched chain form and an alkylene group having 5 to 10 carbon atoms in a cyclic form can be mentioned. Specific examples of the preferable substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a methoxycarbonylmethyl group, a methoxycarbonylbutyl group, an ethoxycarbonylmethyl group, a butoxycarbonylmethyl group, an allyloxycarbonylmethyl group, a benzyloxycarbonylmethyl group, a methoxycarbonylphenylmethyl group, a trichloromethylcarbonylmethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfopropyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group,

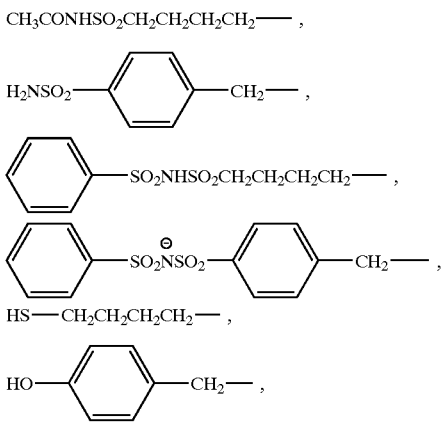

phosphonobutyl group, a phosphonatohexyl group, a diethylphosphonobutyl group, a diphenylphosphonopropyl group, a methylphosphonobutyl group, a methylphosphonatobutyl group, a tolyiphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

For the aryl group, those in which one to three benzene rings form a condensed ring and those in which a benzene ring and a 5-membered unsaturated ring form a condensed ring can be mentioned. Specific examples of the aryl group include a phenyl group, a naphthyl group, an anthryl group, a phenanthryl group, an indenyl group, an acenaphthenyl group and a fluoryl group. Among them, a phenyl group and a naphthyl group are more preferred.

The substituted aryl group is a group in which a substituent bonds to the aryl group. Those having a one-valent non-metallic atomic group except a hydrogen atom as a substituent on the ring-forming carbon atoms of the aryl group are used. For examples of the preferable substituent, the alkyl group and the substituted alkyl group described in the above as well as those formerly indicated as the substituent in the substituted alkyl group can be mentioned. Specific examples of these preferable substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, a phenylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group and a 3-butynylphenyl group.

For the alkenyl group, those described in the above can be mentioned. The substituted alkenyl group is a group in which a substituent replaces a hydrogen atom of the alkenyl group to combine with the alkenyl group. For the substituent, any substituent in the substituted alkyl group described in the above can be used. On the other hand, for the alkenyl group, the foregoing alkenyl groups can be used. For examples of the preferable substituted alkenyl group,

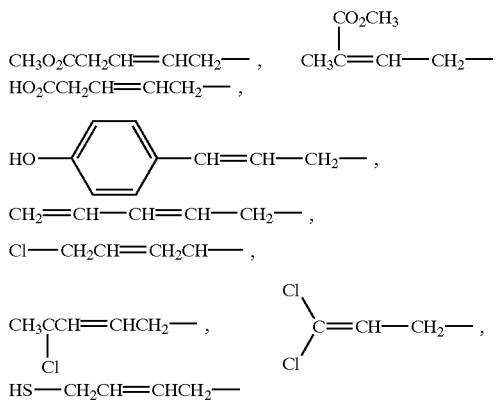

can be mentioned.

For the alkynyl group, those described in the above can be mentioned. The substituted alkynyl group is a group in which a substituent replaces a hydrogen atom of the alkynyl group to combine with the alkynyl group. For the substituent, any substituent in the substituted alkyl group described in the above can be used. On the other hand, for the alkynyl group, the foregoing alkynyl groups can be used.

The heterocyclic group is a one-valent group in which a hydrogen atom on the heterocycle is removed, and a one-valent group (a substituted heterocyclic group) in which another hydrogen atom on the foregoing one-valent group is further removed and a substituent in the foregoing substituted alkyl group combines with it. As examples of the preferable heterocycle,

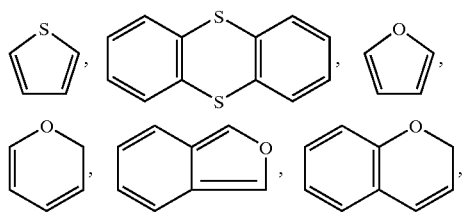

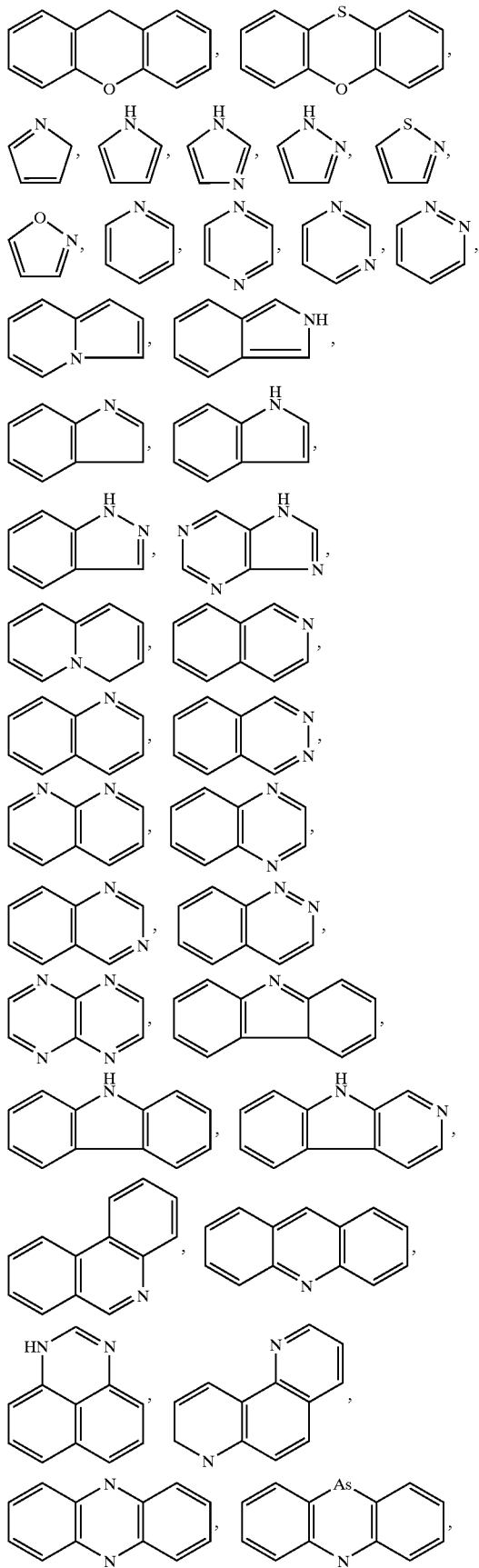
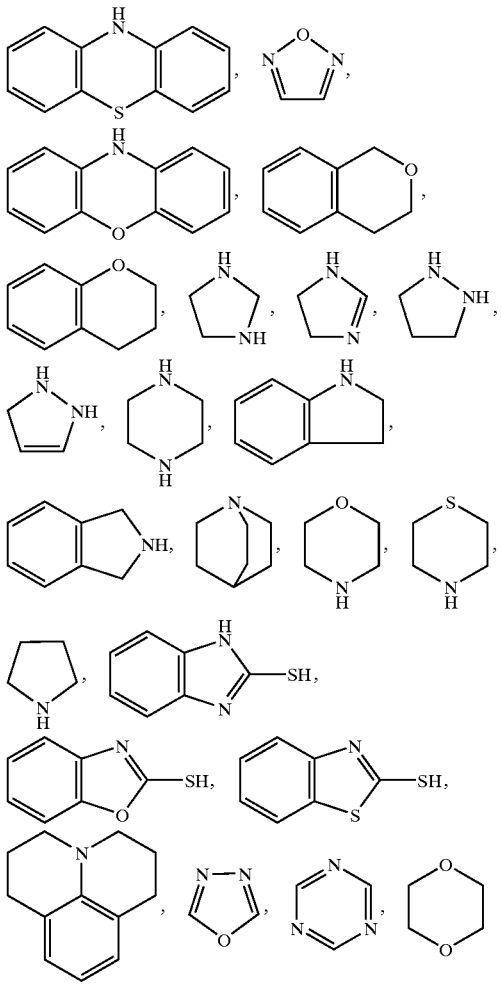

can be mentioned.

For the substituted oxy group (R5O—), those in which R5 represents a one-valent non-metallic atomic group except a hydrogen atom can be used. Preferable substituted oxy groups include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. For the alkyl group and the aryl group in the foregoing groups, those formerly indicated as an alkyl group, a substituted alkyl group, an aryl group and a substituted aryl group can be mentioned. Further, for the acyl group (R6CO—) in the acyloxy group, those in which R6 represents an alkyl group, a substituted alkyl group, an aryl group and a substituted aryl group described in the above can be mentioned. Among these substituents, an alkoxy group, an aryloxy group, an acyloxy group and an arylsulfoxy group are more preferred. Specific examples of the preferable substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonoxy group and a phosphonatoxy group.

For the substituted thio group (R7S—), a group in which R7 represents a one-valent non-metallic atomic group except a hydrogen atom can be used. Examples of the preferable substituted thio group include an alkylthio group, an arylthio group, an alkyldithio group, an aryldithio group and an acylthio group. For the alkyl group and the aryl group in the foregoing groups, those formerly indicated as an alkyl group, a substituted alkyl group, an aryl group and a substituted aryl group can be mentioned. R6 of the acyl group (R6CO—) in the acylthio group is the same as that defined in the above. Among these, analkylthio group and an arylthio group are more preferred. Specific examples of the preferable substituted thio group include a methylthio group, an ethylthio group, a phenylthio group, an ethoxyethylthio group, a carboxyethylthio group and a methoxycarbonylthio group.

For the substituted amino group [R8NH—, (R9) (R10) N—], a group in which R8, R9 and R10 represent a one-valent non-metallic atomic group except a hydrogen atom can be used. Examples of the preferable substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group.

For the alkyl group and the aryl group in the foregoing groups, those formerly indicated as an alkyl group, a substituted alkyl group, an aryl group and a substituted aryl group can be mentioned. R6 of the acyl group (R6CO—) in the acylamino group, an N-alkylacylamino group and an N-arylacylamino group is the same as that defined in the above. Among these, an N-alkylamino group, an N,N-dialkylamino group, an N-arylamino group and an acylamino group are more preferred. Specific examples of the preferable substituted amino group include a methylamino group, an ethylamino group, a diethylamino group, a morpholino group, a piperidino group, a pyrrolidino group, a phenylamino group, a benzoylamino group and an acetylamino group.

For the substituted carbonyl group (R11-CO—), a group in which R11 represents a one-valent non-metallic atomic group can be used. Examples of the preferable substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. For the alkyl group and the aryl group in the foregoing groups, those formerly indicated as an alkyl group, a substituted alkyl group, an aryl group and a substituted aryl group can be mentioned. Among these, more preferable substituted carbonyl groups are a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group. Furthermore preferable substituted carbonyl groups are a formyl group, an acyl group, a carboxyl group, an alkoxycarbonyl group and an aryloxycarbonyl group. Specific examples of the preferable substituted carbonyl group include a formyl group, an acetyl group, a benzoyl group, a carboxyl group, a methoxycarbonyl group, an allyloxycarbonyl group, an N-methylcarbamoyl group, an N-phenylcarbamoyl group, an N, N-diethylcarbamoyl group and a morpholinocarbamoyl group.

For the substituted sulfinyl group (R12-SO—), a group in which R12 represents a one-valent non-metallic atomic group can be used. Examples of the preferable substituted sulfinyl group include an alkylsulfinyl group, an arylsulfinyl group, a sulfinamoyl group, an N-alkylsulfinamoyl group, an N, N-dialkylsulfinamoyl group, an N-arylsulfinamoyl group, an N, N-diarylsulfinamoyl group and an N-alkyl-N-arylsulfinamoyl group. For the alkyl group and the aryl group in the foregoing groups, those formerly indicated as an alkyl group, a substituted alkyl group, an aryl group and a substituted aryl group can be mentioned. Among these, an alkylsulfinyl group and an arylsulfinyl group are more preferred. Specific examples of such a substituted sulfinyl group include a hexylsulfinyl group, a benzylsulfinyl group and a tolylsulfinyl group.

For the substituted sulfonyl group (R13-SO$_2$—), a group in which R13 represents a one-valent non-metallic atomic group can be used. For more preferable examples, an alkylsulfonyl group and an arylsulfonyl group can be mentioned. For the alkyl group and the aryl group in the foregoing groups, those formerly indicated as an alkyl group, a substituted alkyl group, an aryl group and a substituted aryl group can be mentioned. Specific examples of the substituted sulfonyl group include a butylsulfonyl group and a chlorosulfonyl group.

The sulfonato group (—SO$_3^-$) means an anionic group of the conjugated base of a sulfo group (—SO$_3$H) as described in the above, and is preferably used together with a counter cation as usual. For such a counter cation, those known to the public, namely, various oniums (ammoniums, sulfoniums, phosphoniums, iodoniums and aziniums) as well as metallic ions (Na$^+$, K$^+$, Ca$^{2+}$ and Zn$^{2+}$) are mentioned.

The carboxylato group (—CO$_2^-$) means an anionic group of the conjugated base of a carboxyl group (CO$_2$H) as described in the above, and is preferably used together with a counter cation as usual. For such a counter cation, those known to the public, namely, various oniums (ammoniums sulfoniums, Phosphoniums, iodoniums and aziniums) as well as metallic ions (Na$^+$, K$^+$, Ca$^{2+}$ and Zn$^{2+}$) are mentioned.

The substituted phosphono group means a group in which one or two hydroxyl groups on the phosphono group is replaced by other organic oxo group. Preferable examples of the substituted phosphono group include a dialkylphosphono group, a diarylphosphono group, an alkylarylphosphono group, a monoalkylphosphono group and a monoarylphosphono group as described in the above. Among them, a dialkylphosphono group and a diarylphosphono group are more preferred. Specific examples of them include a diethylphosphono group, a dibutylphosphono group and a diphenylphosphono group.

The phosphonato group (—$PO_3^{2-}$, —$PO_3H^-$) means an anionic group of the conjugated base originated from the first dissociation of acid or the second dissociation of acid of a phosphono group (—$PO_3H_2$) as described in the above, and is preferably used together with a counter cation as usual. For such a counter cation, those known to the public, namely, various oniums (ammoniums, sulfoniums, phosphoniums, iodoniums and aziniums) as well as metallic ions ($Na^+$, $K^+$, $Ca^{2+}$ and $Zn^{2+}$) are mentioned.

The substituted phosphonato group means an anionic group of the conjugated base in which one hydroxyl group on the substituted phosphono group is replaced by other organic oxo group, among the substituted phosphono groups described in the above. Specific examples of the substituted phosphonato group include a conjugated base of a monoalkylphosphono group [—$PO_3H$ (alkyl)] and of a monoarylphosphono group [—$PO_3H$(aryl)] described in the above. The substituted phosphonato group is preferably used together with a counter cation as usual. For such a counter cation, those known to the public, namely, various oniums (ammoniums sulfoniums, phosphoniums, iodoniums and aziniums) as well as metallic ions ($Na^+$, $K^+$, $Ca^{2+}$ and $Zn^{2+}$) are mentioned.

Examples of the cyclic structure formed by combining $X^1$ and $X^2$ $R^a$ and $R^b$, or $X^1$ and $R^a$ or $R^b$ each other will be indicated hereinafter. For aliphatic rings formed by combining $X^1$ and $X^2$, $R^a$ and $R^b$, or $X^1$ and $R^a$ or $R^b$ each other, aliphatic rings of a 5-membered ring, a 6-membered ring, a 7-membered ring and a 8-membered ring can be mentioned. More preferably, aliphatic rings of a 5-membered ring and a 6-membered ring can be mentioned. Further, these may have a substituent on a carbon atom constituting these. Furthermore, a part of carbon atoms constituting a ring may be replaced by a hetero atom (an oxygen atom, a sulfur atom and a nitrogen atom). Still furthermore, a part of such an aliphatic ring may form a part of an aromatic ring.

Specific examples of the monomer having a structure represented by Formula (I) will be indicated hereinafter.

Group A

General Formula

TABLE 1

| No. | $X^1$ | $X^2$ |
|---|---|---|
| A-1 | OH | $OCH_3$ |
| A-2 | OH | $O(n)C_4H_9$ |
| A-3 | OH | $O(n)C_{12}H_{25}$ |
| A-4 | OH | 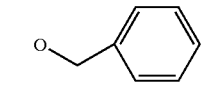 |
| A-5 | OH | 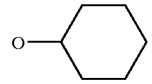 |
| A-6 | OH | 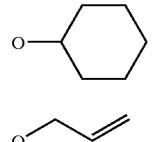 |
| A-7 | OH | 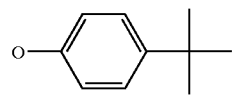 |
| A-8 | $OCH_3$ | $OC_2H_5$ |
| A-9 |  | $O(n)C_4H_9$ |
| A-10 | $O(n)C_8H_{17}$ | $OCH_3$ |
| A-11 | 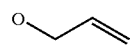 | 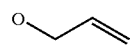 |

TABLE 1-continued
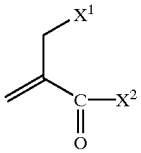
| No. | X¹ | X² |
|---|---|---|
| A-12 | 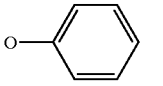 | OCH₃ |
| A-13 | 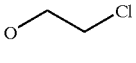 | OCH₃ |
| A-14 | 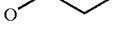 | OCH₃ |
| A-15 | 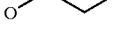 | OC₂H₅ |
| A-16 | 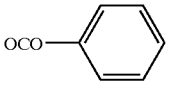 | OC₂H₅ |
| A-17 | OCOCH₃ | OCH₃ |
| A-18 | OCO(n)C₆H₁₃ | OCH₃ |
| A-19 | 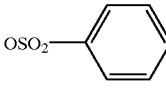 | OCH₃ |
| A-20 | OSO₂CH₃ | OCH₃ |
| A-21 | OSO₂(n)C₄H₉ | OCH₃ |
| A-22 | 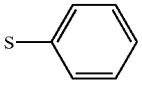 | OCH₃ |
| A-23 | OSO₂CF₃ | OC₂H₅ |
| A-24 | SCH₃ | OC₂H₅ |
| A-25 | S(n)C₄H₉ | OC₂H₅ |
| A-26 | 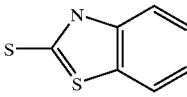 | OC₂H₅ |
| A-27 | 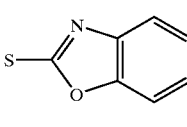 | OCH₃ |
| A-28 | 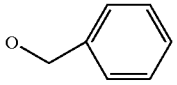 | OCH₃ |
| A-29 | F | O(n)C₁₂H₂₅ |
| A-30 | F |  |
| A-31 | Cl | OCH₃ |

TABLE 1-continued
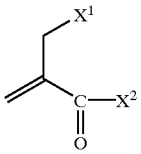
| No. | X¹ | X² |
|---|---|---|
| A-32 | Cl | 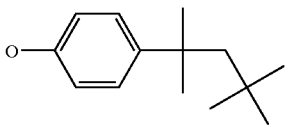 |
| A-33 | Br | O(n)C$_4$H$_9$ |
| A-34 | Br | 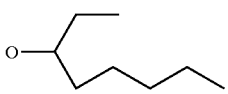 |
| A-35 | I | O(n)C$_4$H$_9$ |
| A-36 | I | 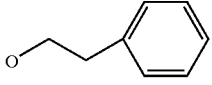 |
| A-37 |  | OC$_2$H$_5$ |
| A-38 |  | OC$_2$H$_5$ |
| A-39 |  | OC$_2$H$_5$ |
| A-40 |  | OC$_2$H$_5$ |
| A-41 | 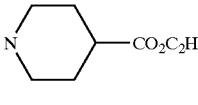 | OC$_2$H$_5$ |
| A-42 | 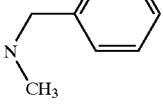 | OC$_2$H$_5$ |
| A-43 | 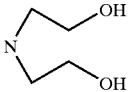 | OC$_2$H$_5$ |

TABLE 1-continued
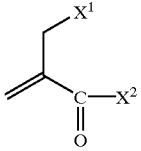
| No. | X¹ | X² |
|---|---|---|
| A-44 | 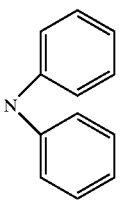 | $OC_2H_5$ |
| A-45 | 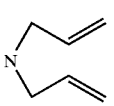 | $OC_2H_5$ |
| A-46 | $NHCOCH_3$ | $OCH_3$ |
| A-47 | $NHCO(n)C_4H_9$ | $O(n)C_4H_9$ |
| A-48 | 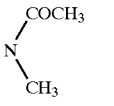 | $OCH_3$ |
| A-49 | $NHSO_2CH_3$ | $O(n)C_4H_9$ |
| A-50 | 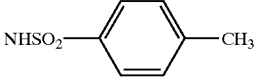 | $O(n)C_4H_9$ |
| A-51 | $OCOCH_3$ | 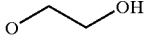 |
| A-52 | $OCOCH_3$ | 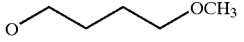 |
| A-53 | $OCOCH_3$ | 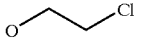 |
| A-54 | $OCOCH_3$ | 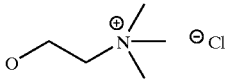 |
| A-55 | $OCOCH_3$ | 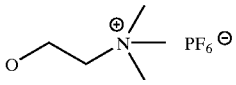 |
| A-56 | $OCOC_2H_5$ | 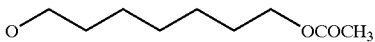 |
| A-57 | $OCOC_2H_5$ | 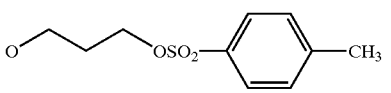 |
| A-58 | $OCOC_2H_5$ | 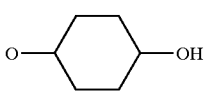 |
| A-60 | 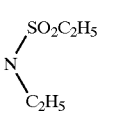 | $OCH_3$ |

TABLE 1-continued
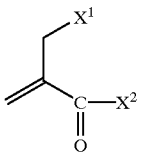
| No. | $X^1$ | $X^2$ |
|---|---|---|
| A-70 | OCOCH$_3$ | 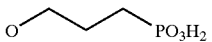 |
| A-71 | OCOCH$_3$ | 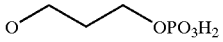 |
| A-72 | OCOCH$_3$ | 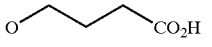 |
| A-73 | 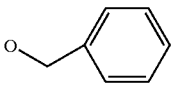 | OH |
| A-74 | 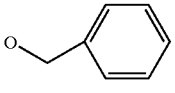 | O$^\ominus$ Na$^\oplus$ |
| A-75 | 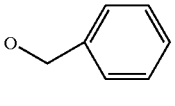 | 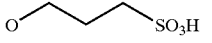 |
| A-76 | 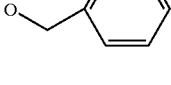 |  |
| A-77 | 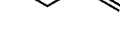 | 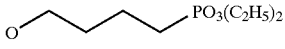 |
| A-78 | 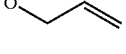 | 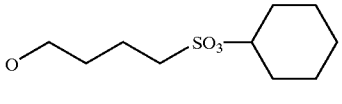 |
| A-79 | OH | OC$_2$H$_5$ |
| A-80 | 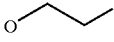 | OCH$_3$ |
| A-81 | 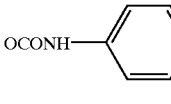 | OCH$_3$ |
| A-82 | 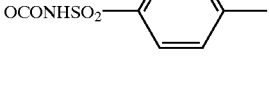 | OCH$_3$ |
| A-83 | 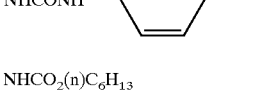 | OCH$_3$ |
| A-84 | NHCO$_2$(n)C$_6$H$_{13}$ | OCH$_3$ |
| A-85 | OCSNH(n)C$_4$H$_9$ | OCH$_3$ |

Group B
TABLE 2
| | |
|---|---|
| B-1 | 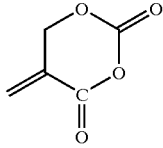 |
| B-2 | 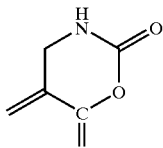 |
| B-3 | 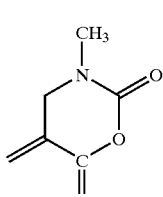 |
| B-4 | 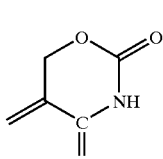 |
| B-5 | 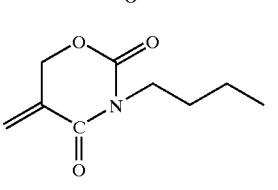 |
| B-6 | 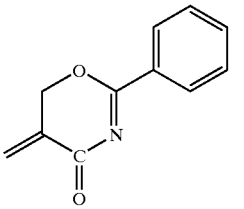 |
| B-7 | 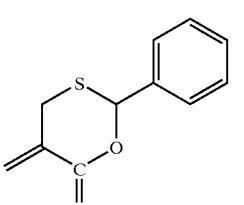 |
| B-8 | 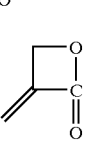 |
| B-9 | 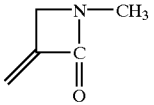 |
Group C
General Formula
TABLE 3
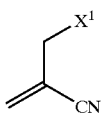
| No. | $X^1$ |
|---|---|
| C-1 | OH |
| C-2 | $OCH_3$ |
| C-3 |  |
| C-4 | $O(n)C_8H_{17}$ |
| C-5 | 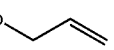 |
| C-6 | 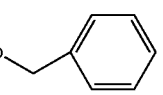 |
| C-7 | 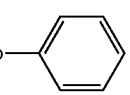 |
| C-8 | 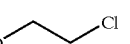 |
| C-9 | 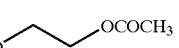 |
| C-10 | 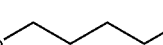 |
| C-11 | $OCOCH_3$ |
| C-12 | $OCO(n)C_6H_{13}$ |
| C-13 | 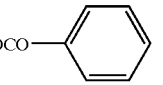 |
| C-14 | $OSO_2CH_3$ |
| C-15 | $OSO_2(n)C_4H_9$ |
| C-16 | 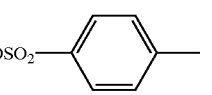 |
| C-17 | $OSO_2CF_3$ |
| C-18 | $SCH_3$ |
| C-19 | $S(n)C_4H_9$ |
| C-20 | 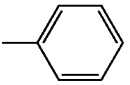 |
| C-21 | 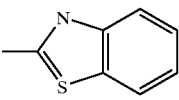 |

TABLE 3-continued

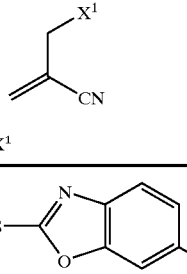

| No. | X¹ |
|---|---|
| C-22 |  |
| C-23 | F |
| C-24 | Cl |
| C-25 | Br |
| C-26 | I |
| C-27 |  |
| C-28 |  |
| C-29 | 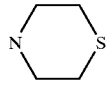 |
| C-30 | 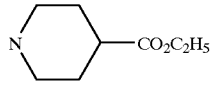 |
| C-31 | 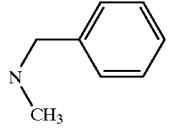 |
| C-32 | 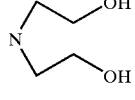 |
| C-33 | 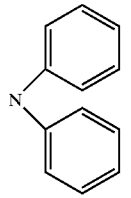 |
| C-34 | 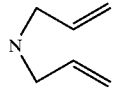 |
| C-35 | 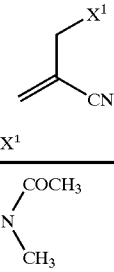 |
| C-36 | NHCOCH₃ |
| C-37 | NHCO(n)C₄H₉ |

TABLE 3-continued

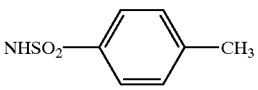

| No. | X¹ |
|---|---|
| C-38 | 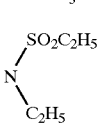 |
| C-39 | NHSO₂CH₃ |
| C-40 | 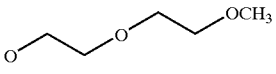 |
| C-41 | OCOCH₃ |
| C-42 | 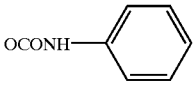 |
| C-43 | 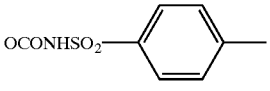 |
| C-44 | OCONH—⌬ |
| C-45 | OCONHSO₂—⌬—CH₃ |
| C-46 | NHCONH—⌬ |
| C-47 | NHCO₂(n)C₆H₁₃ |
| C-48 | OCSNH(n)C₄H₉ |

In the invention, either of a homopolymer contains only a unit corresponding to a monomer having a structure represented by Formula (I) described in the above or a copolymer containing other unit such as a unit having an aliphatic cyclic structure may be used.

It is preferable for the resin involved in the invention to have an aliphatic cyclic structure in the main or side chain of the resin together with unit containing structure represented by Formula (I).

The aliphatic cyclic structure may be contained in a structure represented by Formula (I) (contained in at least one of $X^1$, $Q^2$, $R^a$ and $R^b$) and in other unit (copolymerization components) When the aliphatic cyclic structure is contained in the main chain of the resin, the aliphatic cyclic structure is inevitably contained in other unit (copolymerization components). In viewpoint of simplicity of synthesis, it is more preferred that the aliphatic cyclic structure is contained in other unit.

The fundamental skeleton of the aliphatic cyclic structure contained in the main or side chain of the resin represents a cyclic hydrocarbon skeleton of a single ring or a multi-ring.

For the single ring-based cyclic hydrocarbon skeleton, an aliphatic cyclic skeleton having 3 carbon atoms or more, and preferably 3 to 8 carbon atoms can be mentioned. For example, aliphatic cyclic skeletons such as cyclopropane, cyclobutane, cyclopentane and cyclohexane can be mentioned. For the multi-ring-based cyclic hydrocarbon skeleton, an aliphatic cyclic skeleton having 5 carbon atoms or more, and preferably 7 to 25 carbon atoms can be mentioned. For example, aliphatic cyclic hydrocarbon skeletons such as bicyclo, tricyclo and tetracyclo can be mentioned. These single ring-based or multi-ring-based cyclic hydrocarbon skeletons may further have a substituent to increase numbers of carbon atoms.

For a preferable substituent of the single ring-based or multi-ring-based aliphatic cyclic skeleton, a hydroxyl group, a halogen atom, a nitro group, a cyano group, an amide group and the same alkyl group as that described in the paragraph regarding Formula (I) can be mentioned. The halogen atom is a fluorine atom, a chlorine atom, a bromine atom or an iodine atom. For the substituent, an alkoxy group, an alkoxycarbonyl group, an acyl group, an acyloxy group, and a carboxy group are further mentioned. For the alkoxy group, an alkoxy group having 1 to 8 carbon atoms such as a methoxy group, an ethoxy group, a hydroxyethoxy group, a propoxy group, a hydroxypropoxy group and a butoxy group can be mentioned. For the alkoxycarbonyl group, an alkoxycarbonyl group such as a methoxycarbonyl group and an ethoxycarbonyl group can be mentioned. For the acyl group, a formyl group, an acetyl group and a benzoyl group can be mentioned. For an acyloxy group, an acetoxy group and a butylyloxy group can be mentioned.

Typical structural examples of the multi-ring-based or single ring-based aliphatic ring part of the multi-ring-based or single ring-based cyclic hydrocarbon group include those indicated hereinafter.

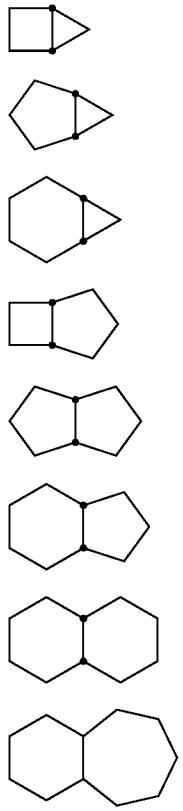

(1)
(2)
(3)
(4)
(5)
(6)
(7)
(8)

-continued

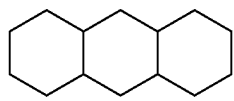

(9)

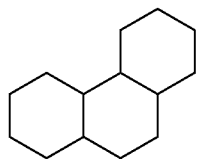

(10)

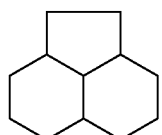

(11)

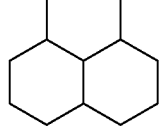

(12)

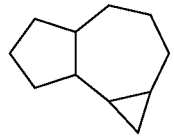

(13)

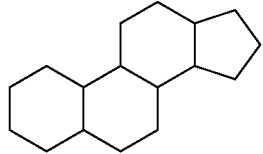

(14)

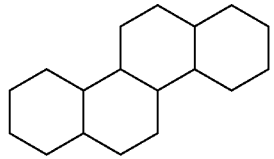

(15)

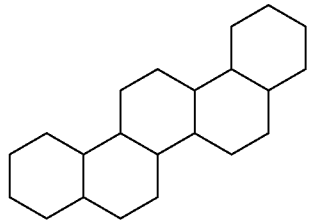

(16)

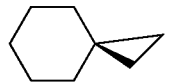

(17)

(18)

(19)

(20)

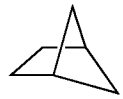

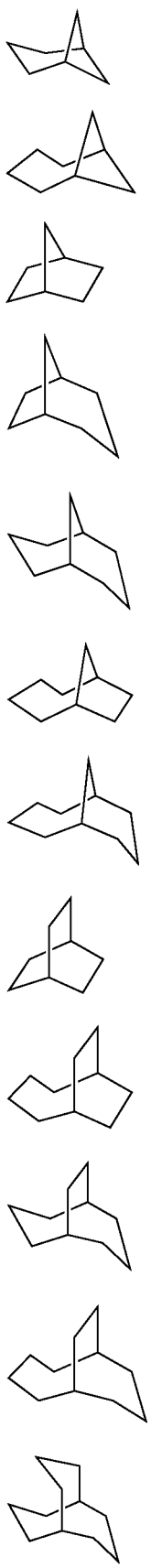
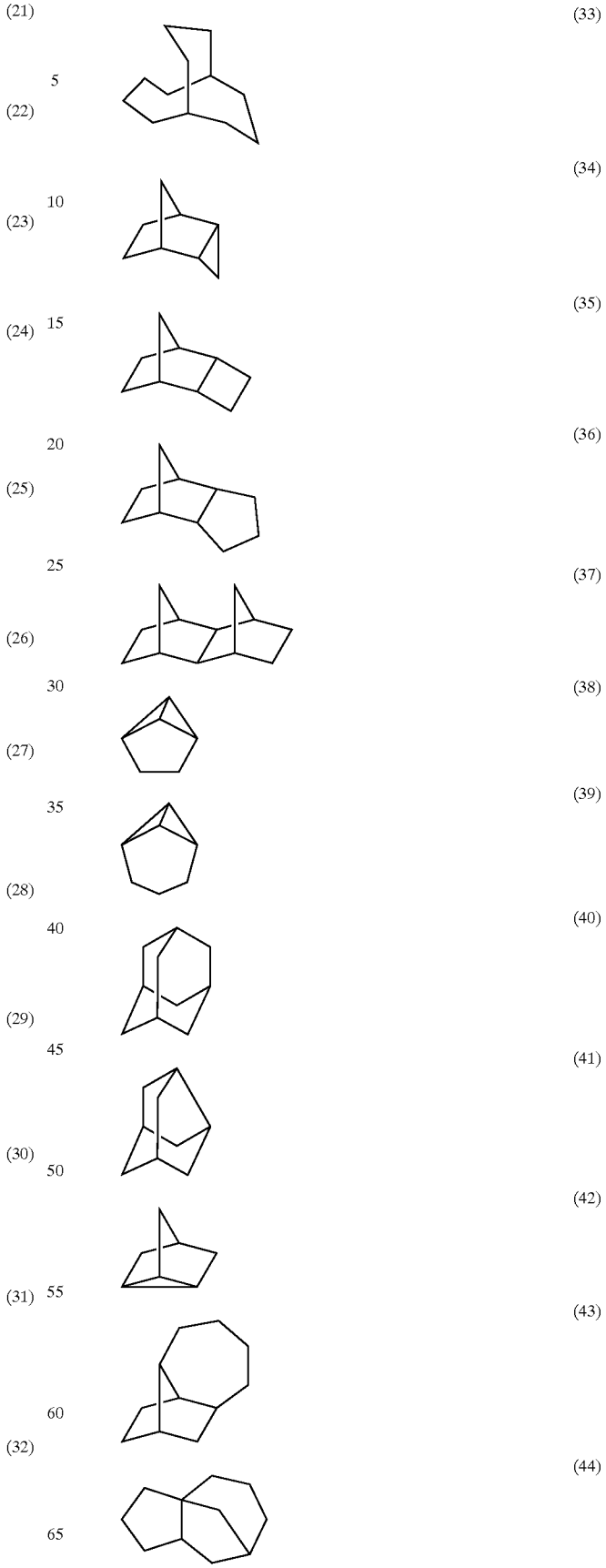

(45) 

(46) 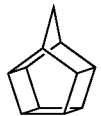

(47) 

(48) 

(49) 

(50) 

In case that these multi-ring-based or single ring-based cyclic hydrocarbon groups are contained in a structure represented by Formula (I), the multi-ring-based or single ring-based cyclic hydrocarbon groups is contained in at least any one of $X^1$, $X^2$, $R^a$ and $R^b$ in Formula (I).

Further, in case that these multi-ring-based or single ring-based cyclic hydrocarbon groups are contained as copolymerization components in a structure represented by Formula (I), the copolymerization component may be any form, and preferably a structural unit represented by General Formulas (II) to (V) described below.

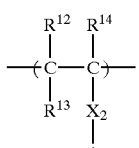

(II)

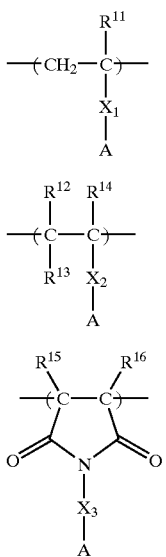

(III)

(IV)

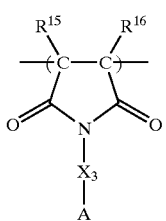

(V)

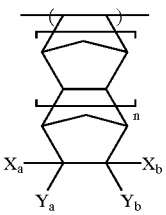

First, General Formulas (II) to (IV) will be explained, and subsequently General Formula (V) will be explained hereinafter.

In General Formulas (II) to (IV), substituents bonding to the main chain of repeating units, namely $R^{11}$, $R^{12}$ and $R^{14}$ to $R^{16}$, represent a hydrogen atom, halogen atom, a cyano group, an alkyl group or a haloalkyl group. $R^{11}$, $R^{12}$ and $R^{14}$ to $R^{16}$ each may be the same or different.

For the alkyl groups represented by $R^{11}$, $R^{12}$ and $R^{14}$ to $R^{16}$, a methyl group, an ethyl group, a propyl group, a n-butyl group and a sec-butyl group can be mentioned.

For the haloalkyl groups, a group in which a part or the entire of an alkyl group having 1 to 4 carbon atoms is replaced by a halogen atom can be mentioned, wherein a fluorine atom, a chlorine atom or a bromine atom is preferably mentioned for a halogen atom. Specific examples of the haloalkyl group include a fluoromethyl group, a chloromethyl group, a bromomethyl group, a fluoroethyl group, a chloroethyl group and a bromoethyl group.

These alkyl groups and haloalkyl groups may further have a substituent except a halogen atom.

Substituent $R^{13}$ represents a cyano group, —CO—$OR^{23}$ or —CO—$NR^{24}R^{25}$.

In the above, $R^{23}$ represents a hydrogen atom, an alkyl group, a cycloalkyl group or an alkenyl group, or an acid-decomposable group. For the acid-decomposable group, the same ones as those described later can be illustrated. Among those represented by $R^{23}$, an alkyl group, a cycloalkyl group and an alkenyl group may further have a substituent.

Further, $R^{24}$ and $R^{25}$ represent a hydrogen atom, an alkyl group, a cycloalkyl group or an alkenyl group. The alkyl group, the cycloalkyl group and the alkenyl group may have a substituent. $R^{24}$ and $R^{25}$ may be the same or different. $R^{24}$ and $R^{25}$ may combine each other to form a ring with a nitrogen atom. For the ring structure in such a case, a 5- to 8-membered ring is preferred. Specifically, a pyrrolidine skeleton, a piperidine skeleton and a piperazine skeleton can be mentioned.

For the alkyl group represented by $R^{23}$ to $R^{25}$, an alkyl group having 1 to 8 carbon atoms is preferable. Specifically, a methyl group, an ethyl group, a propyl group, a n-butyl group, a sec-butyl group, a hexyl group, a 2-ethylhexyl group and an octyl group can be mentioned.

For the cycloalkyl group represented by $R^{23}$ to $R^{25}$, a cycloalkyl group having 3 to 8 carbon atoms is preferable. Specifically, a cyclopropyl group, a cyclopentyl group and a cyclohexyl group can be mentioned.

For the alkenyl group represented by $R^{23}$ to $R^{25}$, an alkenyl group having 2 to 6 carbon atoms is preferable. Specifically, a vinyl group, a propenyl group, an allyl group, a butenyl group, a pentenyl group, a hexenyl group and a cyclohexenyl group can be mentioned. The alkyl group, the cycloalkyl group and the alkenyl group may have a substituent.

In General Formulas (II) to (IV), among substituents constituted in the form of $X_1$-A, $X_2$-A or $X_3$-A, $X_1$ to $X_3$ represent a single bond or a two-valent group. Examples of the two-valent group include an alkylene group, an alkenylene group, a cycloalkylene group, —O—, —SO$_2$—, —O—CO—$R^{26}$—, —CO—O—$R^{27}$— and —CO—NR$^{28}$—R$^{29}$—. $X_1$ to $X_3$ may be the same or different.

For the alkylene group, the alkenylene group and the cycloalkylene group of $X_1$ to $X_3$, a two-valent group having the same carbon skeleton as that of the alkylene group, the alkenylene group and the cycloalkylene group represented by $R^{11}$, $R^{12}$ and $R^{14}$ to $R^{16}$ can be mentioned respectively.

$R^{26}$, $R^{27}$ and $R^{29}$ in the —O—CO—$R^{26}$—, —CO—O—$R^{27}$— and —CO—NR$^{28}$—R$^{29}$— of $X_1$ to $X_3$ each represent a single bond or a two-valent group. Examples of the two-valent group include an alkylene group, an alkenylene group and a cycloalkylene group. Also in this case, for the alkylene group, the alkenylene group and the cycloalkylene group of $X_1$ to $X_3$, a two-valent group having the same carbon skeleton as that of the alkylene group, the alkenylene group and the cycloalkylene group represented by $R^{11}$, $R^{12}$ and $R^{14}$ to $R^{16}$ can be mentioned respectively. Further, with these groups, an ether group, an ester group, an amide group, a urethane group or a ureido group may combine to form a two-valent group as a whole. The three of $R^{26}$, $R^{27}$ and $R^{29}$ may be the same or different one another.

Substituent $R^{28}$ in —CO—NR$^{28}$—R$^{29}$— of $X_1$ to $X_3$ represents a hydrogen atom, an alkyl group, a cycloalkyl group or an alkenyl group in the same manner as that in $R^{23}$ to $R^{25}$. The alkyl group, the cycloalkyl group and the alkenyl group may have a substituent. $R^{28}$ may be the same as either of $R^{24}$ or $R^{25}$ or different from them. Specific examples of the alkyl group, the cycloalkyl group and the alkenyl group represented by $R^{28}$ are respectively the same as those in case of the alkyl group, the cycloalkyl group and the alkenyl group represented by $R^{23}$ to $R^{25}$.

Substituent A indirectly bonding to the main chain of repeating units via X, and the like represents a single ring-based or multi-ring-based cyclic hydrocarbon group. For the single ring-based or multi-ring-based cyclic hydrocarbon group, those described in the above can be mentioned.

General Formula (V) will be explained hereinafter.

In General Formula (V) described in the above, n represents 0 or 1.

Xa and Xb represent a hydrogen atom or an alkyl group having 1 to 4 carbon atoms.

Ya and Yb represent a hydrogen atom, a hydroxyl group or a group represented by —COOXc, wherein, as a mode, Xc represents a hydrogen atom or an alkyl group. For the alkyl group, an alkyl group having 1 to 8 carbon atoms, and preferably an alkyl group having 1 to 4 carbon atoms can be mentioned. Specific examples of the alkyl group include a methyl group, an ethyl group, a propyl group, a butyl group and a tert-butyl group. A part or all of hydrogen atoms of these alkyl groups may be replaced by a hydroxyl group, a halogen group or a cyano group.

In other mode of Xc, —COOXc as a whole represents a group which constitutes an acid-decomposable group. Specifically, groups represented by Formula (x) and (y) described later can be mentioned. In addition to those, a group containing a lactone structure having acid-decomposability and a group containing an aliphatic cyclic structure having acid-decomposability can be mentioned.

Specific examples of the repeating structural unit represented by General Formulas (II) to (V) will be indicated hereinafter. However, the invention should not construed as being limited thereto.

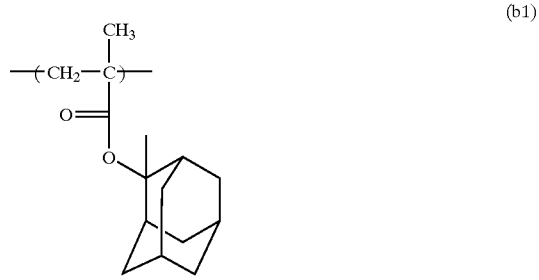

(b1)

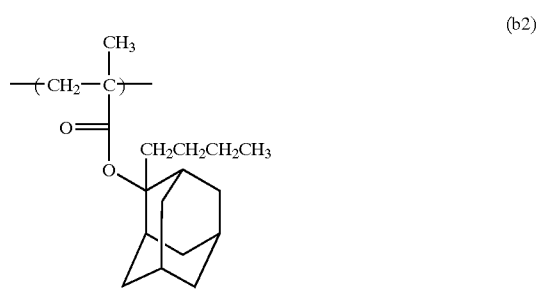

(b2)

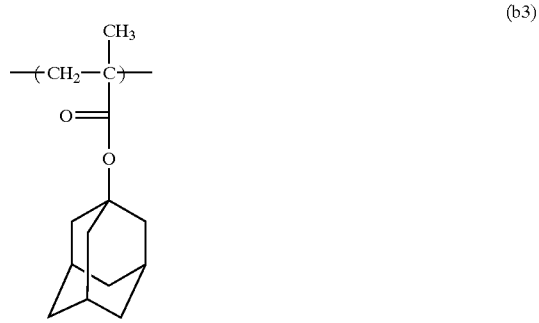

(b3)

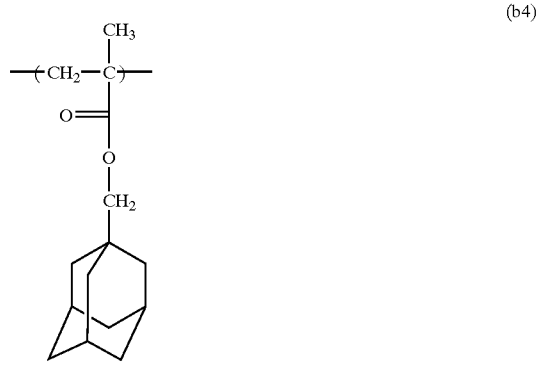

(b4)

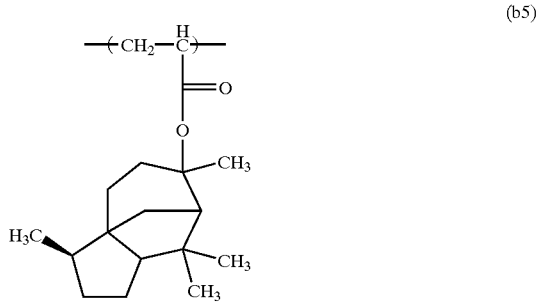

(b5)

(b6) 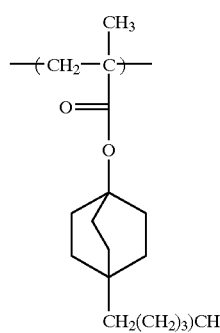
(b7) 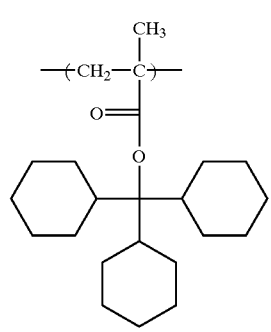
(b8) 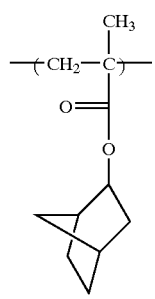
(b9) 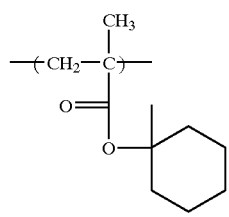
(b10) 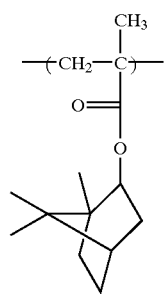
(b11) 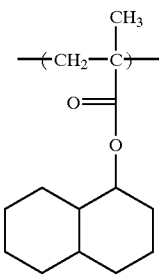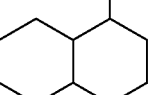
(b12) 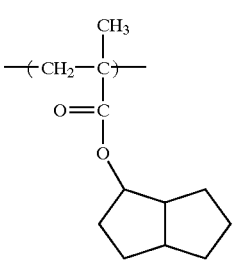
(b13) 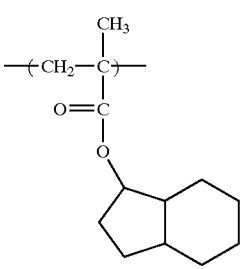
(b14) 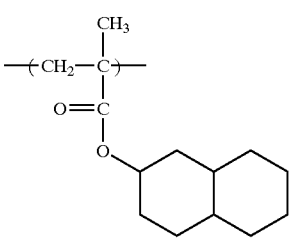
(b15) 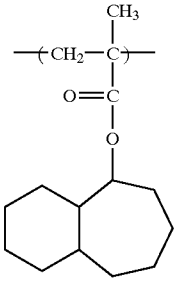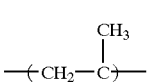
(b16) 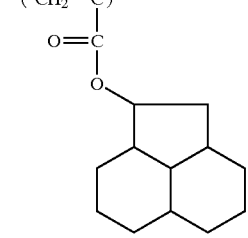

-continued
(b17) 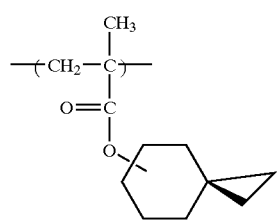
(b18) 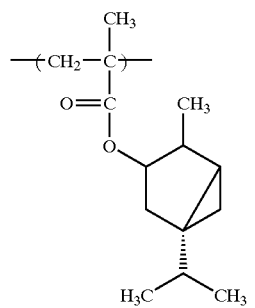
(b19) 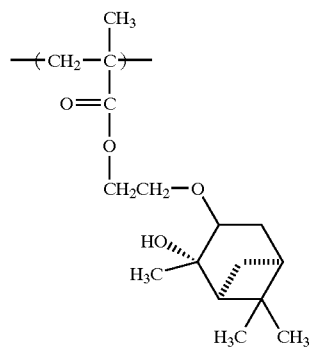
(b20) 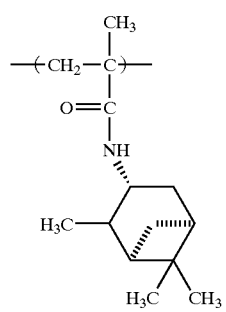
(b21) 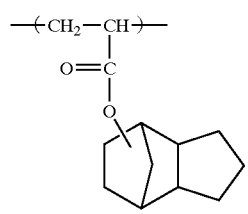
(b22) 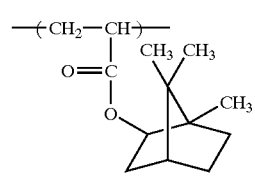
-continued
(b23) 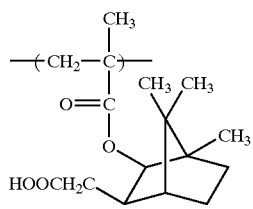
(b24) 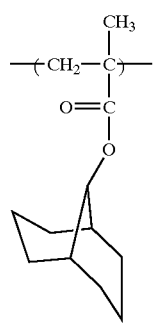
(b25) 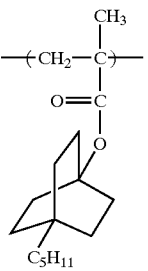
(b26) 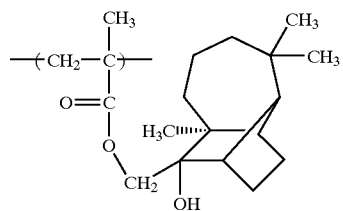
(b27) 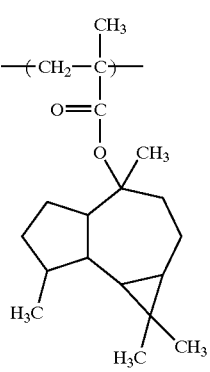
(b28) 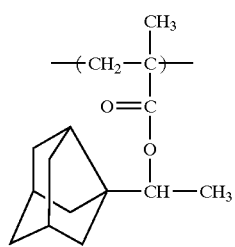

(b29) 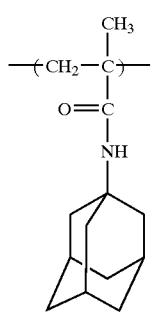
(b30) 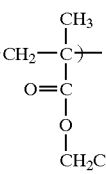
(b31) 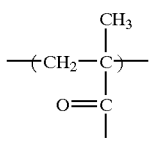
(b32) 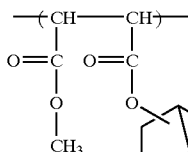
(b33) 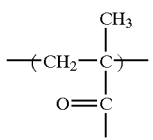
(b34) 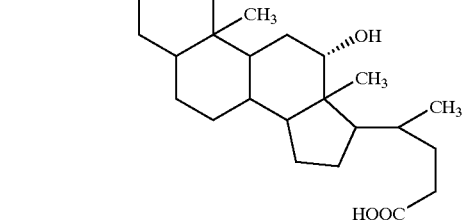
(b35) 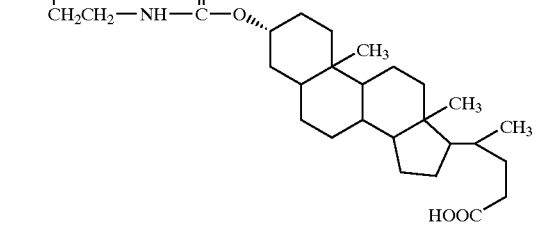
(b36) 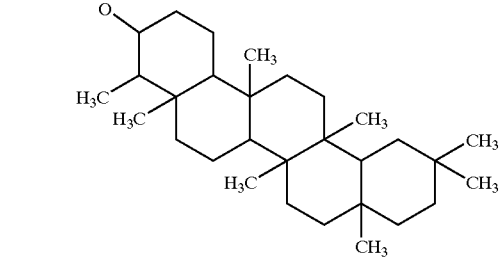 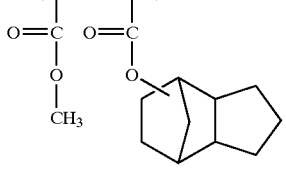

(b37) 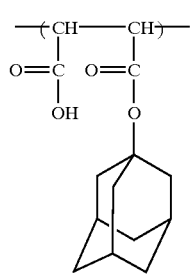
(b38) 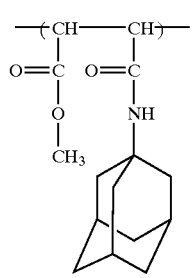
(b39) 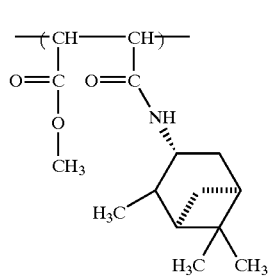
(b40) 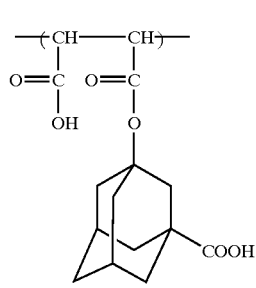
(b41) 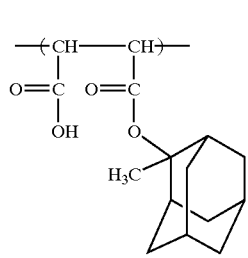
(b42) 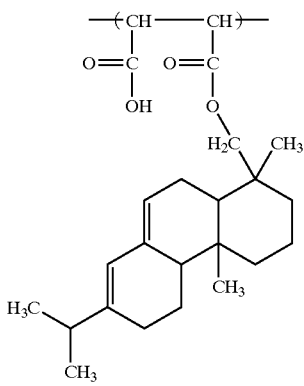
(b43) 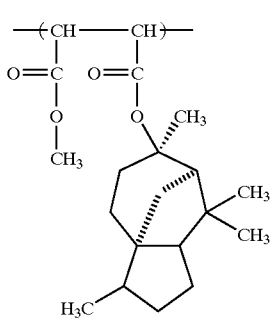
(b44) 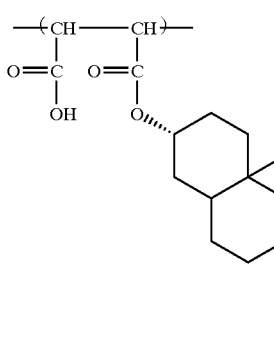
(b45) 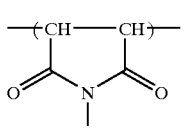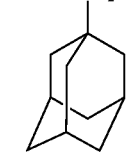

(b46) 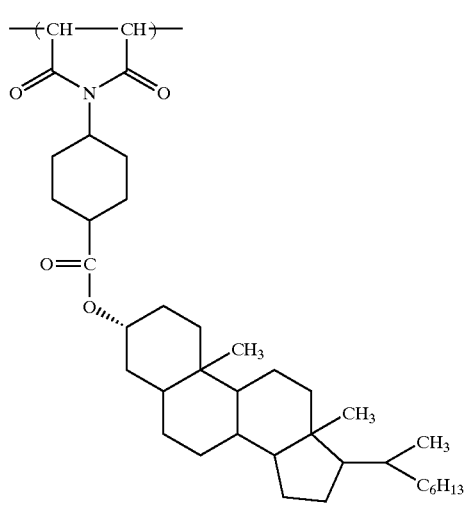
(b47) 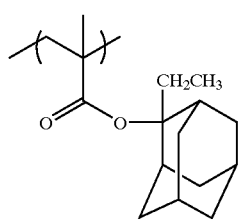
(b48) 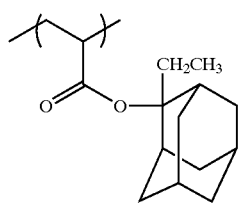
(b49) 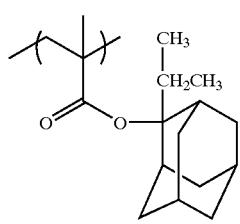
(b50) 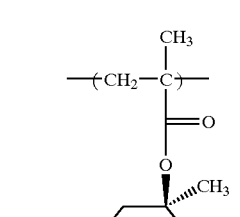
(b-51) 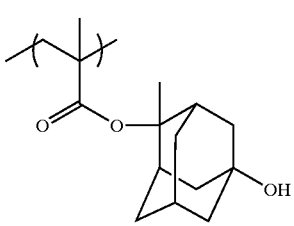
(b-52) 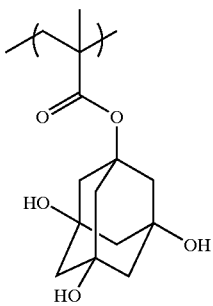
(b-53) 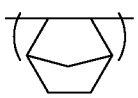
(b-54) 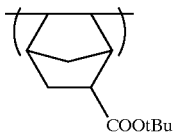
(b-55) 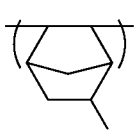
(b-56) 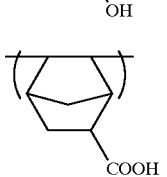
(b-57) 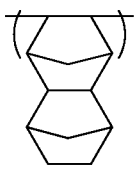
(b-58) 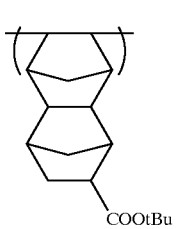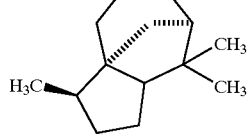

-continued

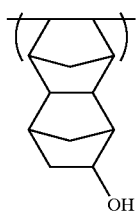
(b-59)

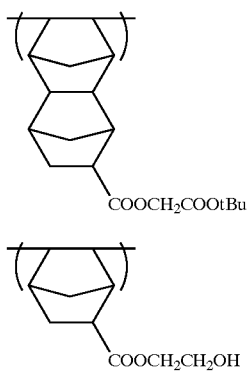
(b-60)

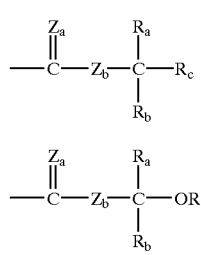
(b-61)

In addition to the above, groups represented by General Formulas (x) and (y) described below and groups containing a lactone structure can be mentioned as a group to be preferably contained in the resin of the invention. Solubility of the resin in an alkaline solution is improved when the resin contains these groups.

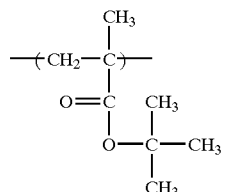
(x)

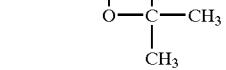
(y)

In General Formulas (x) and (y), Ra, Rb and Rc each independently represents a hydrogen atom, an alkyl group, a cycloalkyl group or an alkenyl group, each of which may has a substituent, with the proviso that at least one of Ra, Rb and Rc is not a hydrogen atom. Rd represents an alkyl group, a cycloalkyl group or an alkenyl group each of which may has a substituent. Further, two groups of Ra, Rb and Rc of General Formula (x) or two groups of Ra, Rb and Rd of General Formula (y) may combine to form a ring structure having 3 to 8 carbon atoms, and furthermore these two groups may form a ring structure including a hetero atom. Specific examples of such a ring include a cyclopropyl group, a cyclopentyl group, a cyclohexyl group, a cycloheptyl group, a cyclohexenyl group, a 2-tetrahydrofuranyl group and a 2-tetrahydropyranyl group.

Za and Zb each independently represent an oxygen atom or a sulfur atom.

For the alkyl group represented by Ra to Rd, mentioned are a methyl group, an ethyl group, a propyl group, a n-butyl group, a sec-butyl group, a hexyl group, a 2-ethylhexyl group and an octyl group, which have 1 to 8 carbon atoms and may preferably have a substituent. For the cycloalkyl group, mentioned are a cyclopropyl group, a cyclopentyl group and a cyclohexyl group, a 2-ethylhexyl group and an octyl group, which have 3 to 8 carbon atoms and may preferably have a substituent. For the alkenyl group, mentioned are a vinyl group, a propenyl group, an allyl group, a butenyl group, a pentenyl group and a hexenyl group and a cyclohexenyl group, which have 2 to 6 carbon atoms and may preferably have a substituent.

Further, examples of the additional substituent in each substituent described in detail in the above preferably include a hydroxyl group, a halogen atom (a fluorine atom, a chlorine atom, a bromine atom or an iodine atom), a nitro group, a cyano group, an amide group, a sulfonamide group; an alkyl group such as a methyl group, an ethyl group, a propyl group, a n-butyl group, a sec-butyl group, a hexyl group, a 2-ethylhexyl group and an octyl group; an alkoxy group such as methoxy group, an ethoxy group, a hydroxyethoxy group, a propoxy group, a hydroxypropoxy group and a butoxy group; an alkoxycarbonyl group such as methoxycarbonyl group and an ethoxy carbonyl group; an acyl group such as a formyl group, an acetyl group and a benzoyl group; an acyloxy group such as a butylyloxy group; and a carboxyl group.

Specific examples of the structural unit having a group represented by General Formulas (x) and (y) shown in the above will be indicated hereinafter. However, the content of the invention should not be construed as being limited thereto.

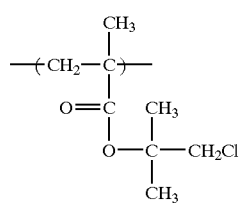
(c1)

(c2)

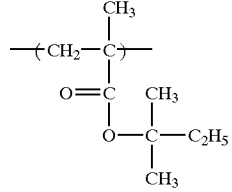
(c3)

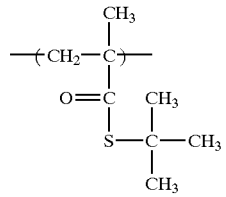
(c4)

(c5) 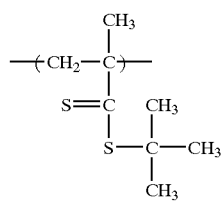
(c6) 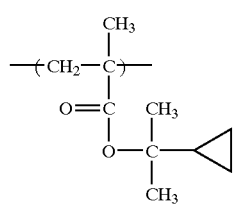
(c7) 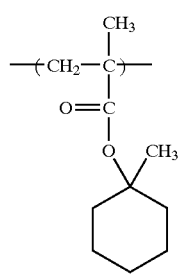
(c8) 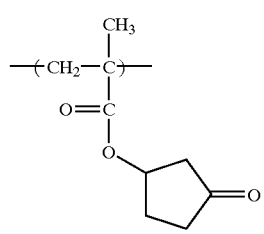
(c9) 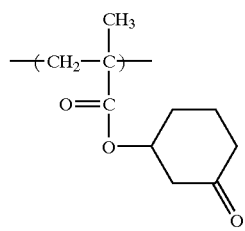
(c10) 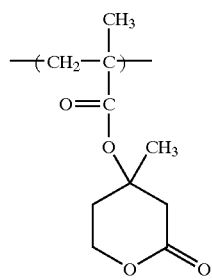
(c11) 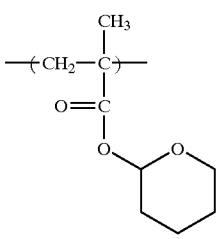
(c12) 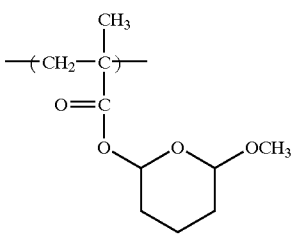
(c13) 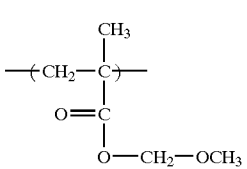
(c14) 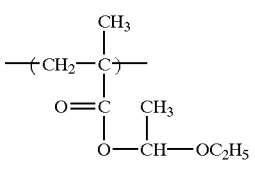
(c15) 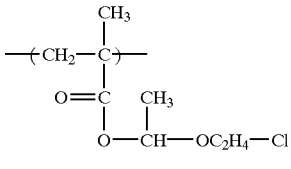
(c16) 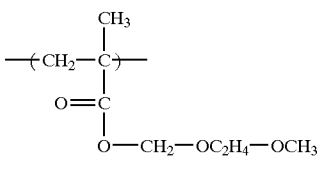
(c17) 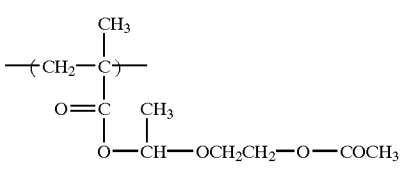
(c18) 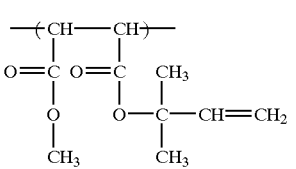

(c19) 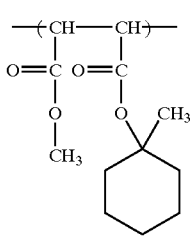
(c20) 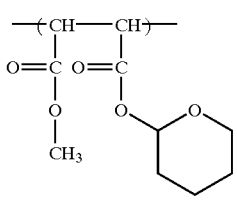
(c21) 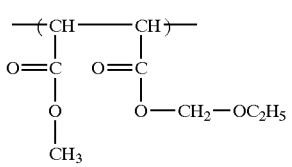
(c22) 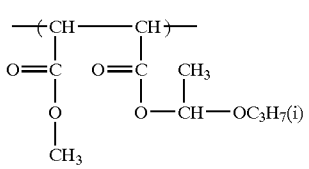
(c23) 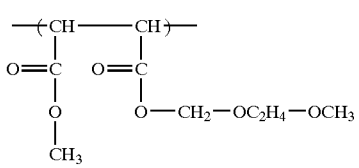
(c24) 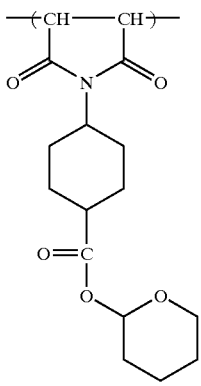
structure is preferably contained in the side chain of the resin. Specifically, repeating units from (a1) to (a20), which have a lactone structure in the side chain, can be illustrated.
(a1) 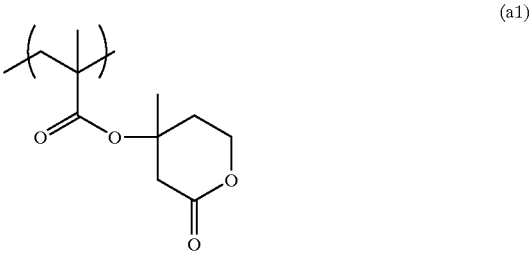
(a2)
(a3) 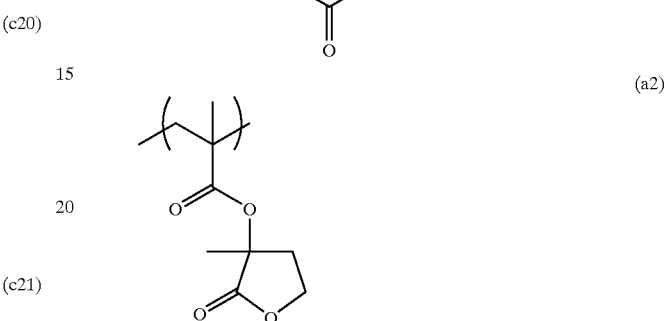
(a4)
(a5) 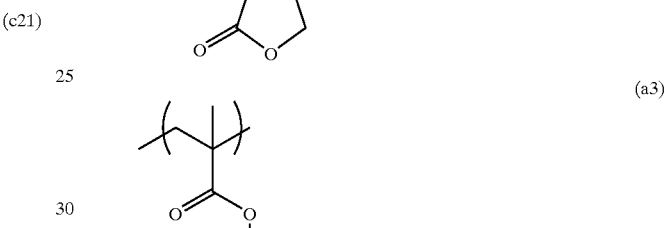
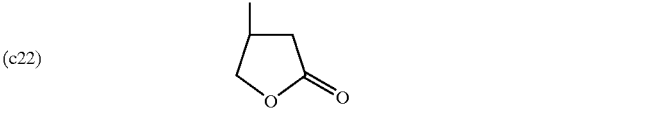
(a6) 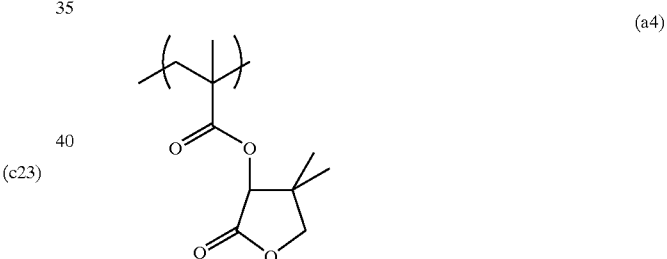
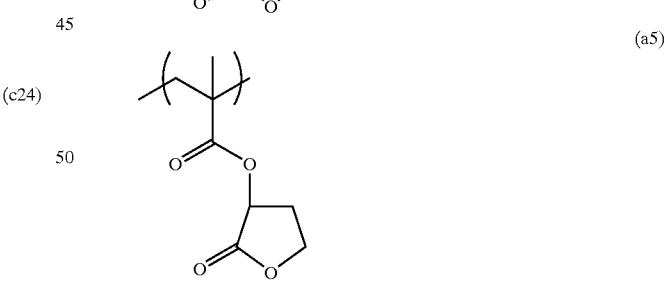
In the invention, the resin may further contain a lactone structure as described in the above, wherein the lactone (a7) 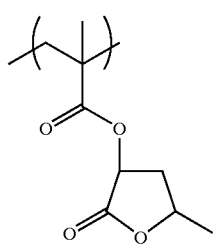
(a8) 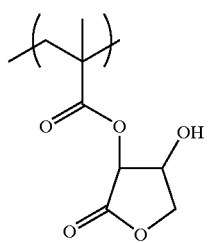
(a9) 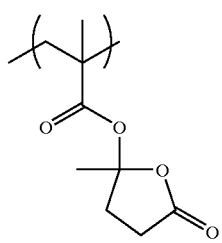
(a10) 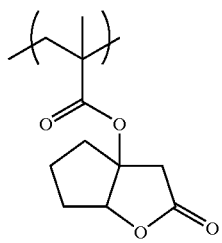
(a11) 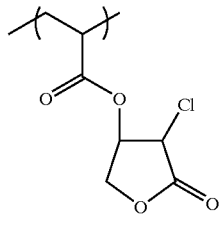
(a12) 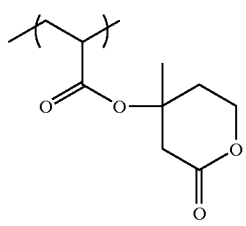
(a13) 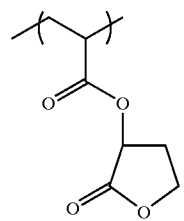
(a14) 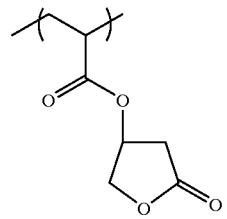
(a15) 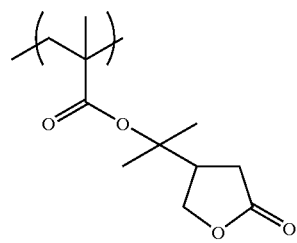
(a16) 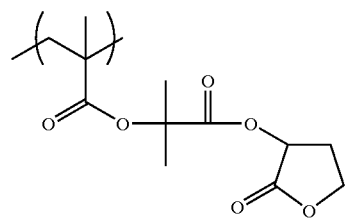
(a17) 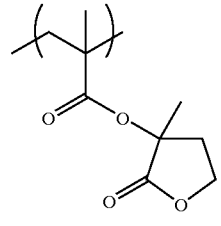
(a18) 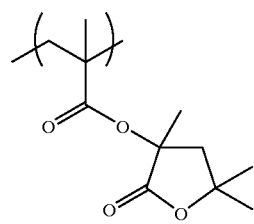
(a19)

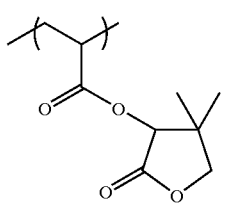
(a20)

The resin involved in the invention can further contain an alkali-soluble group such as a carboxyl group, a hydroxyl group and a sulfonic acid group. Accordingly, the alkali-solubility is improved. The alkali-soluble group may be contained in each repeating unit described in the above or in other repeating structural units different from the foregoing ones. Further, the alkali-soluble group may be contained in a plurality of sites of these structural units.

For the alkali-soluble group, acid group structures contained in a resin as other component described later are mentioned. Preferable alkali-soluble groups include a carboxyl group and groups from (b-1) to (b-3) described later. Specific examples of the preferable repeating structural unit having a carboxylic group will be indicated hereinafter. However, the invention should not be construed as being limited thereto.

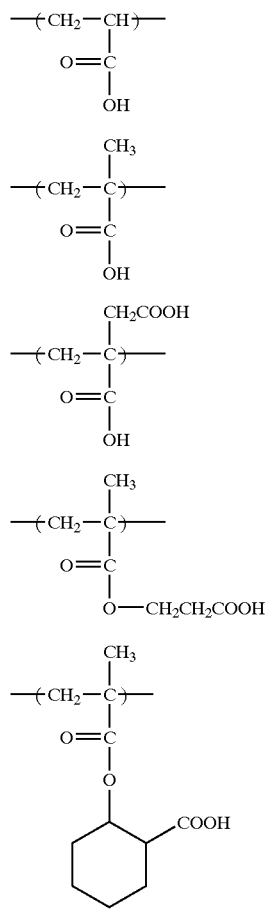

(d1)
(d2)
(d3)
(d4)
(d5)

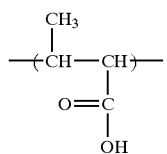
(d6)

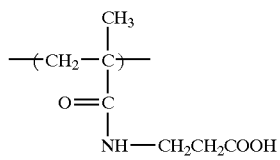
(d7)

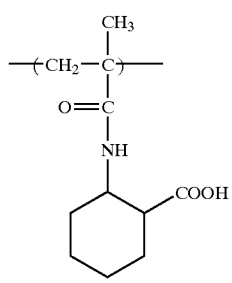
(d8)

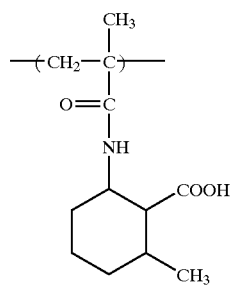
(d9)

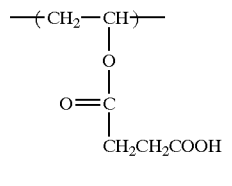
(d10)

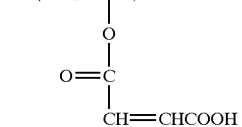
(d11)

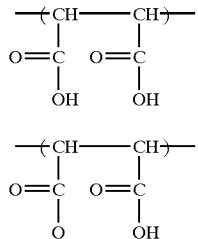
(d12)
(d13)

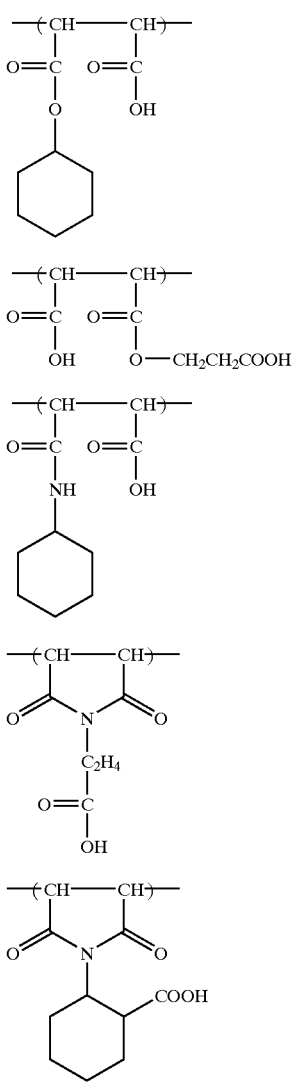

In the resin contained in the positive image-forming material of the invention, a content of the repeating structural unit corresponding to a monomer having a structure represented by Formula (I) is adjusted according to a balance between printing durability and alkali-developability in any mode of a resin. The repeating structural unit corresponding to a monomer having a structure represented by Formula (I) is preferably contained in a content of 5 mol % or more per the entire repeating units, more preferably 15 mol % or more, and furthermore preferably 20 mol % or more.

A content of the structural unit having the aliphatic cyclic hydrocarbon structure [preferably a repeating structural unit represented by General Formula (II) to (V)] in the resin is adjusted according to a balance between printing durability and alkali-developability in any mode of a resin. The repeating structural unit having the aliphatic cyclic hydrocarbon structure is preferably contained in a content of 10 mol % or more per the entire repeating units. The content is more preferably in the range from 20 mol % to 80 mol %, furthermore preferably from 35 mol % to 70 mol %, and still furthermore preferably from 40 mol % to 60 mol %.

A content of the entire repeating structural units having the alkali-soluble group in the resin (in case of an alkali-soluble resin) contained in the positive image-forming material of the invention is adjusted according to alkali-developability and adhesion to the support and further to properties such as photosensitivity. The content is preferably in the range from 5 mol % to 60 mol % per the entire repeating structural units of the resin, more preferably from 5 mol % to 40 mol %, and furthermore preferably from 5 mol % to 20 mol %.

For the purpose of improving properties of the resin, other polymerizable monomers may further be copolymerized in a range not remarkably to give a damage to transmission property of the resin for actinic light and to printing durability of the resin.

Examples of the monomer employable for copolymerization include compounds having an addition polymerizable unsaturated bond selected from a group including acrylic acid esters, acrylic amides, methacrylic acid esters, methacrylic amides, allyl compounds, vinyl ethers, vinyl esters, styrenes and crotonic esters.

These compounds will specifically be indicated hereinafter:

acrylic acid esters, for example, alkyl (the alkyl group having 1 to 10 carbon atoms is preferable) acrylates (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate and tetrahydrofurfuryl acrylate), aryl acrylate and methoxyethoxyethyl acrylate;

methacrylic acid esters, for example, alkyl (the alkyl group having 1 to 10 carbon atoms is preferable) methacrylates (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, octyl methacrylate, 2-hydroxyethyl methacrylate, 4-hydroxybutyl methacrylate, 5-hydroxypentyl methacrylate, 2, 2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate), aryl methacrylate (e.g., phenyl methacrylate and naphthyl methacrylate) and methoxyethoxyethyl methacrylate;

acryl amides, for example, acrylamide, N-alkyl acrylamides (the alkyl group having 1 to 10 carbon atoms, e. g., a methyl group, an ethyl group, a propyl group, a butyl group, an octyl group, a cyclohexyl group, a hydroxyethyl group and a benzyl group), N-aryl acrylamides, N,N-dialkyl acrylamides (the alkyl group having 1 to 10 carbon atoms, e. g., a methyl group, an ethyl group, a butyl group, an isobutyl group, an ethylhexyl group and a cyclohexyl group), N,N-aryl acrylamide, N-hydroxyethyl-N-methyl acrylamide and N-2-acetamide ethyl-N-acetyl acrylamide;

methacryl amides, for example, methacrylamide, N-alkyl methacrylamides (the alkyl group having 1 to 10 carbon atoms, e.g., a methyl group, an ethyl group, a t-butyl group, an ethylhexyl group, a hydroxyethyl group and a cyclohexyl group), N-aryl methacrylamide, N,N-dialkyl methacrylamide (the alkyl group is an ethyl group, a propyl group or a butyl group), N-hydroxyethyl-N-methyl methacrylamide N-methyl-N-phenyl methacrylamide and N-ethyl-N-phenyl methacrylamide;

allyl compounds, for example, allyl esters (e.g., allyl acetate, allyl caproate, allyl caprylate, allyl laurate, allyl palmitate, allyl stearate, allyl benzoate, allyl acetoacetate and allyl lactate) and allyloxyethanol;

crotonic acid esters, for example, alkyl crotonate (e.g., butyl crotonate, hexyl crotonate and glycerin monocrotonate); dialkyl itaconates (e.g., dimethyl itaconate, diethyl itaconate and dibutyl itaconate);

dialkyl esters of maleic acid or fumaric acid (e.g., dimethyl maleate and dibutylfumarate), maleic acid anhydride, maleimide, acrylonitrile, methacrylonitrile and maleilonitrile.

In addition to the above, addition polymerizable unsaturated compounds which are generally copolymerizable may be used.

Among these, methoxyethoxyethyl methacrylate and methoxyethoxyethyl acrylate are particularly preferable.

A content of the repeating structural units originated from other polymerizing monomers in the resin is preferably 70 mol % or less per the entire repeating structural units, and more preferably 50 mol % or less.

According to the sort of actinic light or radiation (e.g., ArF excimer laser beams), in order to maintain transparency for the actinic light or radiation, it is preferred that no aromatic ring is contained in the resin. Photosensitivity lowers, when transparency for radiation decreases due to introduction of an aromatic ring.

A weight average molecular weight of the resin is preferably in the range from 1000 to 300000 as a value calculated in terms of polystyrene, more preferably from 5000 to 150000, and furthermore preferably from 10000 to 100000. Besides, a degree of dispersion is preferably in the range from 1.0 to 10.0, and more preferably from 1.0 to 5.0.

A polymer obtained by polymerizing monomers having a structure represented by Formula (I) may be any of a random polymer, a block polymer and a graft polymer, and preferably a random polymer.

In the invention, in any mode of constitution materials, a content ratio of resin (the entire amount of all the resins in the constitution materials) is usually in the range from 20 wt % to 99.8 wt %, and preferably from 50 wt % to 99.5 wt %, based on the entire weight (except solvents) of the positive image-forming material of the invention or the solid content of the material.

Based on performance modes, specific examples of the resin will be enumerated hereinafter. However, the invention should not be construed as being limited thereto. Group A

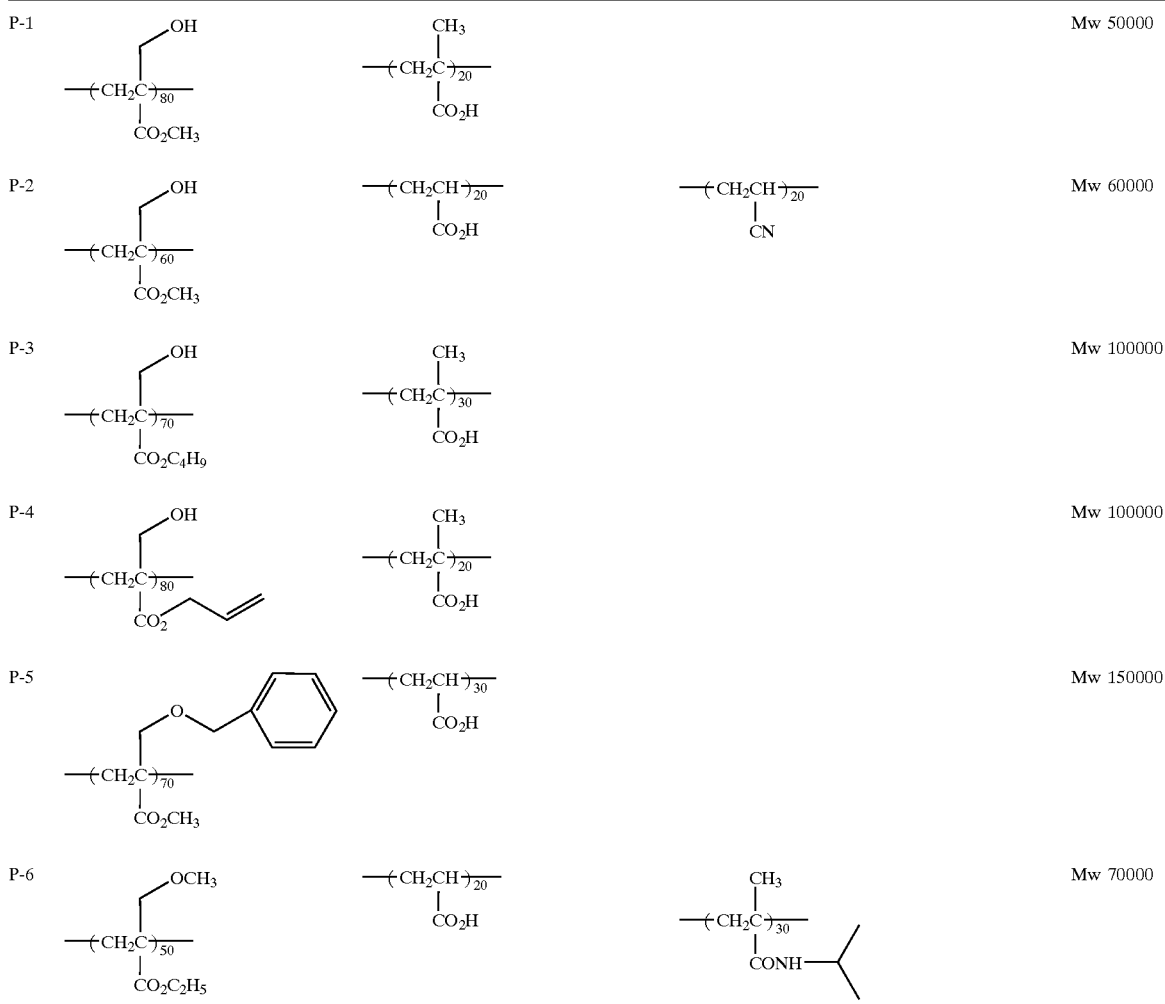

-continued

| | | | | |
|---|---|---|---|---|
| P-7 | ―(CH₂C)₂₀― with OCOCH₃ and CO₂CH₃ | ―(CH₂CH)₃₀― with CO₂H | ―(CH₂C)₅₀― with CH₃ and CO₂―allyl | Mw 80000 |
| P-8 | ―(CH₂C)₆₀― with OCONH-phenyl and CO₂CH₃ | ―(CH₂CH)₄₀― with CO₂H | | Mw 100000 |
| P-9 | ―(CH₂C)₃₀― with OCH₂-phenyl and CO₂H | ―(CH₂C)₇₀― with CH₃ and CO₂―allyl | | Mw 70000 |
| P-10 | ―(CH₂C)₈₀― with OCOC₂H₅ and CO₂-phenyl | ―(CH₂C)₂₀― with CH₃ and CO₂H | | Mw 80000 |
| P-11 | ―(CH₂C)₃₀― with OCOCH₃ and CO₂CH₂CH₂OH | ―(CH₂CH)₂₀―phenyl | ―(CH₂C)₃₀― with CH₃ and CO₂H | Mw 50000 |
| P-12 | ―(CH₂C)₇₀― with Cl and CO₂CH₃ | ―(CH₂CH)₃₀―(4-hydroxyphenyl) | | Mw 40000 |
| P-13 | ―(CH₂C)₇₀― with NHSO₂CH₃ and CO₂(n)C₄H₉ | ―(CH₂CH)₃₀― with CO₂H | | Mw 80000 |
| P-14 | ―(CH₂C)₇₀― with NHCOCH₃ and CO₂CH₃ | ―(CH₂C)₃₀― with CH₃ and CO₂H | | Mw 50000 |
| P-15 | ―(CH₂C)₄₀― with CH₂-morpholino and CO₂C₂H₅ | ―(CH₂C)₃₀― with CH₃ and CO₂―allyl | ―(CH₂C)₃₀― with CH₃ and CO₂H | Mw 60000 |

-continued

| | | | | | |
|---|---|---|---|---|---|
| P-16 | -(CH₂C)₅₀- with OCOCH₃ and CO₂CH₃ | -(CH₂CH)₂₀- with CO₂H-CH₂-C₆H₅ | -(CH₂C)₃₀- with CH₃ and CO₂H | | Mw 70000 |
| P-17 | -(CH₂C)₅₀- with OCOCH₃ and CO₂CH₃ | -(CH₂CH)₂₀- with CO₂(n)C₄H₉ | -(CH₂C)₃₀- with CH₃ and CO₂H | | Mw 60000 |
| P-18 | -(CH₂C)₄₀- with OCOC₆H₅ and CO₂CH₃ | -(CH₂CH)₃₀- with CONH(n)C₄H₉ | -(CH₂C)₃₀- with CH₃ and CO₂H | | Mw 50000 |
| P-19 | -(CH₂C)₄₀- with OSO₂C₆H₅ and CO₂CH₃ | -(CH₂C)₃₀- with CH₃ and CO₂-allyl | -(CH₂C)₃₀- with CH₃ and CO₂H | | Mw 100000 |
| P-20 | -(CH₂C)₂₀- with O-CH₂CH₂-O-CH₂CH₂-OCH₃ and CO₂CH₃ | -(CH₂C)₅₀- with CH₃ and CO₂-allyl | -(CH₂C)₁₀- with CH₃ and CO₂H | -(CH₂CH)₂₀- with CN | Mw 70000 |
| P-21 | -(CH₂C)₃₀- with OCOCH₃ and CO₂-(CH₂)₃-CO₂H | -(CH₂C)₇₀- with CH₃ and CO₂-allyl | | | Mw 150000 |
| P-22 | -(CH₂C)₈₀- with OH and CN | -(CH₂C)₂₀- with CH₃ and CO₂H | | | Mw 50000 |
| P-23 | -(CH₂C)₇₀- with O-CH₂-C₆H₅ and CN | -(CH₂CH)₃₀- with CO₂H | | | Mw 150000 |
| P-24 | -(CH₂C)₃₀- with OCOCH₃ and CO₂CH₃ | -(CH₂C)₇₀- with C₆H₄-OH | | | Mw 50000 |
| P-25 | -(CH₂C)₃₀- with OCOCH₃ and CO₂CH₃ | -(CH₂C)₇₀- with CONH-C₆H₄-OH | | | Mw 50000 |

-continued
| | | | | |
|---|---|---|---|---|
| P-26 | 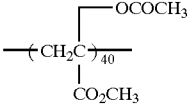 | 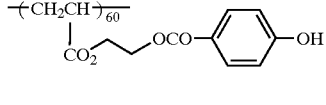 | | Mw 60000 |
| P-27 | 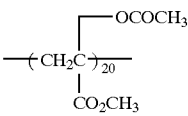 | 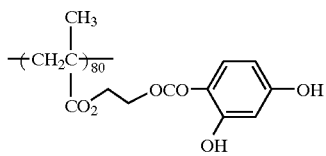 | | Mw 70000 |
| P-28 | 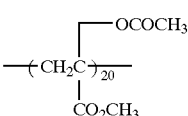 | 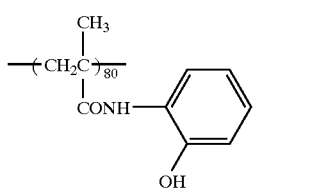 | | Mw 50000 |
| P-29 | 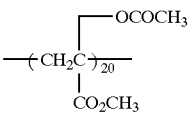 | 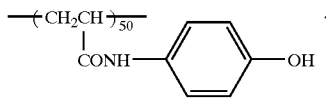 | 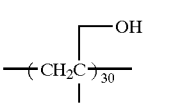 | Mw 70000 |
| P-30 | 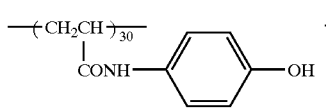 | 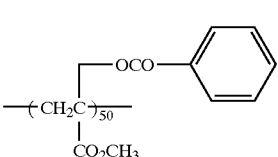 | 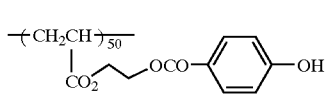 | Mw 80000 |
| P-31 | 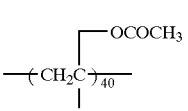 | 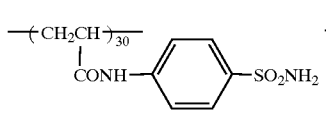 | | Mw 50000 |
| P-32 | 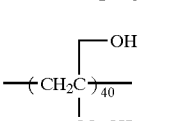 | 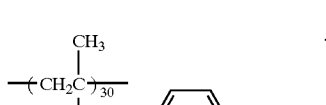 | 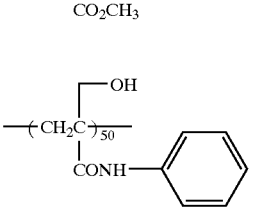 | Mw 50000 |
| P-33 | 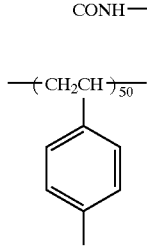 | | | Mw 50000 |
| P-34 | 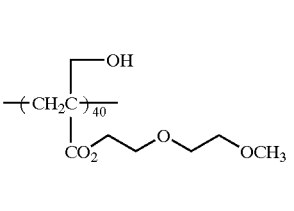 | | | Mw 80000 |
| P-35 | 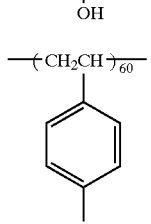 | | | Mw 50000 |

-continued
| | | | | |
|---|---|---|---|---|
| P-36 | 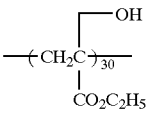 | 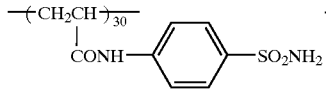 | 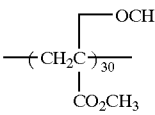 | Mw 100000 |
| P-37 | 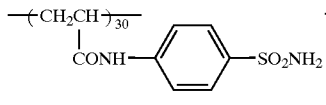 | 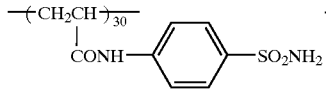 | 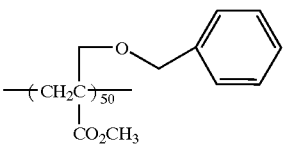 | Mw 60000 |
| P-38 | 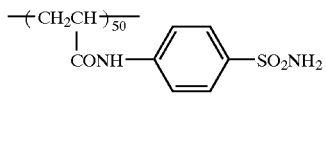 | 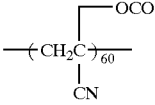 | | Mw 40000 |
| P-39 | 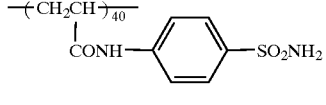 | 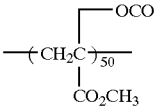 | | Mw 50000 |
| P-40 | 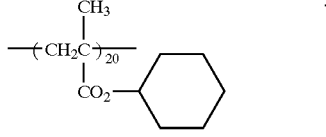 | 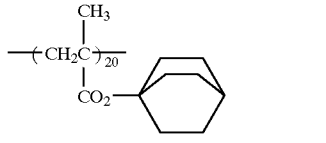 | 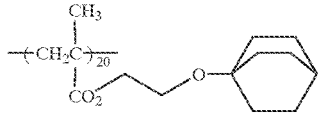 | Mw 50000 |
| P-41 | " | 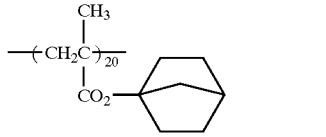 | " | Mw 40000 |
| P-42 | " | 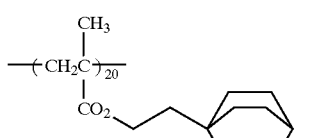 | " | Mw 50000 |
| P-43 | " | 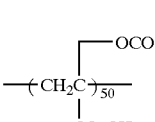 | " | Mw 50000 |
| P-44 | " | 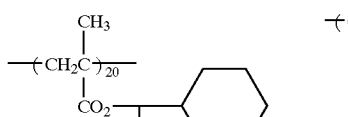 | " | Mw 40000 |
| P-45 | 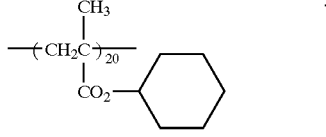 | (see below) | 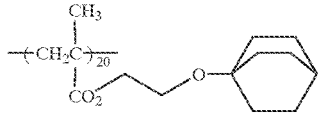 | Mw 40000 |

-continued

| | | | | |
|---|---|---|---|---|
| P-46 | " | structure with -(CH2C)20- CH3, CO2-decalin | " | Mw 60000 |
| P-47 | " | structure with -(CH2C)20- CH3, CO2-tricyclodecane | " | Mw 60000 |
| P-48 | -(CH2C)30- with OH and CO2CH3 | -(CH2C)30- CH3, CO2-cyclohexyl-OH | -(CH2C)40- CH3, CONH-phenyl-OH | Mw 60000 |
| P-49 | " | -(CH2C)30- CH3, CO2-tetrahydronaphthyl | " | Mw 60000 |
| P-50 | " | -(CH2C)30- CH3, CO2-cholic acid derivative (with CH3, OH, CH3, CH3, HO2C) | " | Mw 30000 |
| P-51 | " | -(CH-CH)30- CO2H, CO2-cyclohexyl | " | Mw 40000 |
| P-52 | -(CH2C)30- with OH and CO2CH3 | -(CH-CH2)30- maleimide-N-CH2CH2-OCO-cyclohexyl | -(CH2C)40- CH3, CONH-phenyl-OH | Mw 40000 |
| P-53 | " | -(CH-CH)30- CO2CH3, CONH-bicyclo | " | Mw 40000 |
| P-54 | " | -(CH2C)30- CH3, CO2-(CH2)4-OCO-cyclohexyl | " | Mw 40000 |

-continued
| | | | | |
|---|---|---|---|---|
| P-55 | " | 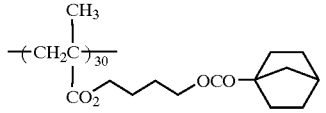 | " | Mw 40000 |
| P-56 | 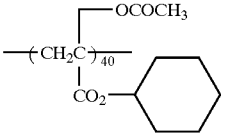 | 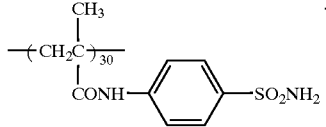 | —(CH₂CH)₃₀—<br>\|<br>CN | Mw 60000 |
| P-57 | 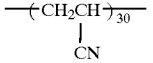 | " | " | Mw 50000 |
| P-58 | 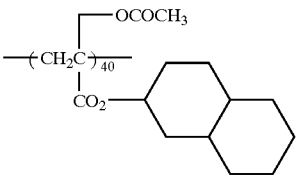 | " | " | Mw 70000 |
| P-59 | 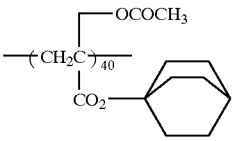 | 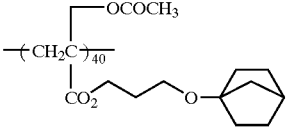 | —(CH₂CH)₃₀—<br>\|<br>CN | Mw 70000 |
| P-60 | 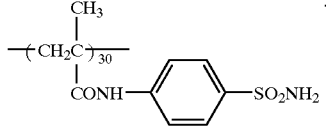 | " | " | Mw 50000 |
| P-61 | 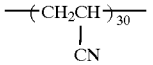 | | | Mw 70000 |
| P-62 | 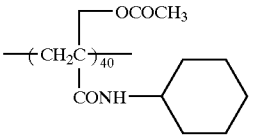 | " | " | Mw 70000 |
| P-63 | 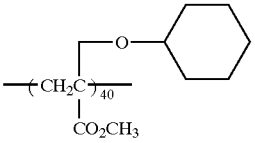 | " | " | Mw 50000 |
| P-64 | 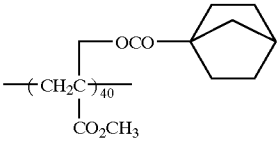 | 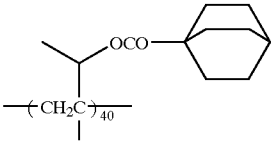 | 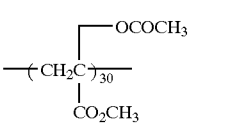 | Mw 30000 |

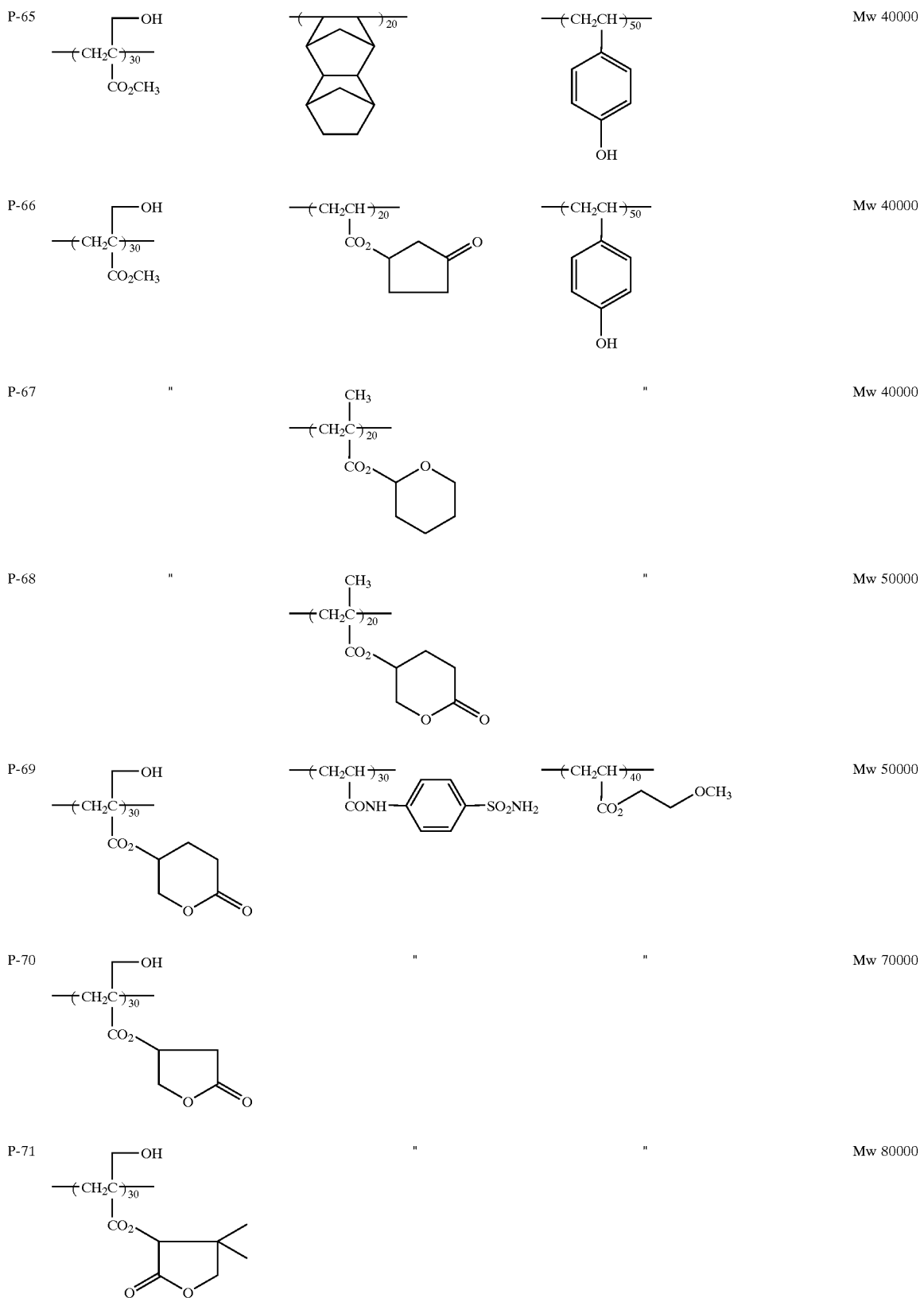

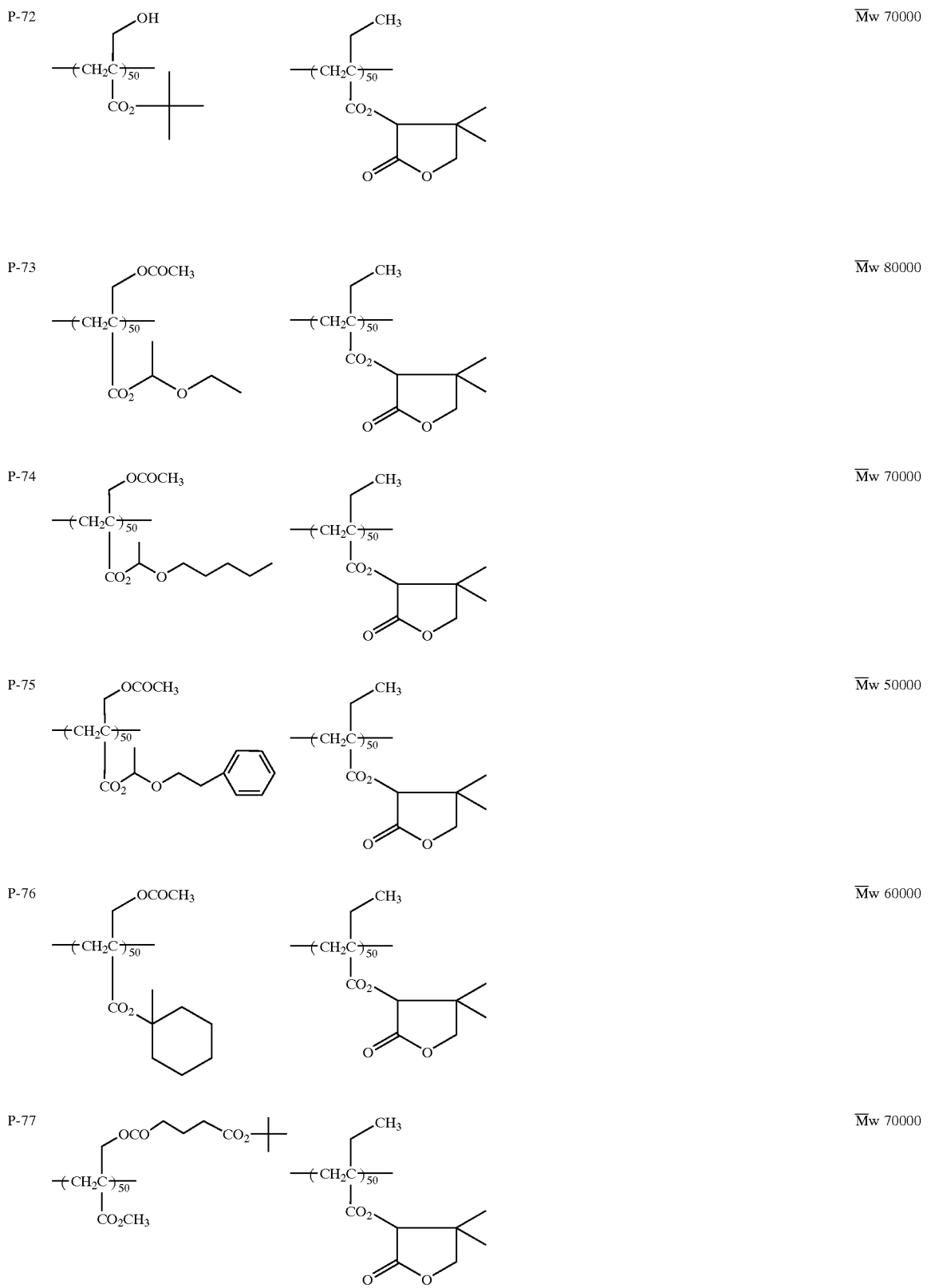

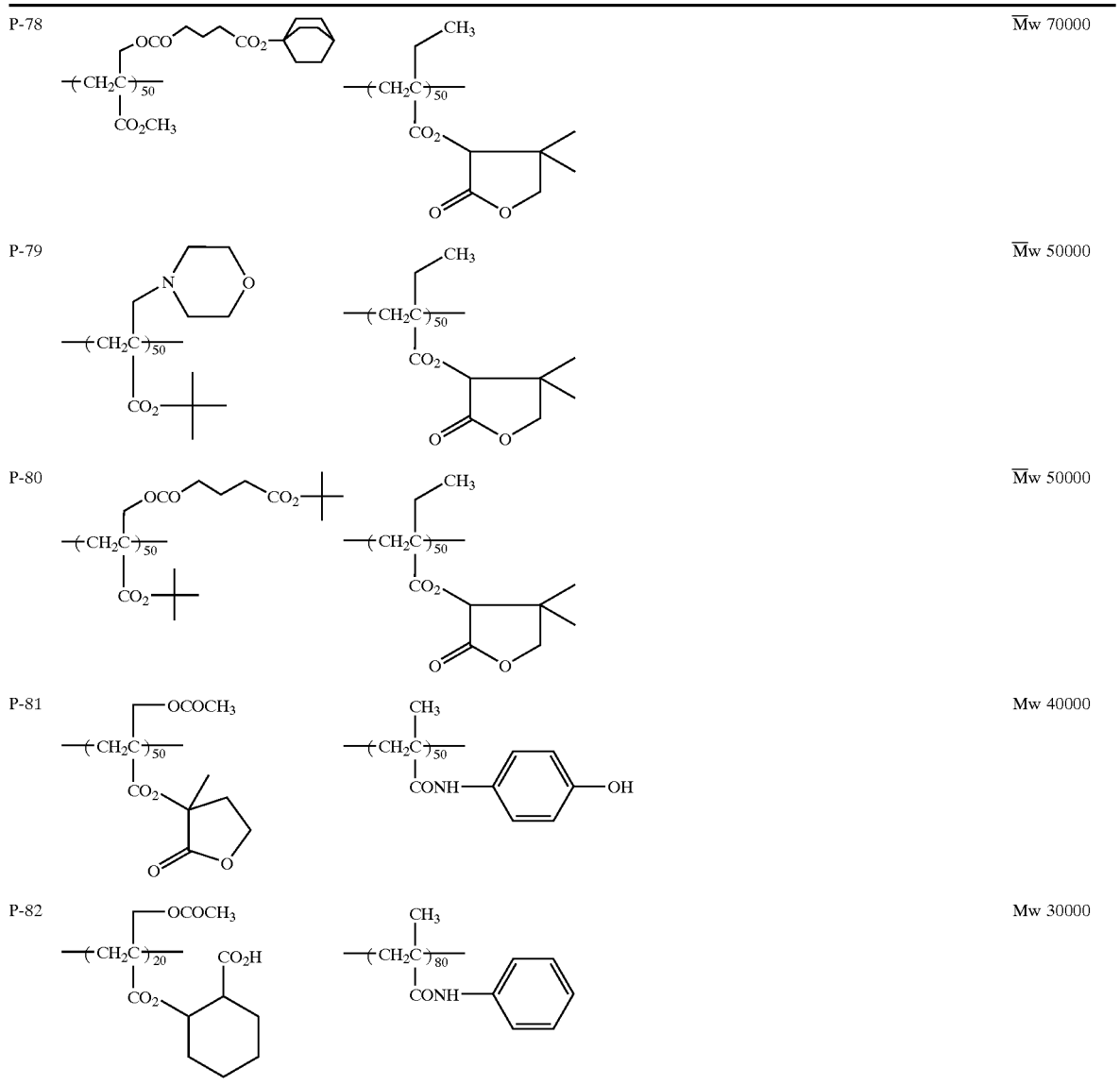

Further, in the invention, for other component resins in combination with the resin having repeating units corresponding to monomers having a structure represented by Formula (I) described in the above, water-insoluble and alkali-soluble resins indicated below are mentioned.

Examples of the water-insoluble and alkali-soluble resin include those having an acid group structure as described below in the main or side chain of a macromolecular compound.

A phenolic hydroxyl group (—Ar—OH), a carboxylic acid group (—CO$_2$H), a sulfonic acid group (—SO$_3$H), a phosphoric acid group (—PO$_3$H), a sulfonamide group (—SO$_2$—NH—R), a substituted sulfonamide-based acid group (an active imide group) (—SO$_2$—NHCOR, —SO$_2$NHSO$_2$R and —CONHSO$_2$R), wherein Ar represents a two-valent aryl group which may have a substituent, and R has a hydrocarbon group which may have a substituent.

Among them, preferable acid groups are a phenolic hydroxyl group (b-1), a sulfonamide group (b-2) and an active imide group (b-3). In particular, an alkaline aqueous solution-soluble resin having a phenolic hydroxyl group (hereinafter called as a resin having a phenolic hydroxyl group) can be used most preferably.

Examples of the macromolecular compound having a phenolic hydroxyl group (b-1) include novolac resins such as a condensation polymerization body between phenol and formaldehyde (hereinafter called as a phenol/formaldehyde resin), a condensation polymerization body between m-cresol and formaldehyde (hereinafter called as a m-cresol/formaldehyde resin), a condensation polymerization body between p-cresol and formaldehyde, a condensation polymerization body between m-/p-mixed cresol and formaldehyde, a condensation polymerization body among phenol, cresol (may be any of m-, p- or m-/p- mixed cresol) and formaldehyde, and a condensation polymerization body between pyrogallol and acetone. Or, a copolymer obtained by copolymerizing monomers having a phenol group in the side chain can also be used. For the monomer having a phenol group to be used, acrylamide, methacrylamide, acrylic acid ester, methacrylic acid ester and hydroxystyrene, each having a phenol group, are mentioned. Specifically, the following monomers can preferably be used: N-(2-hydroxyphenyl) acrylamide, N-(3-hydroxyphenyl) acrylamide, N-(4-hydroxyphenyl) acrylamide, N-(2-hydroxyphenyl) methacrylamide, N-(3-hydroxyphenyl) methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl) ethylacrylate, 2-(3-hydroxyphenyl) ethylacrylate, 2-(4-hydroxyphenyl) ethylacrylate, 2-(2-hydroxyphenyl) ethylmethacrylate, 2-(3-hydroxyphenyl) ethylmethacrylate and 2-(4-hydroxyphenyl) ethylacrylate.

These resins having a phenolichydroxyl group preferably have a weight average molecular weight in the range from 500 to 20000 and a number average molecular weight in the range from 200 to 10000. Further, as described in U.S. Pat. No. 4,123,279, these resins may be used together with a condensation polymerization product between formaldehyde and phenol having an alkyl group of 3 to 8 carbon atoms as a substituent, such as a t-butylphenol/formaldehyde resin and an octylphenol/formaldehyde resin. Such a resin having a phenolic hydroxyl group may be used in one kind or two or more kinds in combination.

In case of an alkaline water-soluble macromolecular compound having a sulfonamide group (b-2), for the monomer having a sulfonamide group (b-2), mentioned is a monomer comprising a low molecular weight compound having at least one or more of a sulfonamide group in which at least one hydrogen atom is bonded on a nitrogen atom and a polymerizable unsaturated bond respectively in a molecule. Among them, a low molecular weight compound having an acryloyl group, an allyl group or a vinyloxy group and a substituted or mono-substituted aminosulfonyl group or a substituted sulfonyl imino group is preferable. Examples of such a compound include compounds represented by General Formulas (3) to (7) described below.

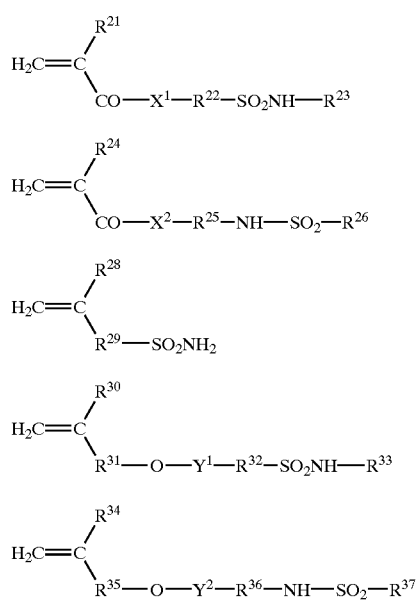

In General Formulas described in the above $X^1$ and $X^2$ each represent —O— or —NR$^{17}$—. $R^{21}$ and $R^{24}$ each represent a hydrogen atom or —CH$_3$. $R^{22}$, $R^{25}$, $R^{29}$, $R^{32}$ and $R^{36}$ each represent an alkylene group having 1 to 12 carbons atoms which may have a substituent, a cycloalkylene group, an arylene group or a aralkylene group. $R^{23}$, $R^{17}$ and $R^{33}$ each represent a hydrogen atom, an alkyl group having 1 to 12 carbon atoms which may have a substituent, a cycloalkyl group, an aryl group or an aralkyl group. Further, $R^{26}$ and $R^{37}$ each represent an alkyl group having 1 to 12 carbon atoms which may have a substituent, a cycloalkyl group, an aryl group or an aralkyl group. $R^{28}$, $R^{30}$ and $R^{34}$ each represent a hydrogen atom or —CH$_3$. $R^{31}$ and $R^{35}$ each represent an alkylene group having 1 to 12 carbon atoms which may have a single bond or a substituent, a cycloalkylene group, an arylene group or an aralkylene group. $Y^1$ and $Y^2$ each represent a single bond or —CO—.

Specifically, m-aminosulfonylphenyl methacrylate, N-(p-aminosulfonylphenyl) methacrylamide and N-(p-aminosulfonylphenyl) acrylamide can preferably be used.

In case of an alkaline water-soluble macromolecular compound having an active imide group (b-3), the compound is a compound having an active imide group represented by the following formula in the molecule. For the monomer having an active imide group (b-3) which is the main monomer constituting the macromolecular compound, mentioned is a monomer comprising a low molecular weight compound having one or more of an active imide group represented by the following formula and a polymerizable unsaturated bond respectively in a molecule.

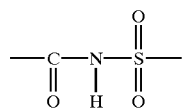

As such a compound, specifically, N-(p-toluene sulfonyl) methacrylamide and N-(p-toluenesulfonyl) acrylamide can preferably be used.

For the alkaline water-soluble copolymer employable in the invention, monomers having an acidic group such as (b-1) to (b-3) described in the above are not necessarily one kind, but two or more kinds of monomers having the same acidic group or two or more kinds of monomers having a different acidic group can be used. For the copolymerization method, a known method heretofore such as a graft copolymerization method, a block copolymerization method or a random copolymerization method can be used.

The copolymer contains monomers to be copolymerized having an acidic group in the groups from (b-1) to (b-3) preferably in an amount of 10 mol % or more as copolymerization components, and more preferably 20 mol % or more. When the copolymerization components are less than 10 mol %, interaction with the resin having phenolic hydroxyl groups becomes insufficient, and improving effects (an advantage of using copolymerization components) for development latitude become unsatisfactory.

On the other hand, a content of the structural units having an aliphatic cyclic hydrocarbon structure [preferably the repeating structural units represented by General Formulas (I) to (V)] is adjusted according to a balance between printing durability and alkali-developability. Structural units having the aliphatic cyclic hydrocarbon structure are preferably contained in a content of 10 mol % or more per the entire repeating structural units, more preferably in the range from 20 mol % to 80 mol %, furthermore preferably from 35 mol % to 70 mol %, and still furthermore preferably from 40 mol % to 60 mol %.

Further, the copolymer may contain other copolymerization components than monomers having an acidic group in the groups from (b-1) to (b-3) and the structural units having an aliphatic cyclic hydrocarbon structure. Examples of the monomer employable as a copolymerization component include monomers indicated in (1) to (12) described below.
(1) Acrylic acid esters and methacrylic acid esters having an aliphatic hydroxyl group such as 2-hydroxyethyl acrylate or 2-hydroxyethyl methacrylate.
(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate.
(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethyl methacrylate.
(4) Acrylamides or methacrylamides such as acrylamide, methacrylamide, N-methylol acrylamide, N-ethyl acrylamide, N-hexyl acrylamide, N-cyclohexyl acrylamide, N-hydroxyethyl acrylamide, N-phenyl acrylamide, N-nitrophenyl acrylamide and N-ethyl-N-phenyl acrylamide.
(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.
(6) Vinyl esters such as vinyl acetate, vinylchloro acetate, vinyl butyrate and vinyl benzoate.
(7) Styrenes such as styrene, α-methyl styrene, methyl styrene and chloromethyl styrene.
(8) Vinyl ketones such as methyl vinyl ketone, ethyl vinyl ketone, propyl vinyl ketone and phenyl vinyl ketone.
(9) Olefins such as ethylene, propylene, isobutylene, butadiene and isoprene.
(10) N-vinyl pyrrolidone, N-vinyl carbazole, 4-vinyl pyridine, acrylonitrile and methacrylonitrile.
(11) Unsaturated imides such as maleimide, N-acryloyl acrylamide, N-acetyl methacrylamide, N-propynyl methacrylamide and N-(p-chlorobenzoyl) methacrylamide.
(12) Unsaturated carboxylic acids such as acrylic acid, methacrylic acid, maleic anhydride and itaconic acid.

In the invention, regardless of a homopolymer or a copolymer, the alkaline water-soluble macromolecular compound preferably has a weight average molecular weight of 2000 or more and a number average molecular weight of 500 or more. More preferably, the alkaline water-soluble macro molecular compound has a weight average molecular weight ranged from 5000 to 300000, a number average molecular weight ranged from 800 to 250000 and a degree of dispersion (weight average molecular weight/number average molecular weight) ranged from 1.1 to 10.

In the copolymer, from viewpoint of development latitude, a combination weight ratio between monomers having an acidic group in the groups of (b-1) to (b-3) and other monomers is preferably in the range from 50:50 to 5:95, and more preferably in the range from 40:60 to 10:90.

The polymer can be synthesized by heating corresponding monomers and a radical thermal polymerization initiator in an adequate solvent.

These alkaline water-soluble macromolecular compounds each may be used as one kind or two or more kinds in combination. An addition amount of the alkaline water-soluble macromolecular compound is in the range from 0 to 99 wt % per the entire use amount of resins, preferably from 30 wt % to 95 wt %, more preferably from 40 wt % to 95 wt %, and particularly preferably from 50 wt % to 90 wt %. It is not preferable for both of photosensitivity and durability that the addition amount of the alkaline water-soluble macromolecular compound exceeds 99 wt %.

Besides, a use amount of the resin having repeating units corresponding to a structure represented by Formula (I) is in the range from 5 wt % to 100 wt % per the entire use amount of resins, preferably from 5 wt % to 70 wt %, more preferably from 5 wt % to 60 wt %, and particularly preferably from 10 wt % to 50 wt %.

2) <Photosensitive Agent>

In the positive image-forming material of the invention, any photosensitive agent can be used, as far as the resin is contained and a positive image is obtained.

The photosensitive agent here means an agent that substantially absorbs light of exposed wavelength and increases developability of exposed area through causing a chemical or physical change.

Specific examples include the followings:

a photosensitive agent that itself has interaction with the resin to act as a dissolution inhibitor and that inhibit developability in an unexposed area and that release the interaction to accelerate development in an exposed area;

a photosensitive agent that generates an acid by exposure to light to contribute for developability improvement substantially, although the photosensitive agent itself has no dissolution-inhibiting action;

and a photosensitive agent that generates heat in an exposed area (a photothermal conversion material) to release interaction between one resin and another resin, interaction between the photosensitive agent and a resin, or interaction between a resin and a dissolution-inhibiting material which is a component different from the photosensitive agent, and as a result, increases developability substantially.

More specifically, a compound that generates an acid by irradiating actinic light or radiation (a photo-acid generator), preferably an onium salt that increases alkali-insolubility by interaction with a binder, a sulfone compound and a quinonediazide compound, and in addition, a compound that releases interaction with a resin by thermal action (onium-based infrared light-absorbing compound) can be mentioned.

The acid-decomposable photosensitive composition of the present invention may comprise a photosensitive agent generating a strong acid of pKa 3 or less during exposure to light. The photosensitive agent mentioned here is a substance that substantially absorbs light of exposed wavelength and generates a strong acid of pKa 3 or less. The following forms can be described as the photosensitive agent.

i) A photo-acid generator that absorbs light of exposed wavelength and generates a strong acid.

ii) A mixture of: a dye that absorbs infrared light and generates heat; and a photo-acid generator that generates a strong acid by action of the heat.

First, the photo-acid generator will be explained hereinafter.

The photo-acid generator to be used in the invention is a compound that generates an acid by being irradiated with actinic light or radiation.

For the compound which is dissociated to generate an acid by being irradiated with actinic light or radiation used in the invention, the following compounds or their mixtures can adequately be selected and used: a photo-initiator in photo-cationic polymerization, a photo-initiator in photo-radical polymerization, a photo-decolorizer for dyes, a photo-color changer, or a compound which generates an acid by being exposed to known light (ultraviolet light from 400 nm to 200 nm, far ultraviolet light, preferably in particular, g-line, h-line, i-line, KrF excimer laser light) used for a microphotoresist and the like, ArF excimer laser light, electron beams, X-ray, molecular beams or ion beams.

Further, in addition to the above, for the compound which generate an acid by being irradiated with actinic light or radiation used in the invention, the following compounds can be mentioned: for example, diazonium salts described in S. I. Schlesinger, *Photogr. Sci. Eng.*, 18, 387 (1974) and T. S. Bal et al., *Polymer*, 21, 423 (1980); ammonium salts described in U.S. Pat. Nos. 4,069,055, 4,069,056 and Re 27,992 and Japanese Patent Laid-Open No. 140140/1991; phosphonium salts described in D.C Necker et al., *Macromolecules*, 17, 2468 (1984), C. S. Wen et al., Teh, *Proc. Conf. Rad. Curing ASIA*, p. 478, Tokyo, Oct. (1988) and U.S. Pat. Nos. 4,069,055 and 4,069,056; iodonium salts described in J. V. Crivello et al., *Macromolecules*, 10 (6), 1307 (1977), *Chem. & Eng. News*, Nov. 28, p. 31 (1988), European Patents 104,143, 339,049 and 410,201, and Japanese Patent Laid-Open Nos. 150848/1990 and 296514/1990; sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *j. Polymer Sci.*, Polymer Chem. Ed., 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patents 2,904,626, 3,604,580 and 3,604,581, and Japanese Patent Laid-Open Nos. 28237/1995 and 27102/1996;

onium salts such as selenonium salts described in J. V. Crivello et al., *Macromolecules*, 10 (6), 1307 (1977) and J. V. Crivello et al., *J. Polymer Sci.*, Polymer Chem. Ed., 17, 1047 (1979) and arsonium salts described in C. S. Wen et al., Teh, *Proc. Conf. Rad. Curing ASIA*, p. 478, Tokyo, Oct. (1988); organic halogen compounds described in U.S. Pat. No. 3,905,815, Japanese Patent Publication No. 4605/1971, Japanese Patent Laid-Open Nos. 36281/1973, 32070/1980, 239736/1985, 169835/1986, 169837/1986, 58241/1987, 212401/1987, 70243/1988 and 298339/1988; organic metal/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896) and Japanese Patent Laid-Open No. 161445/1990;

photo-acid generators having an o-nitrobenzyl-based protective group described in S. Hayase et al., *J. Polymer Sci.*, 25, 753 (1987), E. Reichmanis et al., *J. Polymer Sci.*, Polymer Che. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17) 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), European Patents 0290,750, 046,083, 156,535, 271,851 and 0,388,343, U.S. Pat. Nos. 3,901,710 and 4,181,531, and Japanese Patent Laid-Open Nos. 198538/1985 and 133022/1978; compounds generating a sulfonic acid by photo-decomposition, a typical ones of which are iminosulfonates, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akuzo, H. Adachi et al., *Polymer Preprints Japan*, 37 (3), European Patents 0199,672, 84515, 044,115, 618,564 and 0101,122, U.S. Pat. Nos. 4,371,605 and 4,431,774, and Japanese Patent Laid-Open Nos. 18143/1989, 245756/1990 and 140109/1991; disulfone compounds described in Japanese Patent Laid-Open Nos. 166544/1986 and 71270/1990; and diazoketosulfone compounds and diazodisulfone compounds described in Japanese Patent Laid-Open Nos. 103854/1991, 103856/1991 and 210960/1992.

Further, compounds in which a group or a compound generating an acid by light is introduced into the main or side chain of a polymer, for example, compounds described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol.* Chem., Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3914407, and Japanese Patent Laid-Open Nos. 26653/1988, 164824/1980, 69263/1987, 146038/1988, 163452/1988, 153853/1987 and 146029/1988 can be used.

For example, diazonium salts, ammonium salts, phosphonium salts, iodonium salts, sulfonium salts, onium salts such as selenonium salts and arsonium salts, organic halogen compounds, organic metal/organic halogen compounds, photo-acid generators having an o-nitrobenzyl-based protective group, compounds generating a sulfonic acid by photo-decomposition, a typical ones of which are iminosulfonates, disulfone compounds, diazoketosulfone compounds and diazodisulfone compounds can be mentioned.

Besides, compounds in which these groups or compounds generating an acid by light are introduced into the main or side chain of a polymer can be used.

Further, compounds generating an acid by light described in V. N. R. Pillai, *Synthesis*, (1), 1 (1980), A. Abad et al., *Tetrahedron Lett.*, (47), 4555 (1971), D. H. Barton et al., *J. Chem. Soc.*, (C), 329 (1970), U.S. Pat. No. 3,779,778 and European Patent 126,712 can also be used.

Among the compounds which are decomposed by being irradiated with actinic light or radiation to generate an acid, those effectively usable in particular will be explained hereinafter.

(1) Oxazole derivatives substituted by a trihalomethyl group represented by General Formula (PAG1) described below, or S-triazine derivatives substituted by a trihalomethyl group represented by General Formula (PAG2) described below.

General Formula (PAG1)

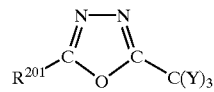

General Formula (PAG2)

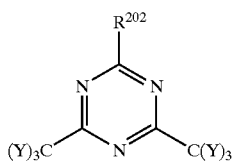

In General Formulas (PAG1) and (PAG2), $R^{201}$ represents a substituted or unsubstituted aryl or alkenyl group and $R^{202}$ represents a substituted or unsubstituted aryl, alkenyl, or alkyl group or $-C(Y)_3$. Y represents a chlorine atom or a bromine atom.

(2) Iodonium salts represented by General Formula (PAG3) described below, or sulfonium salts represented by General Formula (PAG4) described below.

General Formula (PAG3)

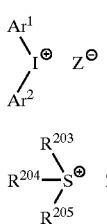

General Formula (PAG4)

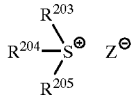

In General Formulas (PAG3) and (PAG4), $Ar^1$ and $Ar^2$ each independently represent a substituted or unsubstituted aryl group. For the preferable substituent, mentioned are an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

$R^{203}$, $R^{204}$ and $R^{205}$ each independently represent a substituted or unsubstituted alkyl or aryl group, and preferably an aryl group having 6 to 14 carbon atoms and an alkyl group having 1 to 8 carbon atoms and their substituted derivatives. The preferable substituent for an aryl group is an alkoxy group having 1 to 8 carbon atoms, a nitro group, a carboxyl group, a hydroxyl group and a halogen atom. The preferable substituent for an alkyl group is an alkoxy group having 1 to 8 carbon atoms, a carboxyl group and an alkoxycarbonyl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, an alkane sulfonic acid which may be substituted, a perfluoroalkane sulfonic acid, a benzene sulfonic acid which may be substituted, a naphthalene sulfonic acid which may be substituted, an anthrathene sulfonic acid and a camphor sulfonic acid. However, the invention should not be construed as being limited thereto. Preferable ones are an alkane sulfonic acid, a perfluoroalkane sulfonic acid, an alkyl-substituted benzene sulfonic acid and a pentafluorobenzene sulfonic acid.

Further, two of $R^{203}$, $R^{204}$ and $R^{205}$, and $Ar^1$ and $Ar^2$ may combine via each single bond or substituent.

Specific examples include compounds indicated below. However, the invention should not be construed as being limited thereto.

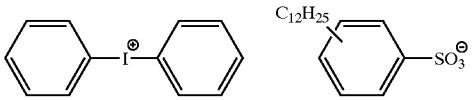
(PAG3-1)

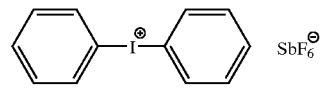
(PAG3-2)

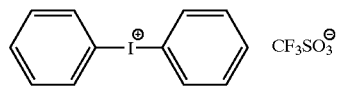
(PAG3-3)

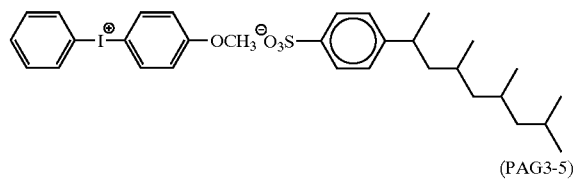
(PAG3-4)

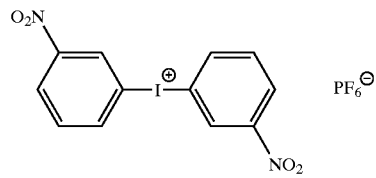
(PAG3-5)

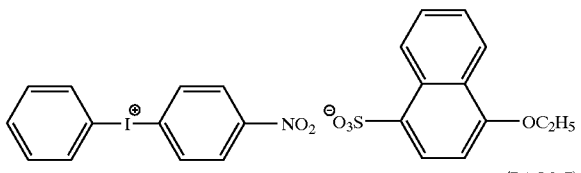
(PAG3-6)

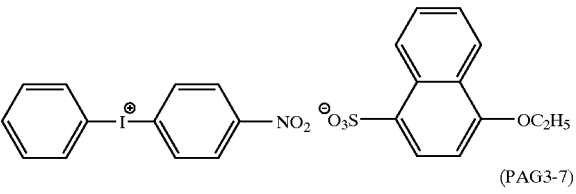
(PAG3-7)

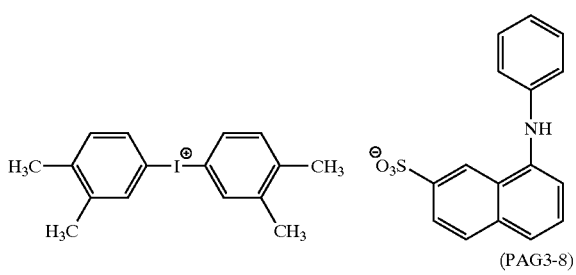
(PAG3-8)

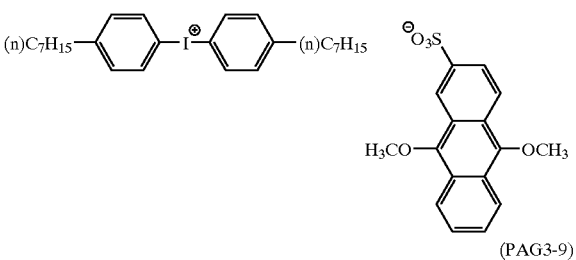
(PAG3-9)

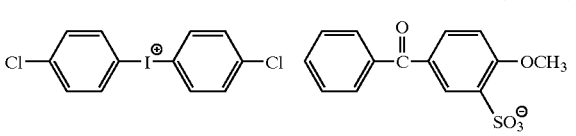

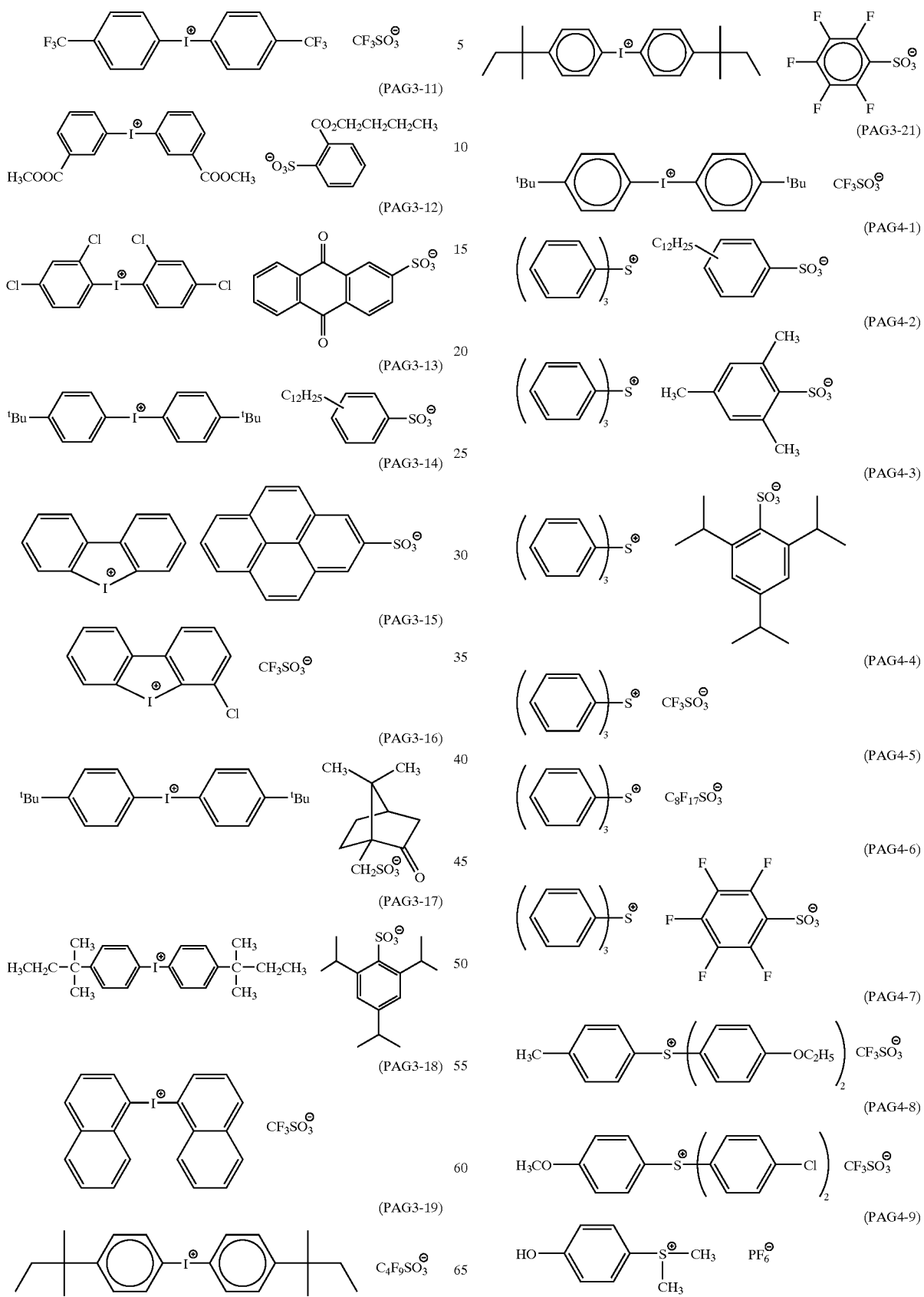

-continued
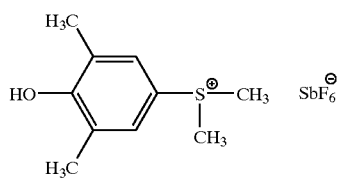
(PAG4-10)
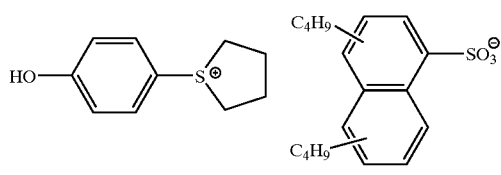
(PAG4-11)
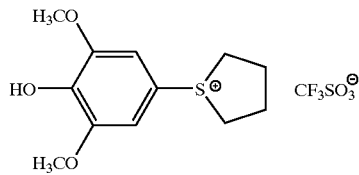
(PAG4-12)
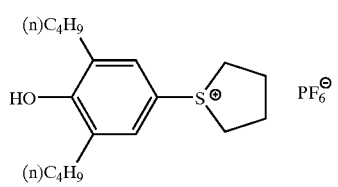
(PAG4-13)
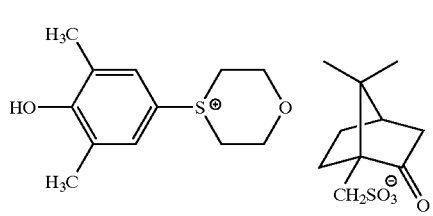
(PAG4-14)
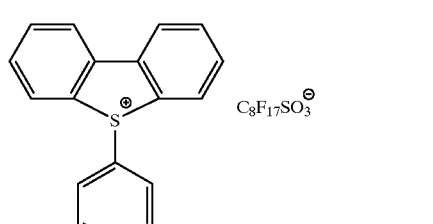
(PAG4-15)
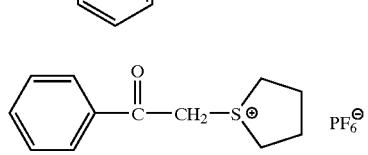
(PAG4-16)
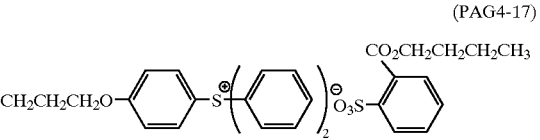
(PAG4-17)
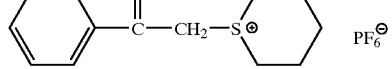
(PAG4-18)
-continued
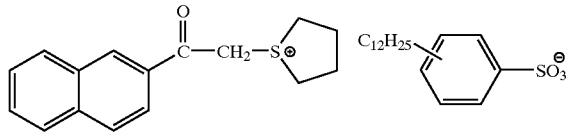
(PAG4-19)
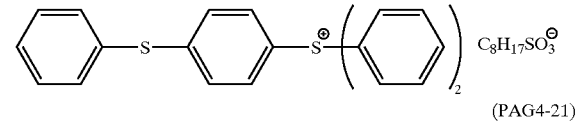
(PAG4-20)
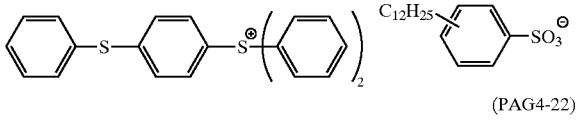
(PAG4-21)
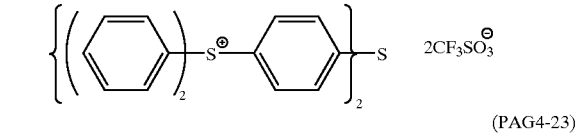
(PAG4-22)
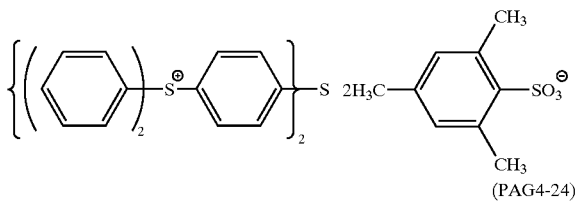
(PAG4-23)
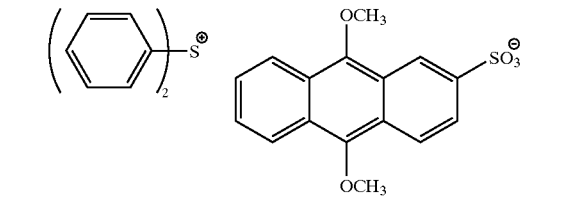
(PAG4-24)
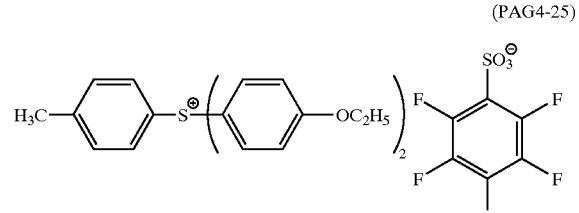
(PAG4-25)
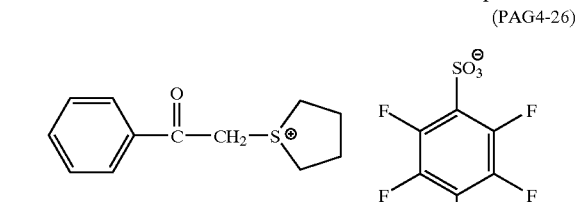
(PAG4-26)
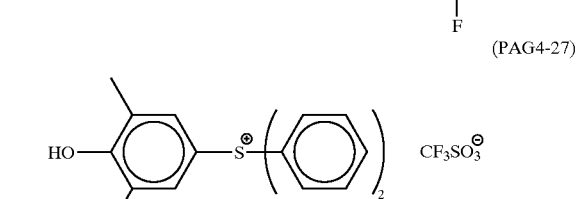
(PAG4-27)

-continued (PAG4-28)
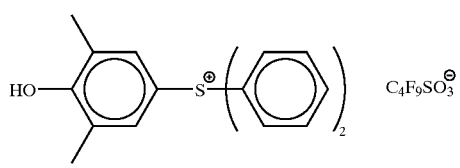

(PAG4-29)
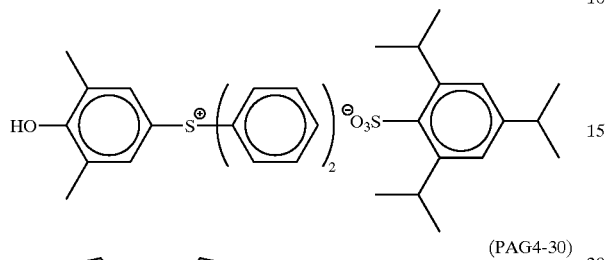
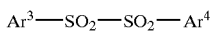
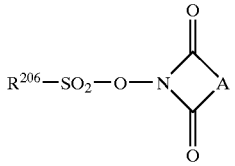

(PAG4-30)
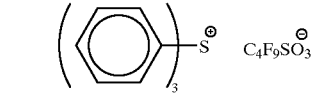

(PAG4-31)
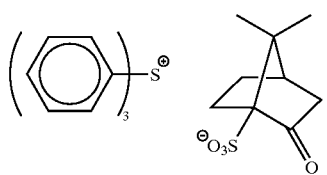

(PAG4-32)
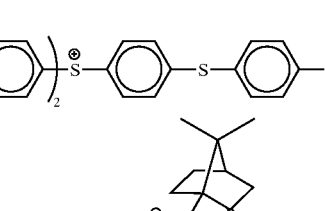

(PAG4-33)
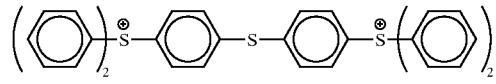

(PAG4-34)
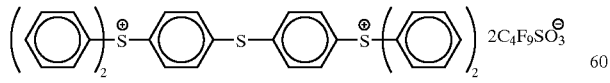

(PAG4-35)
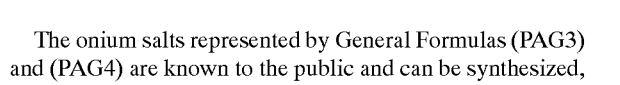

The onium salts represented by General Formulas (PAG3) and (PAG4) are known to the public and can be synthesized, for example, by methods described in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, and Japanese Patent Laid-Open No. 101331/1978.

(3) Disulfone derivatives represented by General Formula (PAG5) described below, or iminosulfonate derivatives represented by General Formula (PAG6) described below.

General Formula (PAG5)
$$Ar^3-SO_2-SO_2-Ar^4$$

General Formula (PAG6)
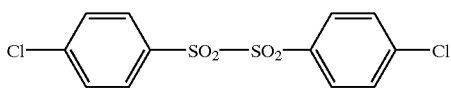

In General Formulas (PAG5) and (PAG6), $Ar^3$ and $Ar^4$ each independently represent a substituted or unsubstituted aryl group. $R^{206}$ represents a substituted or unsubstituted alkyl or aryl group. A represents a substituted or unsubstituted alkylene, alkenylene or arylene group.

Specific examples of the disulfone derivative or the iminosulfonate derivative include compounds indicated below. However, the invention should not be construed as being limited thereto.

(PAG5-1)
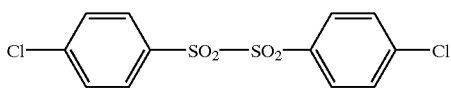

(PAG5-2)
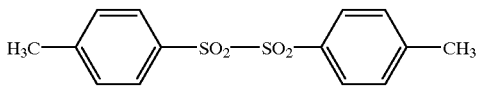

(PAG5-3)
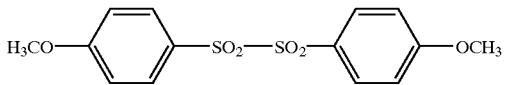

(PAG5-4)
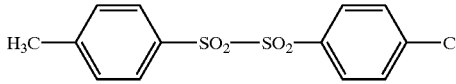

(PAG5-5)
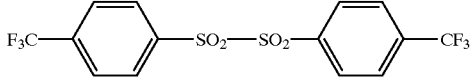

(PAG5-6)
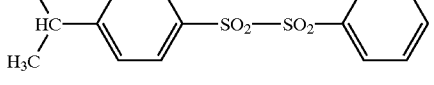

(PAG5-7)
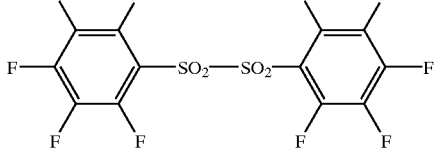

(PAG5-8)
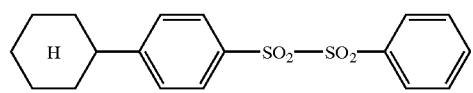
(PAG5-9)
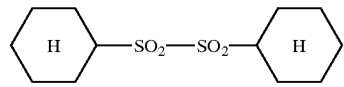
(PAG6-1)
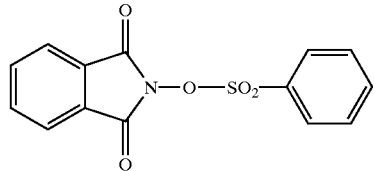
(PAG6-2)
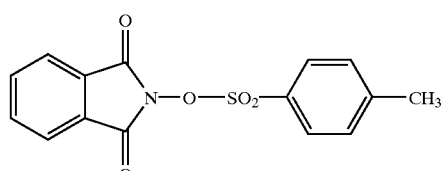
(PAG6-3)
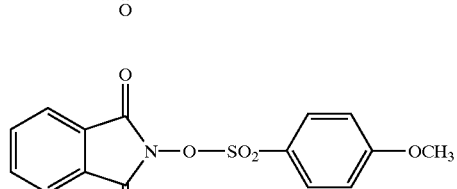
(PAG6-4)
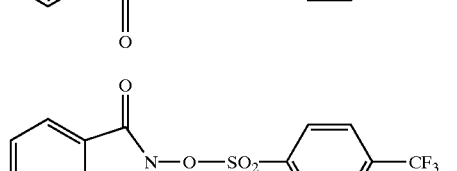
(PAG6-5)
(PAG6-6)
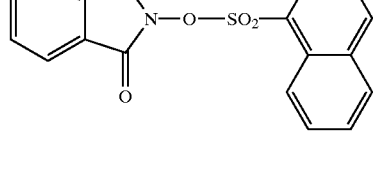
(PAG6-7)
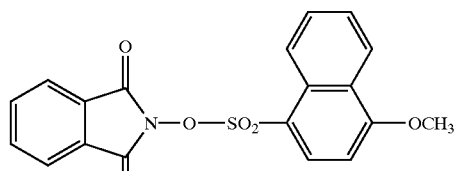
(PAG6-8)
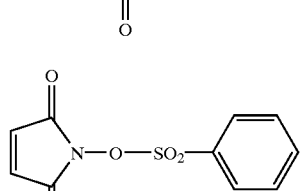
(PAG6-8)
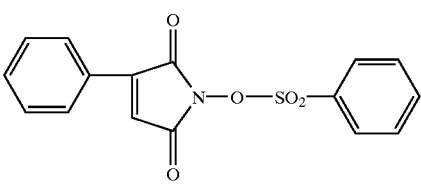
(PAG6-9)
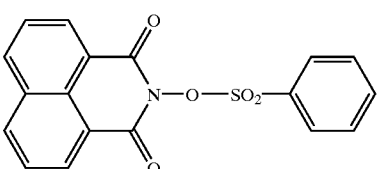
(PAG6-10)
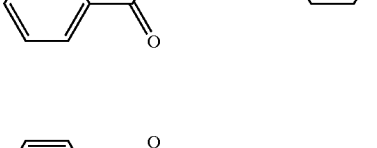
(PAG6-11)
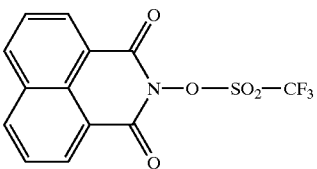
(PAG6-12)
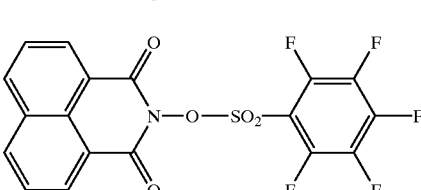
(PAG6-13)
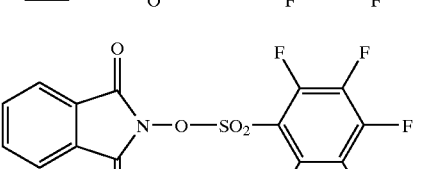
(PAG6-14)
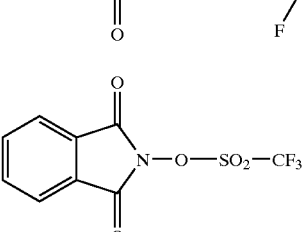
(PAG6-15)
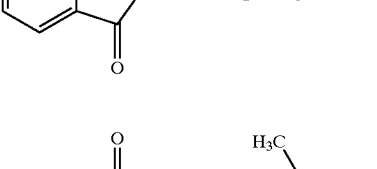

-continued

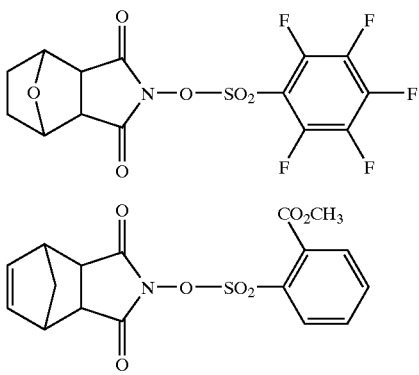

(PAG6-16)

(PAG6-17)

(4) Diazodisulfone derivatives represented by General Formula (PAG7) described below.

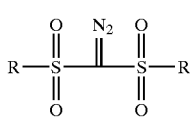

General Formula (PAG7)

In General Formula (PAG7), R represents an alkyl group in a branched or cyclic form, or an aryl group which may be substituted.

Specific examples of the diazosulfone derivative include compounds indicated below. However, the invention should not be construed as being limited thereto.

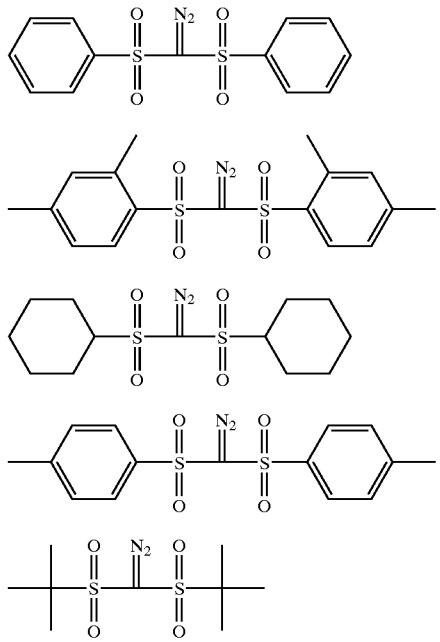

(PAG7-1)

(PAG7-2)

(PAG7-3)

(PAG7-4)

(PAG7-5)

In the invention, compounds represented by General Formula (PAG3), (PAG4) or (PAG7) are most preferred in viewpoint of photosensitivity and resolution.

An addition amount of these compounds decomposed by being irradiated with actinic light or radiation to generate an acid is usually in the range from 0.001 wt % to 40 wt % per the entire weight (except solvents) of the positive image-forming material of the invention, preferably from 0.01 wt % to 20 wt %, and more preferably from 0.01 wt % to 5 wt %. When the addition amount of these compounds decomposed by being irradiated with actinic light or radiation to generate an acid is less than 0.001 wt %, photosensitivity becomes low, and when the addition amount is more than 40 wt %, film-forming ability is lowered to deteriorate printing plate capability.

Quinonediazide compounds will be explained hereinafter.

For quinonediazide compounds to be used in the invention, esterified compounds between polyhydroxy compounds and 2-naphthoquinone-diazide-5-(and/or -4-)sulfonyl chloride indicated below can be used.

Examples of the polyhydroxy compound include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone;

polyhydroxyphenylalkylketones such as 2,3,4-trihydroxyacetophenone, 2,3,4-trihydroxyphenylpentylketone and 2,3,4-trihydroxyphenylhexylketone;

bis[(poly)hydroxyphenyl] alkanes such as bis(2,4-dihydroxyphenyl) methane, bis(2,3,4-trihydroxyphenyl) methane, bis(2,4-dihydroxyphenyl) propane-1, bis(2,3,4-trihydroxyphenyl) propane-1, nordihydroguaiaretic acid and 1,1-bis(4-hydroxyphenyl) cyclohexane;

polyhydroxybenzoic acid esters such as propyl-3,4,5-trihydroxybenzoate, phenyl-2,3,4-trihydroxybenzoate and phenyl-3,4,5-trihydroxybenzoate;

bis(polyhydroxybenzoyl) alkanes or bis(polyhydroxybenzoyl) aryls such as bis(2,3,4-trihydroxybenzoyl) methane, bis(3-acetyl-4,5,6-trihydroxyphenyl) methane, bis(2,3,4-trihydroxybenzoyl) benzene and bis(2,4,6-trihydroxybenzoyl) benzene;

alkylene-di(polyhydroxybenzoate)s such as ethylene glycol di(3,5-dihydroxybenzoate) and ethylene glycol di(3,4,5-trihydroxybenzoate);

polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6, 2',4',6'-biphenylhexol and 2,3,4,2',3',4'-biphenylhexol;

bis(polyhydroxy) sulfides such as 4,4'-thio bis(1,3-dihydroxy) benzene;

bis(polyhydroxyphenyl) ethers such as 2,2',4,4'-tetrahydroxydiphenyl ether;

bis(polyhydroxyphenyl) sulfoxides such as 2,2',4,4'-tetrahydroxydiphenyl sulfoxide;

bis(polyhydroxyphenyl) sulfones such as 2,2',4,4'-tetrahydroxydiphenyl sulfone;

polyhydroxytriphenyl methanes such as tris(4-hydroxyphenyl) methane, 4,4',4"-trihydroxy-3,5,3',5'-tetramethyltriphenylmethane, 4,4',3",4"-tetrahydroxy-3,5,3',5'-tetramethyltriphenyl methane, 4-[bis(3,5-dimethyl-4-hydroxyphenyl)methyl]-2-methoxy-phenol, 4,4'-(3,4-diol-benzylidene) bis[2,6-dimethylphenol], 4,4'-[(2-hydroxyphenyl)methylene] bis[2-cyclohexyl-5-methylphenol, 4,4', 2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane and 2,4,6,2',4',6'-hexahydroxy-5,5'-dipropyonyltriphenylmethane;

polyhydroxytriphenyl ethanes such as 4,4'-(phenylmethylene) bisphenol, 4,4'-(1-phenyl-ethylidene) bis [2-methylphenol] and 4,4',4"-ethylidene-trisphenol;

polyhydroxy spiro bi-indans such as 3,3,3',3'-tetramethyl-1,1'-spiro bi-indan-5,6,5',6'-tetrol, 3,3,3',3'-tetramethyl-1,1'-spiro bi-indan-5,6,7,5',6',7'-hexol, 3,3,3',3'-tetramethyl-1,1'-spiro bi-indan-4,5,6,4',5',6'-hexol and 3,3,3',3'-tetramethyl-1,1'-spiro bi-indan-4,5,6,5',6',7'-hexol; polyhydroxy flavans such as 2,4,4-trimethyl-2',4',7'-trihydroxy flavan;

polyhydroxy phthalides such as 3,3-bis(3,4-dihydroxyphenyl) phthalide, 3,3-bis(2,3,4-trihydroxyphenyl) phthalide, 3',4',5',6'-tetrahydroxy spiro [phthalide-3,9'-xthanthene]; flavono dyes such as morin, quercetin and rutin;

polyhydroxy compounds described in Japanese Patent Laid-Open No. 253058/1992 such as α, α', α"-tris (4-hydroxyphenyl)-1,3,5-tri-isopropyl benzene, α, α',α"-tris (3,5-dimethyl-4-hydroxyphenyl)-1,3,5-tri-isopropyl benzene, α,α', α"-tris(3,5-diethyl-4-hydroxyphenyl)-1,3,5-tri-isopropyl benzene, α,α',α"-tris(3,5-di-n-propyl-4-hydroxyphenyl)-1,3,5-tri-isopropyl benzene, α,α',α"-tris(3, 5-di-isopropyl-4-hydroxyphenyl)-1,3,5-tri-isopropyl benzene, α,α',α"-tris(3,5-di-n-butyl-4-hydroxyphenyl)-1,3, 5-tri-isopropyl benzene, α,α',α"-tris(3-methyl-4-hydroxyphenyl)-1,3,5-tri-isopropyl benzene, α,α',α"-tris(3-methoxy-4-hydroxyphenyl)-1,3,5-tri-isopropyl benzene, α,α',α"-tris(2,4-dihydroxyphenyl)-1,3,5-tri-isopropyl benzene, 1,3,5-tris(3,5-dimethyl-4-hydroxyphenyl) benzene, 1,3,5-tris(5-methyl-2-hydroxyphenyl) benzene, 2,4,6-tris(3,5-dimethyl-4-hydroxyphenylthiomethyl) mesitylene,1-[α-methyl-α-(4'-hydroxyphenyl)ethyl]-4-[α, α'-bis(4"-hydroxyphenyl)ethyl] benzene, 1-[α-methyl (4'-hydroxyphenyl) ethyl]-3-[α,α'-bis(4"-hydroxyphenyl)ethyl] benzene, 1-[α-methyl-α-(3',5'-dimethyl-4'-hydroxyphenyl) ethyl]-4-[α,α'-bis(3",5"-dimethyl-4"-hydroxyphenyl)ethyl] benzene, 1-[α-methyl(3'-methyl-4'-hydroxyphenyl)ethyl]-4-[α',α'-bis(3"-methyl-4"-hydroxyphenyl)ethyl] benzene, 1-[α-methyl-α-(3'-methoxy-4'-hydroxyphenyl)ethyl]-4-[α', α'-bis(3"-methoxy-4"-hydroxyphenyl)ethyl] benzene, 1-[α-methyl-α-(2',4'-dihydroxyphenyl) ethyl]-4-[α',α'-bis(4"-hydroxyphenyl)ethyl] benzene and 1-[α-methyl(2',4'-dihydroxyphenyl)ethyl]-3-[α',α'-bis(4"-hydroxyphenyl) ethyl] benzene; polyhydroxy compounds described in Japanese Patent Laid-Open No. 224410/1993 such as α,α, α',α',α",α"-hexakis(4-hydroxyphenyl)-1,3,5-triethyl benzene; poly(hydroxyphenyl) alkanes described in Japanese Patent Laid-Open No. 303200/1993 and European Patent 530148 such as 1,2,2,3-tetra(p-hydroxyphenyl) propane and 1,3,3,5-tetra(p-hydroxyphenyl) pentane;

p-bis(2,3,4-trihydroxybenzoyl) benzene, p-bis(2,4,6-trihydroxybenzoyl) benzene, m-bis(2,3,4-trihydroxybenzoyl) benzene, m-bis(2,4,6-trihydroxybenzoyl) benzene, p-bis(2,5-dihydroxy-3-bromobenzoyl) benzene, p-bis(2,3,4-trihydroxy-5-methylbenzoyl) benzene, p-bis(2,3,4-trihydroxy-5-methoxybenzoyl) benzene, p-bis(2,3,4-trihydroxy-5-nitrobenzoyl) benzene, p-bis(2,3,4-trihydroxy-5-cyanobenzoyl) benzene, 1,3,5-tris (2,5-dihydroxy benzoyl) benzene, 1,3,5-tris(2,3,4-trihydroxybenzoyl) benzene, 1,2,3-tris(2,3,4-trihydroxybenzoyl) benzene, 1,2,4-tris(2,3,4-trihydroxybenzoyl) benzene, 1,2,4,5-tetrakis(2,3,4-trihydroxybenzoyl) benzene, α,α'-bis(2,3,4-trihydroxybenzoyl) p-xylene, α,α',α'-tris(2,3,4-trihydroxybenzoyl) mesitylene, 2,6-bis (2-hydroxy-3,5-dimethyl-benzyl)-p-cresol, 2,6-bis (2-hydroxy-5'-methyl-benzyl)-p-cresol, 2,6-bis(2,4,6-trihydroxy-benzyl)-p-cresol, 2,6-bis(2,3,4-trihydroxy-benzyl)-p-cresol, 2,6-bis(2,3,4-trihydroxy-benzyl)-3,5-dimethyl-phenol, 4,6-bis(4-hydroxy-3,5-dimethylbenzyl)-pyrogallol, 2,6-bis(4-hydroxy-3,5-dimethylbenzyl)-1,3,4-trihydroxy-phenol, 4,6-bis(2,4,6-trihydroxybenzyl)-2,4-dimethyl-phenol, 4,6-bis(2,3,4-trihydroxybenzyl)-2,5-dimethyl-phenol, 2,6-bis(4-hydroxybenzyl)-p-cresol, 2,6-bis(4-hydroxybenzyl)-4-cyclohexylphenol, 2,6-bis(4-hydroxy-3-methylbenzyl)-p-cresol, 2,6-his(4-hydroxy-3,5-dimethylbenzyl)-p-cresol, 2,6-bis(4-hydroxy-2,5-dimethylbenzyl)-p-cresol, 2,6-bis(4-hydroxy-3-methylbenzyl)-4-phenylphenol, 2,2',6,6'-tetrakis[(4-hydroxyphenyl)methyl]-4,4'-methylenediphenol, 2,2',6,6'-tetrakis[(4-hydroxy-3,5-dimethylphenyl)methyl]b-4,4'-methylenediphenol, 2,2',6,6'-tetrakis[(4-hydroxy-3-methylphenyl)methyl]-4, 4'-methylenediphenol and 2,2'-bis [(4-hydroxy-3,5-dimethylphenyl)methyl]-6,6'-dimethyl-4, 4'-methylenediphenol.

Further, oligomers of a phenol resin such as a novolac resin can also be used.

Esterification reaction to obtain the photosensitive compound is performed by condensation of the polyhydroxy compound in a given amount with 1,2-naphthoquinone-diazide-5-(and/or -4-)sulfonyl chloride dissolved in a solvent such as dioxane, acetone, tetrahydrofuran, methylethyl ketone, N-methylpyrrolidone, chloroform, trichloroethane, trichloroethylene or dichloroethane under dropping of a basic catalyst, e. g., sodium hydroxide, sodium carbonate, sodium hydrogen carbonate, triethyl amine, N-methylmorpholine, N-methylpiperazine or 4-dimethylaminopyridine. The obtained product is washed, then purified and dried.

In ordinary esterification reaction, a mixture with different esterification numbers and different esterification positions is obtained. However, a specific isomer can selectively be esterified by selecting a synthetic condition or a structure of the polyhydroxy compound. An esterification ratio in the invention means an average value of such a mixture.

The esterification ratio can be controlled by a mixing ratio of the polyhydroxy compound and 1,2-naphthoquinonediazide-5-(and/or -4-)sulfonyl chloride as starting materials. Namely, substantially all of added 1,2-naphthoquinonediazide-5-(and/or -4-)sulfonyl chloride cause esterification reaction. The molar ratio of starting materials can, therefore, be adjusted to obtain a mixture of desired esterification ratio. 1,2-naphthoquinonediazide-5-sulfonyl chloride and 1,2-naphthoquinonediazide-4-sulfonyl chloride can be used in combination according to necessity. Besides, a reaction temperature in the above method is usually in the range from −20° C. to 60° C., and preferably from 0° C. to 40° C.

The quinonediazide-based photosensitive compound synthesized by the method described in the above is used as one kind or as two or more kinds in combination to be mixed in a resin when the quinonediazide-based photosensitive compound is used in the material of the invention. A mixing amount of the quinonediazide-based photosensitive compound is in the range from 5 parts by weight to 100 parts by weight per 100 parts by weight of a resin, and preferably from 20 parts by weight to 60 parts by weight. When the use ratio is less than 5 parts by weight, a ratio of remaining film may decrease. When the use ratio exceeds over 100 parts by weight, photosensitivity and solubility to a solvent may become worse.

The mixture of: a dye (an infrared light-absorbing dye) that absorbs infrared light and generates heat; and a photo-acid generator that generates a strong acid by action of the heat described in ii) will be explained hereinafter.

Interactive Compounds Releasable by Heat: Onium-based Infrared Light-absorbing Dyes Examples of the onium-based infrared light-absorbing dye include cationic infrared dyes and anionic infrared dyes indicated below.

These compounds absorb infrared light and generate heat to release interaction of an onium salt with a binder, and accordingly to increase alkali-developability in an exposed area.

For the preferable dye, cyanine dyes described in Japanese Patent Laid-Open Nos. 125246/1983, 84356/1984, 202829/1984 and 78787/1985, and cyanine dyes described in British Patent 434,875 can be cited.

Further, near infrared light-absorbing sensitizers described in U.S. Pat. No. 5,156,938 can suitably be used. Furthermore, the following compounds are also preferably used: substituted arylbenzo(thio)pyrylium salts described in U.S. Pat. No. 3,881,924; trimethynthiapyrylium salts; pyrylium-based compounds described in Japanese Patent Laid-Open Nos. 181051/1983, 220143/1983, 41363/1984, 84248/1984, 84249/1984, 146063/1984 and146061/1984; cyanine dyes described in Japanese Patent Laid-Open No. 216146/1984; pentamethynthiopyrylium salts described in U.S. Pat. No. 4,283,457; and pyrylium compounds described in Japanese Patent Publication Nos. 13514/1993 and 19702/1993.

Further, near infrared light-absorbing dyes described as Formulas (I) and (II) in U.S. Pat. No. 4,756,993, and phthalocyanine-based dyes described in European Patent 916513A2 can be cited as preferable dyes.

Furthermore, anionic infrared light-absorbing agents described in Japanese Patent Application No. 79912/1998 can also preferably be used. The anionic infrared light-absorbing agent means a compound having an anionic structure and no cationic structure in a host ring of the dye which substantially absorbs infrared light. For example, anionic metal complexes (c1), anionic carbon black (c2), anionic phthalocyanines (c3) and compounds represented by General Formula 6 (c4) described below are mentioned. A counter cation of these anionic infrared light-absorbing agents is a one-valent cation containing a proton or a multi-valent cation.

$$[G_a-M-G_b]_m X_{m+}$$ General Formula 6

In the above, anionic metal complexes (c1) indicate a metal complex to become an anion as a whole including ligands and a central metal in the complex part which substantially absorbs light.

For the anionic carbon black (c2), mentioned is carbon black in which an anionic group such as a sulfonic acid, a carboxylic acid or a phosphonic acid combines as a substituent. In order to introduce these groups into carbon black, such a method to oxidize carbon black with a given acid as described in *Carbon Black Handbook* $3^{rd}$ Edition (edited by Carbon Black Association, Apr. 5, 1995, published by Carbon Black Association) can be adopted.

Anionic phthalocyanines (c3) indicate a phthalocyanine to become an anion as a whole in which an anion group mentioned as a substituent in the explanation about (c2) combines with the phthalocyanine skeleton.

The compounds represented by General Formula 6 (c4) will be explained in detail hereinafter. In General Formula 6, $G_a$—represents an anionic substituent and $G_b$ represents a neutral substituent. $X_{m+}$ represents a 1- to m-valent cation containing a proton and m represents an integer from 1 to 6. M represents a conjugated chain. The conjugated chain M may have a substituent and a ring structure. The conjugated chain M can be expressed by a formula described below.

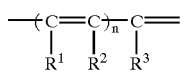

In the formula described in the above, $R^1$, $R^2$ and $R^3$ each independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group and an amino group. $R^1$, $R^2$ and $R^3$ may combine one another to form a ring structure. n represents an integer from 1 to 8.

Among the anionic infrared light-absorbing agents represented by General Formula 6, those indicated in A-1 to A-5 are preferably used.

A-1

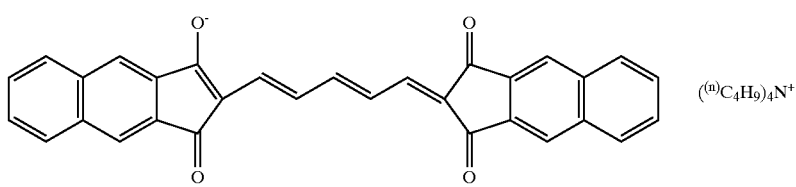

A-2

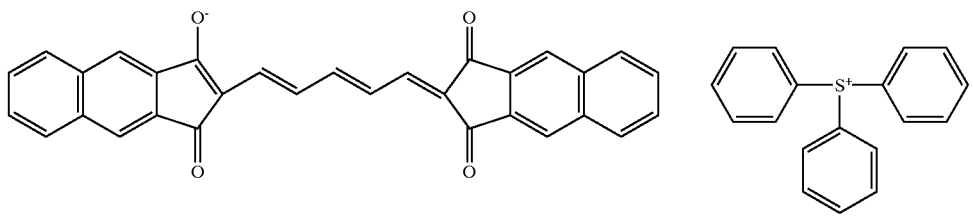

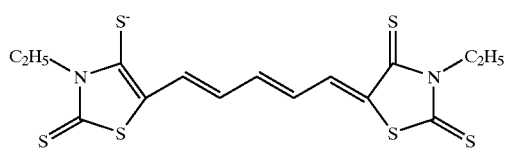
A-3
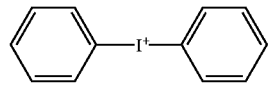
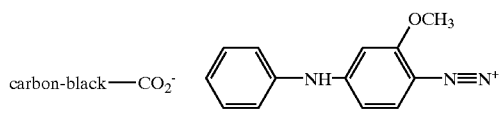
A-4
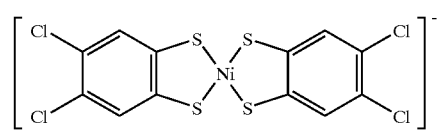
A-5
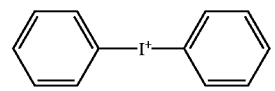
Further, cationic infrared light-absorbing agents indicated in CA-1 to CA-44 described below can also preferably be used.
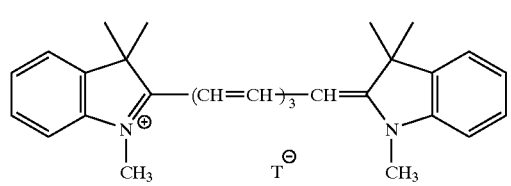
CA-1
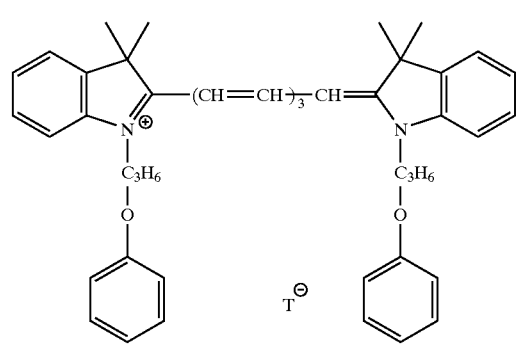
CA-2
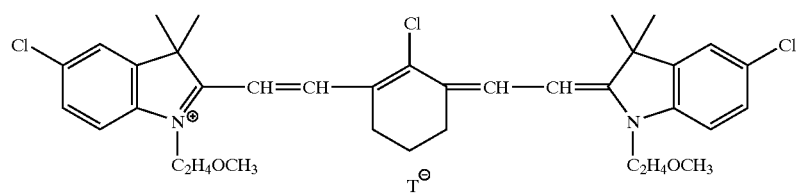
CA-3
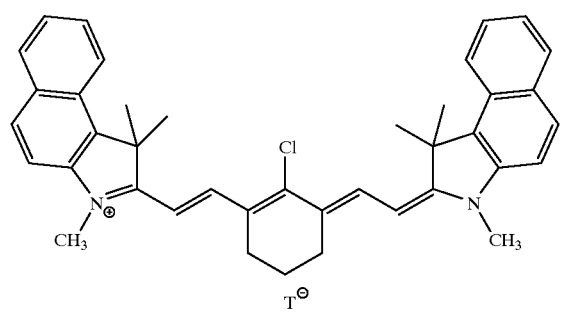
CA-4

-continued
CA-5
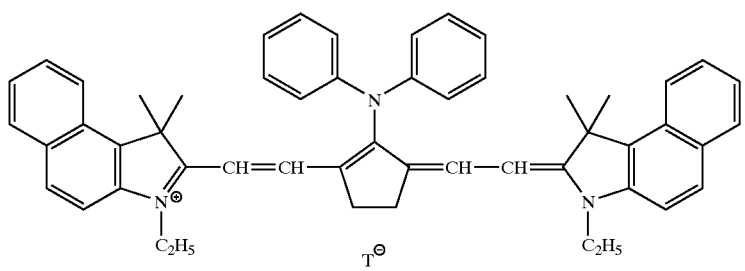
CA-6
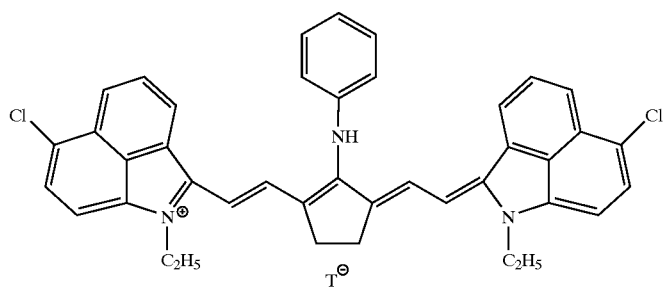
CA-7
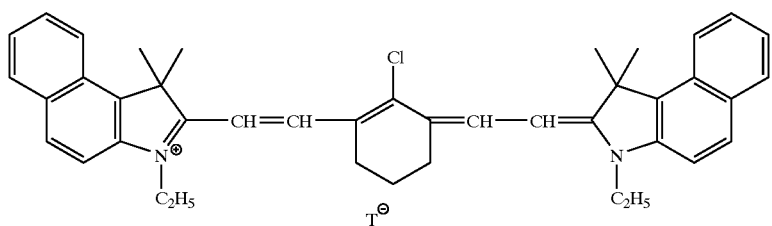
CA-8
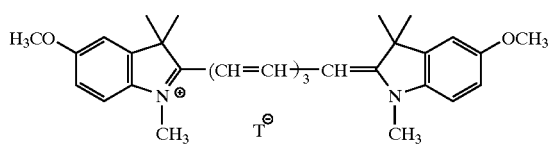
CA-9
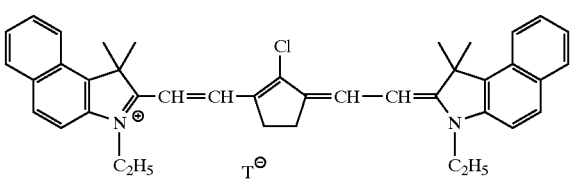
CA-10
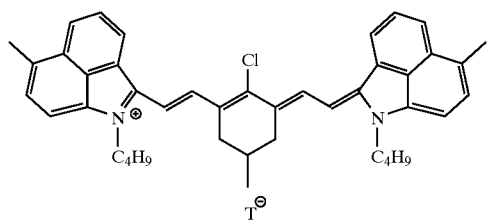
CA-11
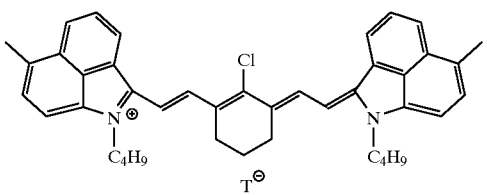
CA-12
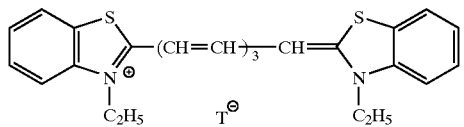
CA-13
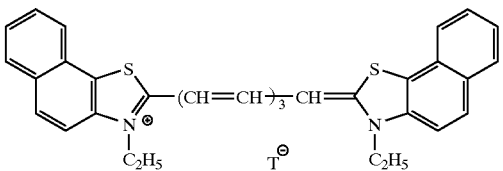
CA-14
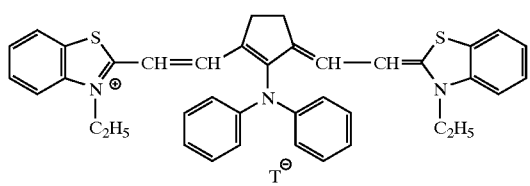
CA-15
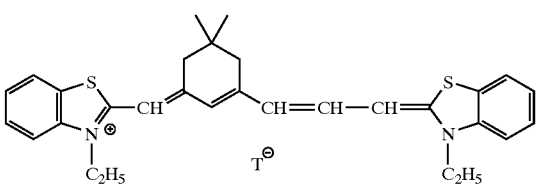

-continued
CA-16
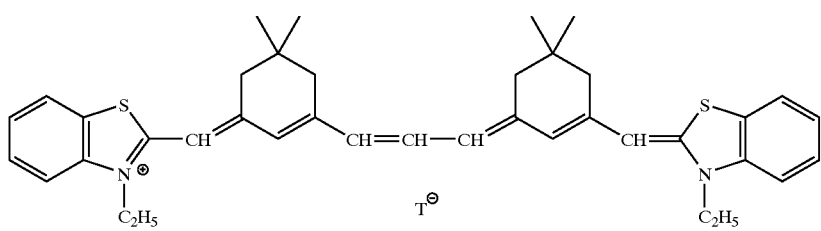
CA-17
CA-18
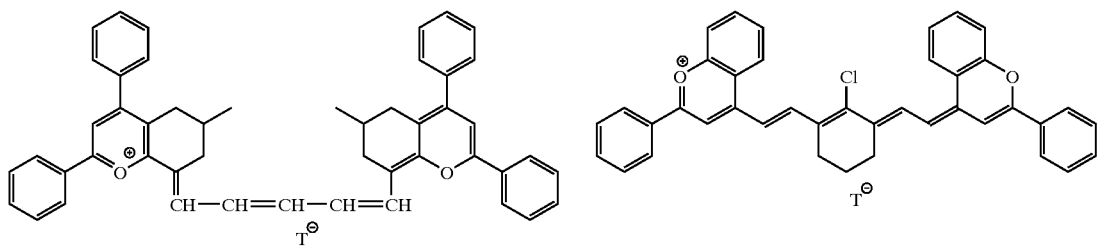
CA-19
CA-20
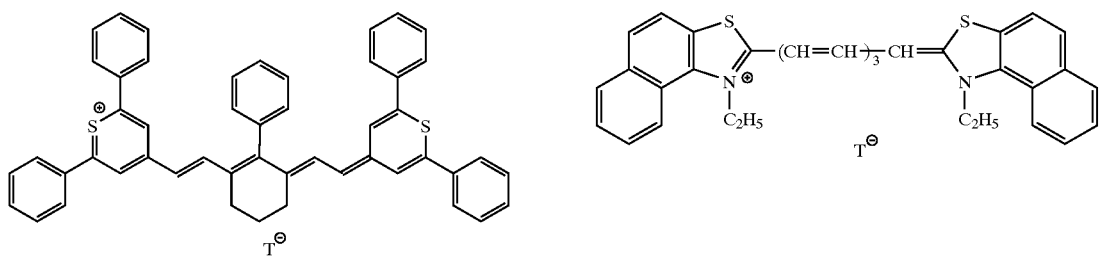
CA-21
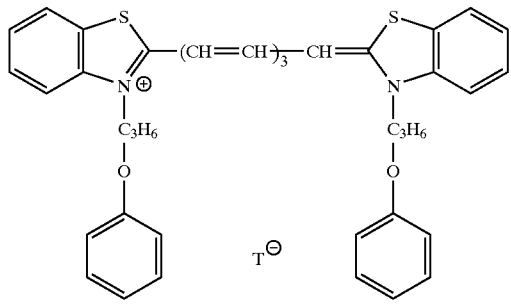
CA-22
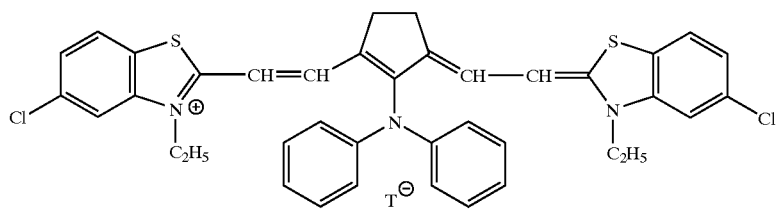
CA-23
CA-24
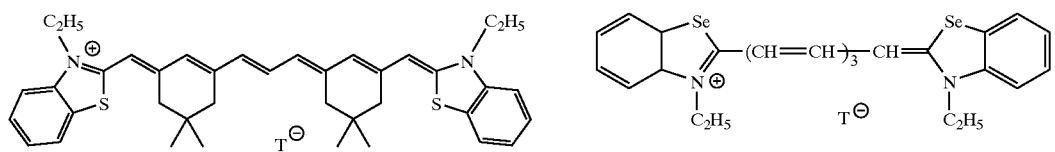

-continued
CA-25
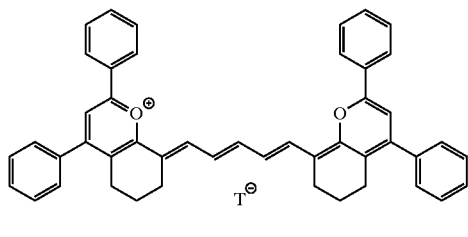
CA-26
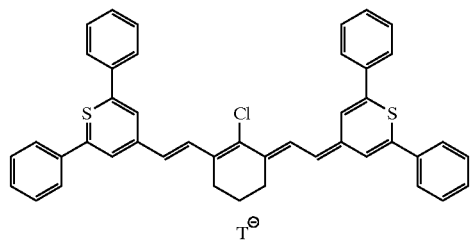
CA-27
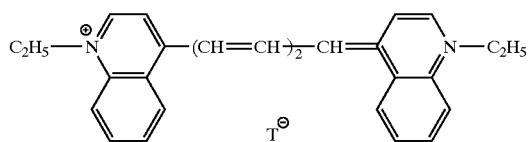
CA-28
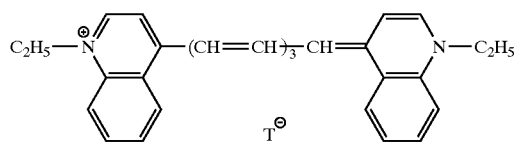
CA-29
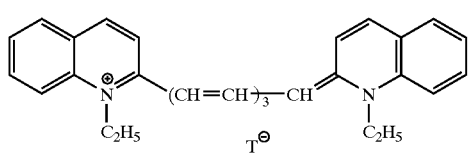
CA-30
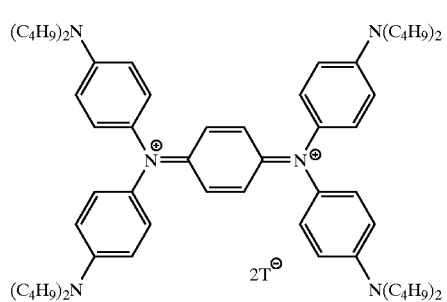
CA-31
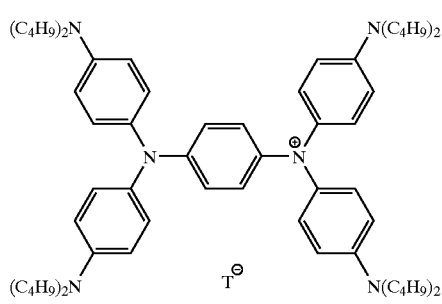
CA-32
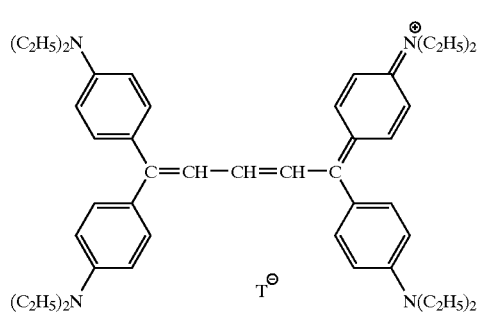
CA-33
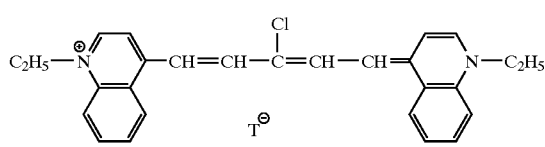
CA-34
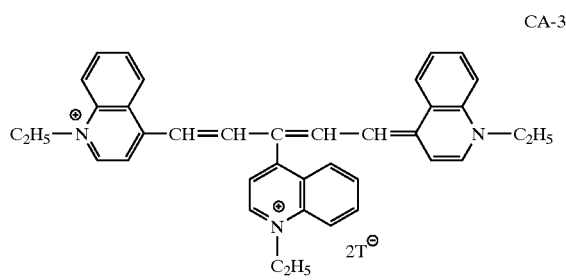
CA-35
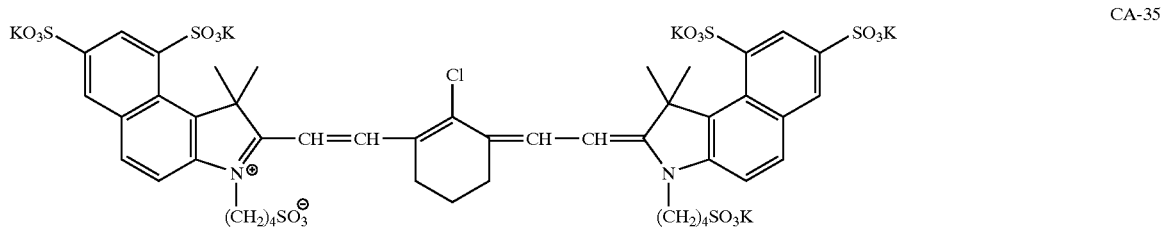

-continued
CA-36
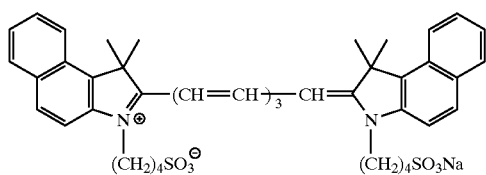
CA-37
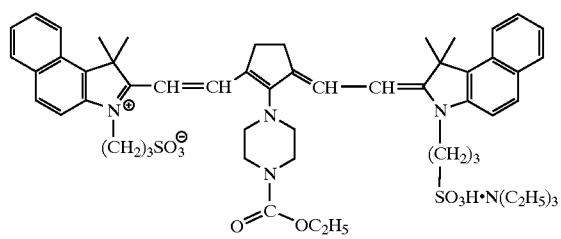
CA-38
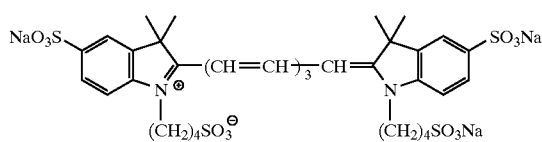
CA-39
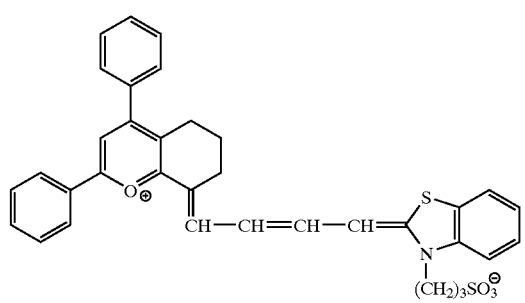
CA-40
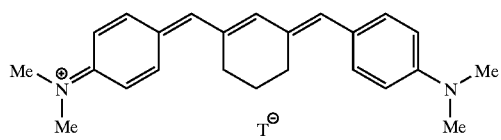
CA-41
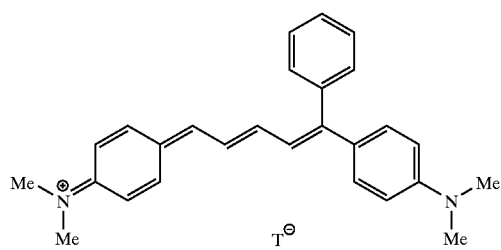
CA-42
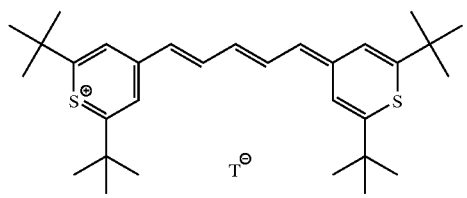
CA-43
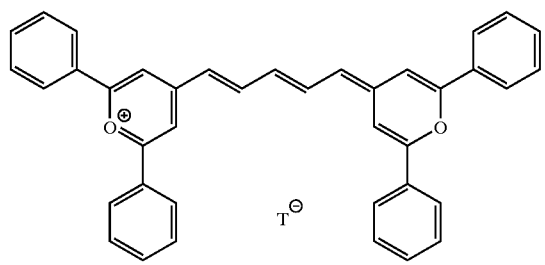

-continued

CA-44

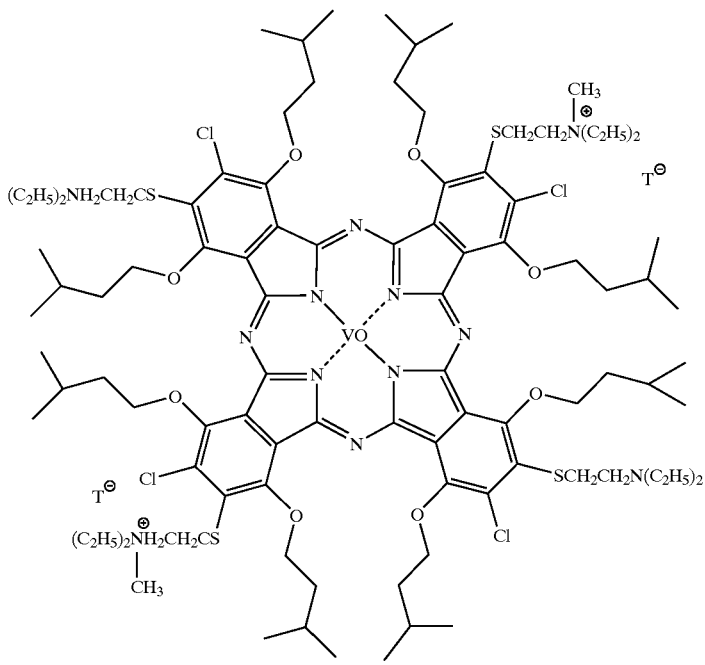

In the foregoing structural formula, T⁻ represents a one-valent counter anion, which is preferably a halogen anion ($F^-$, $Cl^-$, $Br^-$ or $I^-$), a Lewis acid anion ($BF_4^-$, $PF_6^-$, $SbCl_6^-$ or $ClO_4^-$), an alkyl sulfonic acid anion or an aryl sulfonic acid anion.

The alkyl group in the foregoing alkyl sulfonic acid means an alkyl group having 1 to 20 carbon atoms in a straight chain, a branched chain or a ring form. Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, more preferred are an alkyl group having 1 to 12 carbon atoms in a straight chain form, an alkyl group having 3 to 12 carbon atoms in a branched chain form and a cyclic alkyl group having 5 to 10 carbon atoms.

The aryl group in the foregoing aryl sulfonic acid means an aryl group having one benzene ring, a condensed ring made of two or three benzene rings or a condensed ring made of a benzene ring and a 5-membered unsaturated ring. Specific examples of the aryl group include a phenyl group, a naphthyl group, an anthryl group, a phenanthryl group, an indenyl group, an acenaphthenyl group and a fluorenyl group. Among them, a phenyl group and a naphthyl group are preferred.

When the onium-based infrared light-absorbing dye is used in the material of the invention, it is used in one kind or two or more kinds in combination by being mixed into a resin. A mix amount of the onium-based infrared light-absorbing dye is in the range from 5 parts by weight to 100 parts by weight per 100 parts of the resin, and preferably from 20 parts by weight to 60 parts by weight. When the use ratio is less than 5 parts by weight, a ratio of remaining film may decrease. When the use ratio exceeds over 100 parts by weight, photo sensitivity and solubility to a solvent may decline.

3) <Acid-Decomposable Dissolution-Inhibiting Compound>

The positive image-forming material of the invention can also contain a dissolution-inhibiting low molecular weight (a molecular weight of 3000 or less) compound having a group which is decomposed by action of an acid to increase solubility in an alkaline developer (hereinafter called as an acid-decomposable dissolution-inhibiting compound).

Aliphatic cyclic compounds or aliphatic compounds containing an acid-decomposable group such as cholic acid derivatives containing an acid-decomposable group described in *Proceeding of SPIE*, 2724, 355 (1996) are preferable for the acid-decomposable dissolution-inhibiting compound. For the acid-decomposable group and the aliphatic cyclic structure, the same ones as those explained in the acid-decomposable resin are mentioned.

An addition amount of the acid-decomposable dissolution-inhibiting compound is preferably in the range from 3 wt % to 50 wt % per the entire solid content of the positive image-forming material, and more preferably from 5 wt % to 40 wt %.

Specific examples of the acid-decomposable dissolution-inhibiting compound will be indicated hereinafter. However, the invention should not be construed as being limited thereto.

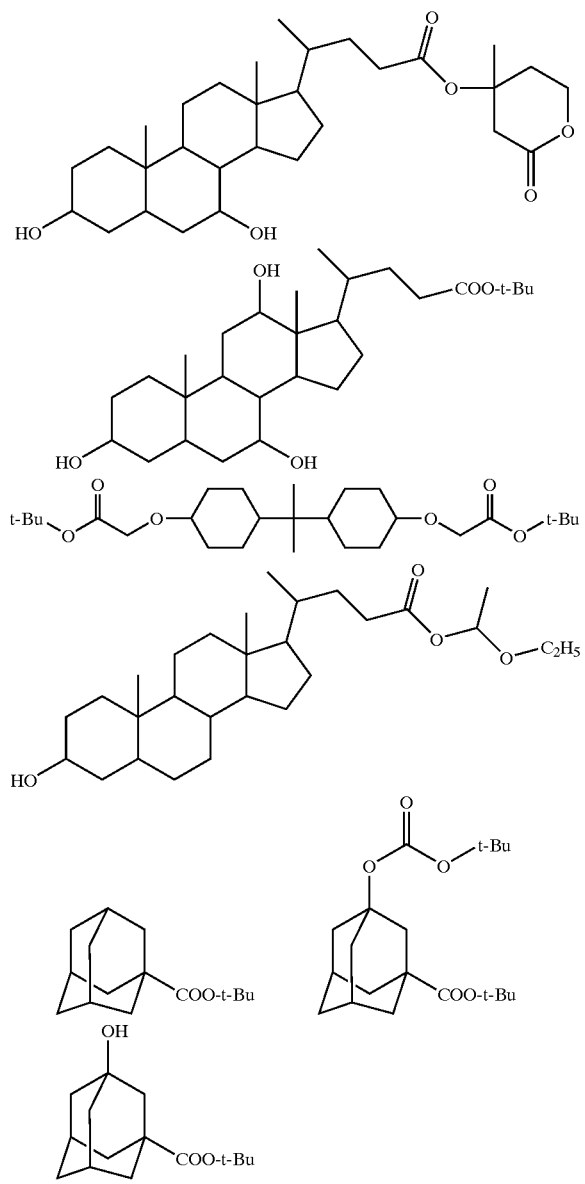

4) <Other Components>

To the photosensitive composition of the invention, various kinds of additives can further be added according to necessity. From viewpoint of improving dissolution-inhibition of an image area against developer, it is preferable to use a substance in combination, which is thermally decomposable and, in a state without decomposition, substantially decreases solubility of a water-soluble macromolecular compound such as aromatic sulfone compounds and aromatic sulfonic acid ester compounds.

Further, for the purpose of improving photosensitivity, cyclic acid anhydrides, phenols and organic acids can also be used in combination. For cyclic acid anhydrides, employable are phthalic acid anhydride, tetrahydro phthalic acid anhydride, hexahydro phthalic acid anhydride, 3,6-endoxy-Δ⁴-tetrahydro phthalic acid anhydride, tetrachloro phthalic acid anhydride, maleic acid anhydride, chloro maleic acid anhydride, (α-phenyl maleic acid anhydride, succinic acid anhydride and pyromellitic acid anhydride described in U.S. Pat. No. 4,115,128. For phenols, mentioned are bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. For organic acids, mentioned are sulfonic acids, sulfinic acids, alkyl sulfuric acids, phosphonic acids, phosphoric acid esters and carboxylic acids described in Japanese Patent Laid-Open Nos. 88942/1085 and 96755/1990. Specific examples of the organic acid include p-toluene sulfonic acid, dodecylbenzene sulfonic acid, p-toluene sulfinic acid, ethyl sulfate, phenyl phosphonate, phenyl phosphinate, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

A content ratio of the cyclic acid anhydrides, phenols and organic acids in the image-forming material is preferably in the range from 0.05 wt % to 20 wt %, more preferably from 0.1 wt % to 15 wt %, and furthermore preferably from 0.1 wt % to 10 wt %.

Further, into the image-forming material of the invention, nonionic surfactants described in Japanese Patent Laid-Open Nos. 251740/1987 and 208514/1991, and amphoteric surfactants described in Japanese Patent Laid-Open Nos. 121044/1984 and 13149/1992 can be added in order to maintain processing stability in fluctuation of development conditions. Specific examples of the nonionic surfactant include sorbitan tristearate, sorbitan monopalmitate, sorbitan trioleate, monoglyceride stearate and polyoxyethylene nonylphenyl ether. Specific examples of the amphoteric surfactant include alkyldi(aminoethyl) glycine, a salt of alkylpolyaminoethylglycine hydrochloric acid, 2-alkyl-N-carboxyethyl-N-hydroxyethylimidazolium betaine and N-tetradecyl-N,N'-betaine-based compounds (e.g., Amogen K, a product name, manufactured by Daiichi Kogyo K. K.).

A content ratio of the nonionic surfactant and the amphoteric surfactant in the image-forming material is preferably in the range from 0.05 wt % to 15 wt %, and more preferably from 0.1 wt % to 5 wt %.

When the image-forming material of the invention is used in a printing plate material, a printing-out agent for obtaining a visible image immediately after heating by exposing to light and a dye or a pigment as an image-coloring agent can be added. For the printing-out agent, a combination between a compound releasing an acid by heat of exposure to light (a photo-acid releasing agent) and an organic dye capable to form a salt can be mentioned as a typical one. Specifically mentioned are combinations between o-naphthoquinonediazide-4-sulfonic halogenides and acid-forming organic dyes described in Japanese Patent Laid-Open Nos. 36209/1975 and 8128/1978 and combinations between trihalomethyl compounds and acid-forming organic dyes described in Japanese Patent Laid-Open Nos. 36223/1978, 74728/1079, 3626/1985, 143748/1986, 151644/1986 and 58440/1988. For such trihalomethyl compounds, there are two sorts of compounds, oxazole-based compounds and triazine-based compounds. Both of them are excellent in storage stability and give a clear printing-out image.

For the image-coloring agent, other dyes can be used in addition to the acid-forming organic dyes. Oil-soluble dyes and basic dyes can be mentioned as preferable dyes including the acid-forming organic dyes. Specifically mentioned are Oil Yellow #101, Oil Yellow #103, Oil Pink #312, Oil Green BG, Oil Blue BOS, Oil Blue #603, Oil Black BY, Oil Black BS, Oil Black T-505 (the foregoing products are manufactured by Orient Chemical Industry K. K.), Victoria Pure Blue, Crystal Violet (CI42555), Methyl Violet (CI42535), Ethyl Violet, Rhodamine B (CI145170B), Malachite Green (CI42000) and Methylene Blue (CI52015). Further, dyes described in Japanese Patent Laid-Open No. 293247/1987 are particularly preferred.

These dyes can be added in an amount ranged from 0.01 wt % to 10 wt % per the entire solid content of printing plate materials, and preferably from 0.1 wt % to 3 wt %.

Further, into the image-forming material of the invention, a plasticizer is added to give flexibility to a coated film according to necessity. Examples of the plasticizer to be used include butyl phthalyl, a polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

Further, in addition to the above, epoxy compounds, vinyl ethers, phenol compounds having a hydroxymethyl group and phenol compounds having an alkoxymethyl group described in Japanese Patent Laid-Open No. 276558/1996 and cross-linking agents having alkali dissolution-inhibiting action described in Japanese Patent Application No. 32837/1997 can adequately be added in accordance with the purpose.

For an example of the compound that has functions of: cross-linking the polymer for use in the invention; and forming an acid-decomposable connecting group between polymers in coating, it is particularly preferred to use vinyl ethers described in Japanese Patent Laid-Open No. 220752/1996.

An image-forming material suitable for making a lithographic printing plate precursor can be prepared by dissolving components of a desired layer coating solution such as a photosensitive layer coating solution or a protective layer coating solution containing the image-forming material of the invention in a solvent and by coating each of them on an appropriate support. For the solvent to be used here, mentioned are ethylene dichloride, cyclohexanone, methylethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethyl acetamide, N,N-dimethyl formamide, tetramethyl urea, N-methylpyrrolidone, dimethylsulfoxide, sulfolane, γ-butyrolactone, toluene and water. However, the invention should not be construed as being limited thereto. These solvents are used in one kind or as a mixture.

A concentration of the components (the entire solid content including additives) in a solvent is preferably in the range from 1 wt % to 50 wt %. Further, a coated amount (as a solid content) on the support obtained after coating and drying is dependent on usage and is preferably in the range from 0.5 g/m$^2$ to 5.0 g/m$^2$ generally in case of a photosensitive printing plate. For a coating method, various methods can be used. For example, bar-coater coating, rotary coating, spray coating, curtain coating, dip coating, air-knife coating, blade coating and roll coating can be mentioned. The less a coating amount is, the higher an apparent photosensitivity rises but the lower a film property of the photosensitive layer degrades.

Into the photosensitive layer coating solution using the image-forming material of the invention, surfactants, e.g., fluorine-based surfactants described in Japanese Patent Laid-Open No. 170950/1987, can be added. An addition amount of the surfactant is preferably in the range from 0.01 wt % to 1 wt % per the entire image-forming materials and more preferably from 0.05 wt % to 0.5 wt %.

A support to be used for the lithographic printing plate precursor of the invention is a dimensionally stable plate-shaped material. Examples of the support include paper, paper laminated with plastics (e.g., polyethylene, polypropylene and polystyrene), a metal plate (e.g., aluminum, zinc and copper), a plastic film (e.g., cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate and polyvinyl acetal) and paper or a plastic film laminated or evaporated with the metal described in the above.

For the support to be used for the lithographic printing plate precursor of the invention, a polyester film and an aluminum plate are preferable. The aluminum plate is particularly preferable, because it is excellent in dimensional stability and relatively inexpensive. The preferable aluminum plate is a pure aluminum plate or an alloy plate having aluminum as the main component and containing a very small quantity of foreign elements. Further, a plastic film laminated or evaporated with aluminum may also be used. Examples of the foreign element contained in aluminum alloy include silicon, iron, manganese, copper, magnesium, chromium, zinc, bismuth, nickel and titanium. A content of the foreign element in alloy is 10 wt % or less at most. Particularly preferable aluminum in the invention is pure aluminum. However, aluminum containing a slight amount of foreign elements may be used, since manufacture of completely pure aluminum is difficult to conduct due to refining techniques. Thus, the aluminum plate applied to the invention is not specified in its composition. Aluminum plates made of materials known and used heretofore can appropriately be utilized. A thickness of the aluminum plate used in the invention is approximately ranged from 0.1 mm to 0.6 mm, preferably from 0.15 mm to 0.4 mm, and preferably in particular from 0.2 mm to 0.3 mm.

Prior to surface-roughening of the aluminum plate, according to desire, a degreasing treatment to remove rolling oil on the surface is performed, for example, with a surfactant, an organic solvent or an alkaline aqueous solution. A roughening treatment of the aluminum plate surface is conducted by various kinds of methods, for example, by a mechanical roughening method, by an electrochemical roughening method dissolving the surface and by a chemical roughening method selectively dissolving the surface. For the mechanical method, a known method such as a ball-grinding method, a brush-grinding method, a blast-grinding method and a buff-grinding method can be used. For the electrochemical roughening method, there is a method in which surface-roughening is conducted by alternative current or by direct current in an electrolytic solution of hydrochloric acid or nitric acid. Further, a method in which both of the above methods are combined as disclosed in Japanese Patent Laid-Open No. 63902/1979 can also be utilized. After an alkali-etching treatment and a neutralization treatment according to necessity, the aluminum plate, the surface of which has thus been roughened, is subject to an anodic oxidation treatment for improving water-retention and abrasion-resistance of the surface at the request. For the electrolyte to be used in the anodic oxidation treatment of aluminum plate, various electrolytes which form a porous oxidized film are possible to use. Generally, sulfuric acid, phosphoric acid, oxalic acid, chromic acid or a mixed acid of them is used. A concentration of these electrolytes is appropriately determined according to the sort of electrolyte.

Processing conditions of the anodic oxidation treatment can not be specified indiscriminately, since the conditions vary according to the sort of electrolyte. However, the following ranges are generally suitable: an electrolyte concentration from 1 wt % to 80 wt %; a solution temperature from 5° C. to 70° C.; a current density from 5 A/dm$^2$ to 60 A/dm$^2$; a voltage from 1 V to 100 V; and an electrolysis time from 10 seconds to 5 minutes. When an amount of anodized film is less than 1.0 g/m$^2$, printing durability becomes insufficient or the so-called "scratch-stain" (non-image area of the printing plate for planography becomes easily scratched and ink adheres to the scratched part in printing) is apt to occur. After being treated in an anodic oxidation treatment, the aluminum surface is treated in a treatment for making it hydrophilic according to necessity. For the treatment for making the surface hydrophilic to be used in the invention, cited is an alkali metal silicate (e.g., an aqueous solution of sodium silicate) method as described in U.S. Pat. No. 2,714,066,3,181,461, 3,280,734 and 3,902,734. In this method, the support is dip-treated or electrolytically treated with an aqueous solution of sodium silicate. In addition to the above, used are methods treated with fluorinated potassium zirconate disclosed in Japanese Patent Publication No. 22063/1961 and with polyvinyl phosphonic acid disclosed in U.S. Pat. Nos. 3,276,868, 4,153,461, and 4,689,272.

The lithographic printing plate precursor in the invention is a plate provided with a positive photosensitive layer containing the photosensitive composition of the invention on the support. According to necessity, an undercoat layer can be provided between them. For undercoat layer components, a variety of organic compounds can be used. The undercoat layer component is selected from the group of the following compounds: carboxymethyl cellulose, dextrin, gum arabic, phosphonic acids having an amino group such as 2-aminoethyl phosphonic acid, organic phosphonic acids such as phenyl phosphonic acid which may have a substituent, naphthyl phosphonic acid, alkyl phosphonic acids, glycero phosphonic acid, methylene diphosphonic acid and ethylene diphosphonic acid, organic phosphoric acids such as phenyl phosphoric acid which may have a substituent, naphthyl phosphoric acid, alkyl phosphoric acids and glycero phosphoric acid, organic phosphinic acids such as phenyl phosphinic acid which may have a substituent, naphthyl phosphinic acid, alkyl phosphinic acids and glycero phosphinic acid, amino acids such as glycine and β-alanine, and hydrochloric acid salts of amines having a hydroxyl group such as hydrochloric acid salt of triethanol amine. The undercoat layer components may be used as two or more kinds in combination.

The organic undercoat layer can be provided by the following methods. Namely, in one method, a solution in which the organic compounds are dissolved in water or in an organic solvent such as methanol, ethanol and methylethyl ketone or in a mixture of them is coated on an aluminum plate and dried. In another method, an aluminum plate is soaked in a solution in which the organic compounds are dissolved in water or in an organic solvent such as methanol, ethanol and methylethyl ketone or in a mixture of them, to be adsorbed by the compounds, then washed with water and the like and dried to obtain an organic undercoat layer. In the former method, a solution of the organic compounds in a concentration ranged from 0.005 wt % to 10 wt % can be coated by various methods. Further, in the latter method, a concentration of the solution is in the range from 0.01 wt % to 20 wt %, and preferably from 0.05 wt % to 5 wt %; a soaking temperature is in the range from 20° C. to 90° C., and preferably from 25° C. to 50° C.; and a soaking time is in the range from 0.1 second to 20 minutes, and preferably from 2 seconds to 1 minute. The solution to be used for this method can also be adjusted to the range of pH from pH 1 to pH 12 with a basic material such as ammonia, triethyl amine or potassium hydroxide, or with an acidic material such as hydrochloric acid or phosphoric acid. Further, a yellow dye can also be added for improving gradation reproducibility of an image recording material. A coated amount of the organic undercoat layer is adequately in the range from 2 mg/m$^2$ to 200 mg/m$^2$, and preferably from 5 mg/m$^2$ to 100 mg/m$^2$. When the coated amount is less than 2 mg/m$^2$, sufficient printing durability can not be obtained. Also, the similar situation occurs when the coated amount is more than 200 mg/m$^2$.

A positive lithographic printing plate precursor thus prepared is usually processed for image exposure and development. Examples of the light source of actinic light to be used for image exposure include a mercury lamp, a metal halide lamp, a xenon lamp, a chemical lamp and a carbon arc lamp. Examples of radiation include electron beams, X-rays, ion beams and infrared light. Further, g-line, i-line, Deep UV light and high density energy beams (laser beams) are also used. For laser beams, mentioned are a helium/neon laser, an argon laser, a krypton laser, a helium/cadmium laser, a KrF excimer laser, a solid laser and a semiconductor laser. In the invention, a light source having emitting wavelength in the region from near infrared to infrared is preferred. In particular, a solid laser and a semiconductor laser are preferable.

As a developer and a replenisher for the lithographic printing plate precursor, an alkaline aqueous solution known heretofore can be used. Examples of the inorganic alkali salt to be used include sodium silicate, potassium silicate, trisodium phosphate, tripotassium phosphate, triammonium phosphate, disodium hydrogen phosphate, dipotassium hydrogen phosphate, diammonium hydrogen phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Also, examples of the organic alkali salt to be used include monomethyl amine, dimethyl amine, trimethyl amine, monoethyl amine, diethyl amine, triethyl amine, mono-isopropyl amine, di-isopropyl amine, tri-isopropyl amine, n-butyl amine, monoethanol amine, diethanol amine, triethanol amine, mono-isopropanol amine, di-isopropanol amine, ethylene imine, ethylene diamine and pyrimidine.

These alkaline agents are used as one kind or as two or more kinds in combination. Among these alkaline agents, particularly preferable developers are aqueous solutions of a silicate such as sodium silicate or potassium silicate. The reason is that developability becomes controllable by a ratio between silicon oxide $SiO_2$ and alkali metal oxide $M_2O$ which are components of the silicate and by their concentrations. For example, alkali metal silicates described in Japanese Patent Laid-Open No. 62004/1979 and Japanese Patent Publication No. 7427/1982 are effectively used.

Further, in case that development is performed with an automatic developing machine, it is known that a large volume of PS (pre-sensitized) plates can be processed without exchanging a developer in the development tank in a long time by adding an aqueous solution (a replenisher) having higher alkalinity than that of the developer. In the invention, such a replenishing system is preferably applied. To the developer and the replenisher, various kinds of surfactants or organic solvents can be added according to necessity, for the purposes of accelerating or retarding developability, of dispersing development scum and of increasing affinity to ink onto an image area of printing plate. For preferable surfactants, anionic, cationic, nonionic and amphoteric surfactants are mentioned. Further, to the developer and the replenisher, a reducing agent such as hydroquinone, resorcin and a sodium salt or a potassium salt of an inorganic acid such as sulfurous acid and hydrogen sulphurous acid, an organic carboxylic acid, an anti-foaming agent and a hard water-softening agent can be added according to necessity. The printing plate processed for development with the developer and the replenisher is post-processed with washing water, a rinse solution containing a surfactant and a grease-desensitizing solution containing gum arabic and a starch derivative. For the post-processing in case of using the image-recording material of the invention for a printing plate, these processes can variously be combined to be used.

These years, in the plate-making industry and the printing industry, automatic developing machines for printing plates have widely been used for rationalization and standardization of printing plate-making works. Such an automatic developing machine generally comprises a developing part and a post-processing part and includes a printing plate-carrying unit, tanks and spray units for each processing solution. With the automatic developing machine, an exposed printing plate is processed for development by spraying each processing solution pumped up into a spray nozzle while the plate is carried horizontally. Further, recently, such a method is known as that a printing plate is processed in a processing solution tank filled with a processing solution while the plate is carried as being soaked by means of submarine type guiding rollers. In such an automatic processing, it is possible that processing can be performed by replenishing each processing solution with a replenisher in proportion to an amount processed or a time on operation. Besides, the so-called disposal processing system in which processing is conducted with substantially fresh processing solutions can also be applied.

A photosensitive lithographic printing plate precursor using the photosensitive composition of the invention will be explained hereinafter. In case that an unnecessary image area (e.g., a film edge mark of the original picture film) exists on a planographic printing plate obtained by image-exposing, developing, washing and/or rinsing and/or gum-coating, elimination of the unnecessary image area is performed. For such elimination, preferred is a method in which an eliminating solution is coated on the unnecessary image area, left as it is in a given time and washed as described in Japanese Patent Publication No. 13293/1990. However, a method in which actinic light guided with an optical fiber is irradiated on the unnecessary image area and then developed as described in Japanese Patent Laid-Open No. 174842/1984 can also be utilized.

The planographic printing plate thus obtained can be provided for printing process after grease-desensitizing gum has been coated according to desire. However, in case that a planographic printing plate having higher printing durability is needed, the plate is subject to a burning treatment. In case that the planographic printing plate is subject to a burning treatment, prior to the burning treatment, it is preferable that the planographic printing plate is treated with a surface treatment solution as described in Japanese Patent Publication Nos. 2518/1986 and 28062/1980 and Japanese Patent Laid-Open Nos. 31859/1987 and 159655/1986. For the method of treatment, applied are a method of coating the surface treatment solution onto the planographic printing plate with sponge or degreased cotton imbibed with the surface treatment solution, a method of coating the surface treatment solution on the planographic printing plate by soaking the printing plate in a vat filled with the surface treatment solution, and a method of coating with an automatic coater. Further, after being coated, it gives more preferable results to make the coated amount uniform by squeezing or with a squeezing roller.

A coated amount of the surface treatment solution is generally appropriate in the range from 0.03 $g/m^2$ to 0.8 $g/m^2$ (a dry weight). The planographic printing plate coated with the surface treatment solution is dried, and then, according to necessity, heated at a high temperature with a burning processor (e.g., a burning processor, BP-1300, sold by Fuji Photo Film Co., Ltd.). In this case, a heating temperature is preferably in the range from 180° C. to 300° C., and a heating time is preferably in the range from 1 minute to 20 minutes, being dependent on the sort of component forming the image.

The planographic printing plate being subject to a burning process can be treated by a process conducted here to fore such as washing and gum-coating according to necessity. When a surface treatment solution containing a water-soluble macromolecular compound is used, the so-called grease-desensitizing treatment such as gum-coating can be omitted. The planographic printing plate obtained by these processes is used for mass-printing by being applied to an off-set printer.

The present invention will specifically be explained with EXAMPLES hereinafter. However, the invention should not be construed as being limited thereto.

General Synthesis Method

In order to synthesize the polymer for use in the invention, monomers (synthesis methods of the monomers are described in Japanese Patent Application No. 268842/1999) having a structure represented by formula (I) are polymerized or these monomers are copolymerized with existing monomers.

EXAMPLES 1 TO 18

Preparation of Support

An aluminum plate (material quality: 1050) of 0.3 mm in thickness was degreased by washing with trichloroethylene, and then the surface of the aluminum plate was sand-grained by using a nylon-brush and a pumice/water dispersion of 400 mesh and thoroughly washed with water. The plate was etched by being soaked in a 25% aqueous solution of sodium hydroxide at 45° C. in 9 seconds and washed, and then further soaked in a 20% nitric acid in 20 seconds, and again washed. The etched amount of sand-grained surface at that time was approximately 3 $g/m^2$. Subsequently, the aluminum plate was provided with a film of 3 $g/m^2$ made by direct current anodic oxidation at a current density of 15 $A/dm^2$ in a 7% sulfuric acid as an electrolytic solution, then washed and dried. Further, the aluminum plate was coated with the undercoat solution described below, and the coated film was dried at 90° C in 1 minutes. The coated amount of coated film after drying was 10 $mg/m^2$.

<Composition of Undercoat Solution>

| | |
|---|---|
| β-alanine | 0.5 g |
| Methanol | 95 g |
| Water | 5 g |

In the following photosensitive solution, a kind of a resin and/or a kind of a dissolution-inhibitor were varied as indicated in TABLE 4 shown below to prepare a coating solution. Each solution was coated on the above support so as to get a coated amount of 1.8 g/m², thereby lithographic printing plate precursors of EXAMPLE 1 to 18 were obtained.

<Photosensitive Solution>

| | |
|---|---|
| Resin [X] in TABLE 4 | 1.0 g |
| Dissolution-Inhibitor 1 [Y] in TABLE 4 | 0.2 g |
| Dissolution-Inhibitor 2 [Z] in TABLE 4 | 0.2 g |
| Dye in which a counter anion of Victoria Pure Blue BOH is a 1-naphthalene sulfonic acid anion | 0.02 g |
| Fluorine-based surfactant (Megafac F-177 manufactured by Dainippon Ink & Chemicals, Inc.) | 0.05 g |
| γ-butyrolactone | 3.0 g |
| Methylethyl ketone | 8.0 g |
| 1-methoxy-2-propanol | 7.0 g |

Evaluation of Printing Durability

Photosensitive/thermosensitive materials obtained in the above were scanning-exposed with a water-cooled Ar ion laser of 350 nm in wavelength or with a semiconductor laser of 830 nm in wavelength respectively at 200 mJ/cm².

After being exposed to form a dot (highlight) of 1% at 2500 dpi, the photosensitive/thermosensitive materials were developed with a developing solution, DP-4 (a solution diluted with water to 1:8), manufactured by Fuji Photo Film Co., Ltd. The photosensitive materials thus obtained were used as a printing plate. After printing with the plate on a printer, Heidel KOR-D, the number of printed sheets was compared as an index of printing durability (assuming the value of EXAMPLE 1 as 100). Those having an index of 100 or more are particularly preferable because they are suitable for a long run printing.

Evaluation of Storage Stability

The photosensitive materials before a laser-exposure were stored under a condition of a high temperature and a high humidity (75% RH, 60° C.) during three days, and then the photosensitive materials after the incubation were used for printing in the same manner as that described in the above and stains in a non-image area were examined. Those having poor storage stability show stains in a non-image area.

These results in both evaluations are shown in TABLE

TABLE 4

| | X | Y | Z | Light Source Wavelength (nm) | Printing Durability (index) | Storage stability (stain) |
|---|---|---|---|---|---|---|
| EXAMPLE 1 | X-1 | Y-1 | None | 350 | 100 | None |
| EXAMPLE 2 | X-2 | Y-2 | None | 350 | 100 | None |
| EXAMPLE 3 | X-3 | Y-1 | None | 350 | 100 | None |
| EXAMPLE 4 | X-4 | Y-1 | None | 350 | 110 | None |
| EXAMPLE 5 | X-5 | Y-3 | None | 350 | 120 | None |
| EXAMPLE 6 | X-6 | Y-4 | None | 350 | 120 | None |
| EXAMPLE 7 | X-7 | Y-1 | None | 350 | 120 | None |
| EXAMPLE 8 | X-8 | Y-3 | None | 350 | 120 | None |
| EXAMPLE 9 | X-9 | Y-4 | None | 350 | 120 | None |
| EXAMPLE 10 | X-1 | Y-1 | Z-1 | 830 | 100 | None |
| EXAMPLE 11 | X-2 | Y-2 | Z-1 | 830 | 110 | None |
| EXAMPLE 12 | X-3 | Y-1 | Z-2 | 830 | 100 | None |
| EXAMPLE 13 | X-4 | Y-1 | Z-2 | 830 | 100 | None |
| EXAMPLE 14 | X-5 | Y-3 | Z-2 | 830 | 120 | None |
| EXAMPLE 15 | X-6 | Y-4 | Z-1 | 830 | 120 | None |
| EXAMPLE 16 | X-7 | Y-1 | Z-1 | 830 | 120 | None |
| EXAMPLE 17 | X-8 | None | Z-2 | 830 | 120 | None |
| EXAMPLE 18 | X-9 | None | Z-1 | 830 | 120 | None |
| COMP.EX.1 | cf-1 | Y-1 | None | 350 | 80 | Stained |
| COMP.EX.2 | cf-2 | Y-2 | None | 350 | 80 | Stained |
| COMP.EX.3 | cf-3 | Y-1 | None | 350 | 80 | Stained |
| COMP.EX.4 | cf-4 | Y-1 | None | 350 | 70 | Stained |
| COMP.EX.5 | cf-5 | Y-3 | None | 350 | 90 | Stained |
| COMP.EX.6 | cf-6 | Y-4 | None | 350 | 90 | Stained |
| COMP.EX.7 | cf-7 | Y-1 | None | 350 | 90 | Stained |
| COMP.EX.8 | cf-8 | Y-3 | None | 350 | 70 | Stained |
| COMP.EX.9 | cf-9 | Y-4 | None | 350 | 90 | Stained |
| COMP.EX.10 | cf-1 | Y-1 | Z-1 | 830 | 80 | Stained |
| COMP.EX.11 | cf-2 | Y-2 | Z-1 | 830 | 80 | Stained |
| COMP.EX.12 | cf-3 | Y-1 | Z-2 | 830 | 70 | Stained |
| COMP.EX.13 | cf-4 | Y-1 | Z-2 | 830 | 80 | Stained |
| COMP.EX.14 | cf-5 | Y-3 | Z-2 | 830 | 90 | Stained |
| COMP.EX.15 | cf-6 | Y-4 | Z-1 | 830 | 70 | Stained |
| COMP.EX.16 | cf-7 | Y-1 | Z-1 | 830 | 90 | Stained |
| COMP.EX.17 | cf-8 | None | Z-2 | 830 | 90 | Stained |
| COMP.EX.18 | cf-9 | None | Z-1 | 830 | 80 | Stained |

COMP.EX.: COMPARATIVE EXAMPLE

Each compound described in TABLE 4 will be indicated hereinafter.

| | | |
|---|---|---|
| (X-1) | P-25 | |
| (X-2) | A mixture of | |
| | P-32 | 0.5 g |
| | m/p-cresol novolac A (m/p ratio = 6/4, Mw: 5000) | 0.5 g |
| (X-3) | A mixture of | |
| | p-35 | 0.4 g |
| | Novolac A described in the above | 0.6 g |
| (X-4) | A mixture of | |
| | p-38 | 0.4 g |
| | Novolac A described in the above | 0.6 g |
| (X-5) | A mixture of | |
| | p-40 | 0.5 g |
| | Novolac A described in the above | 0.5 g |
| (X-6) | A mixture of | |
| | p-44 | 0.5 g |
| | Novolac A described in the above | 0.5 g |
| (X-7) | A mixture of | |
| | p-46 | 0.5 g |
| | Novolac A described in the above | 0.5 g |
| (X-8) | A mixture of | |
| | p-50 | 0.2 g |
| | Novolac A described in the above | 0.8 g |
| (X-9) | A mixture of | |
| | p-52 | 0.3 g |
| | Novolac A described in the above | 0.7 g |

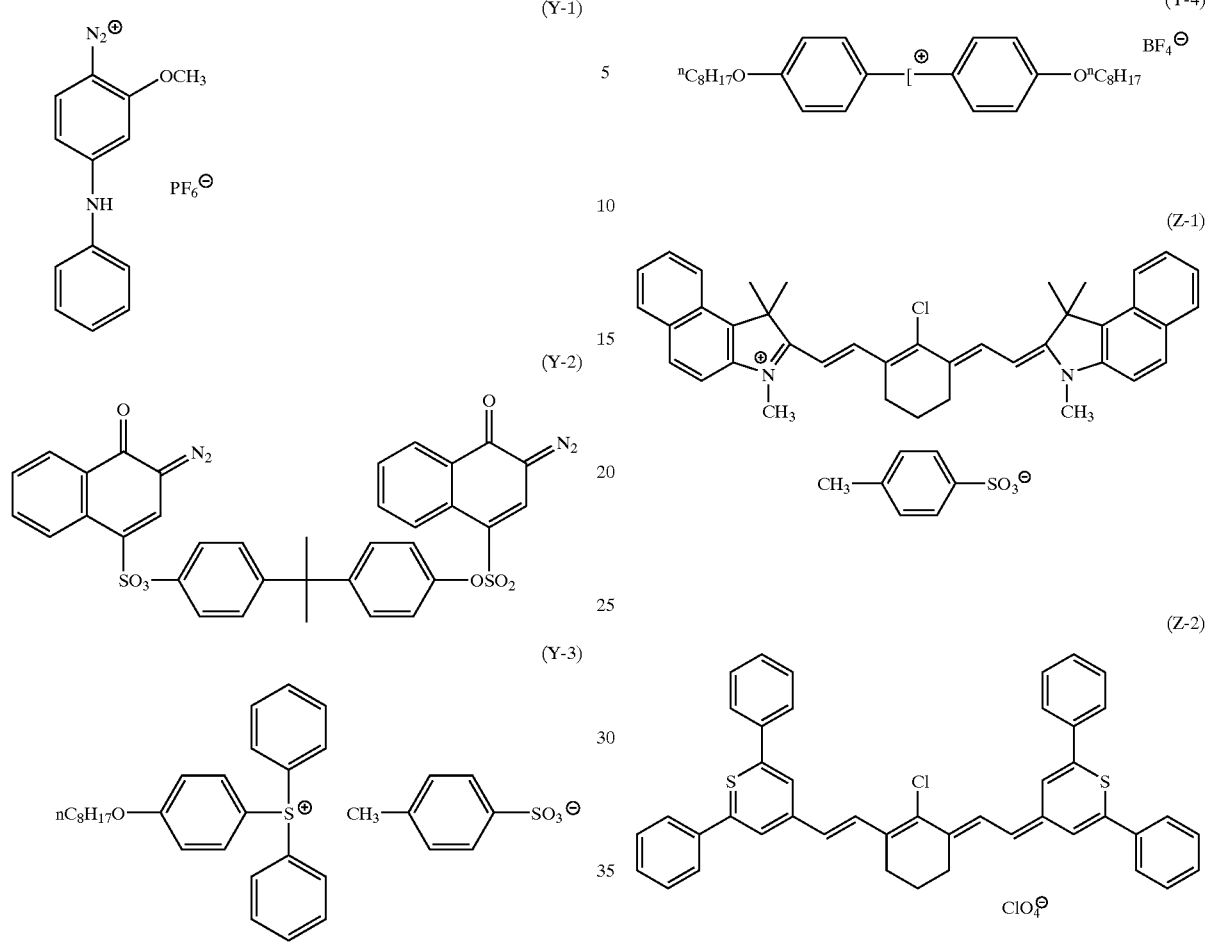
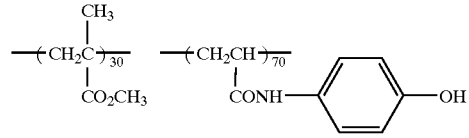
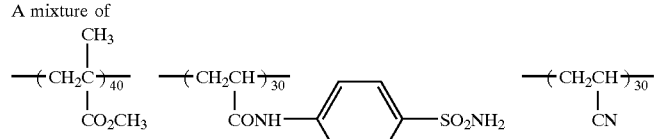
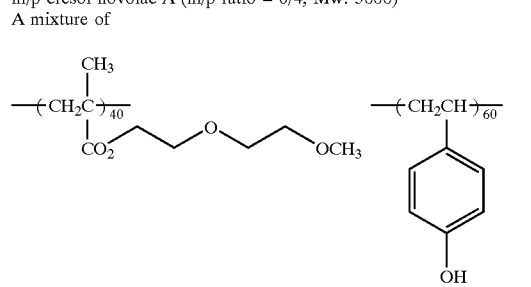
Novolac A described in the above 0.6 g -continued
| | | |
|---|---|---|
| (cf-4) | A mixture of | Mw: 40000 |
| | 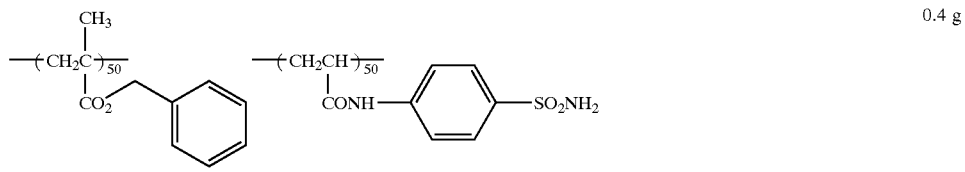 | 0.4 g |
| | Novolac A described in the above | 0.6 g |
| (cf-5) | A mixture of | Mw: 50000 |
| | 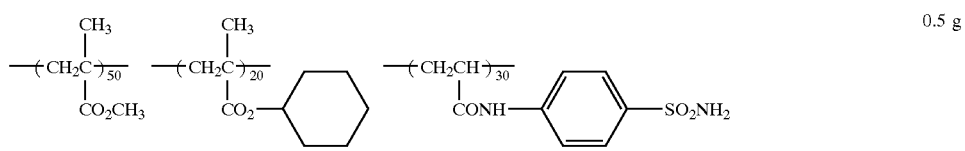 | 0.5 g |
| | Novolac A described in the above | 0.5 g |
| (cf-6) | A mixture of | Mw: 50000 |
| | 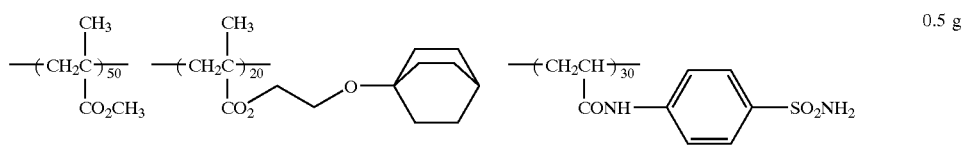 | 0.5 g |
| | Novolac A described in the above | 0.5 g |
| (cf-7) | A mixture of | Mw: 60000 |
| | 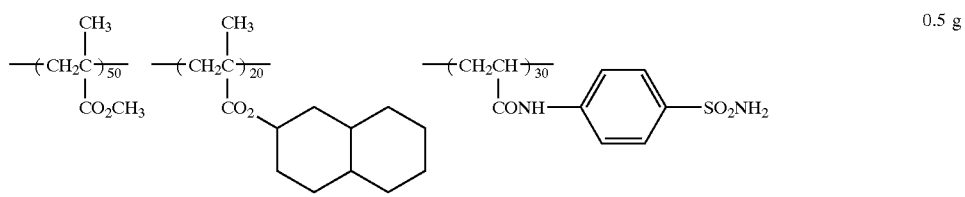 | 0.5 g |
| | Novolac A described in the above | 0.5 g |
| (cf-8) | A mixture of | Mw: 30000 |
| | 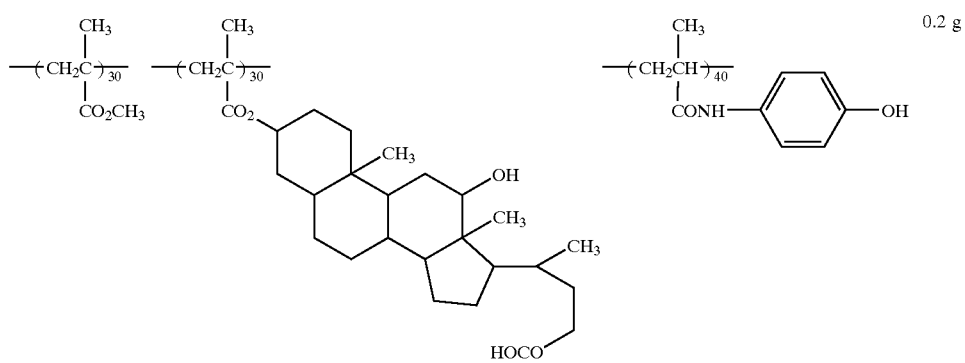 | 0.2 g |
| | Novolac A described in the above | 0.8 g |
| (cf-9) | A mixture of | Mw: 40000 |

-continued

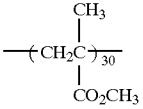 0.3 g

Novolac A described in the above 0.7 g

It is recognized from the results in TABLE 4 that the photosensitive materials of the invention have both advantages of high printing durability and excellent storage stability under a high temperature and a high humidity.

EXAMPLES 21 TO 37

In the following photosensitive solution, a kind of a resin and/or a kind of a dissolution-inhibitor were varied as indicated in TABLE 5 shown below to prepare a coating solution. Each solution was coated on the support used in Examples 1 to 18 above so as to get a coated amount of 1.8 g/m², thereby lithographic printing plate precursors of EXAMPLE 21 to 37 were obtained.

| (Photosensitive Solution) | |
|---|---|
| Polymer [X] of the invention or of comparative examples in TABLE 5 | 2.0 g |
| Additive [Y] such as a dissolution inhibitor in TABLE | 1.0 g |
| Infrared Light-Absorbing Dye [Z] in TABLE 5 | 0.2 g |
| Acid Generator [A] in TABLE 5 | 0.2 g |
| Leuco Crystal Violet (coloring agent) | 0.03 g |
| Fluorine-based Surfactant (Megafac F-177: manufactured by Dainippon Ink & Chemicals, Inc.) | 0.03 g |
| Methylethyl ketone | 20 g |
| 1-methoxy-2-propanol | 20 g |

Evaluation of Printing Durability

The photosensitive/heatsensitive materials described in the above were scanning-exposed to light with a water-cooled Ar ion laser of 350 nm in wavelength or with a semiconductor laser of 830 nm in wavelength, each at 200 MJ/cm².

After being exposed to form a dot (highlight) of 1% at 2500 dpi, the photosensitive/thermosensitive materials were developed with a developing solution, DP-4 (a solution diluted with water to 1:8), manufactured by Fuji Photo Film Co., Ltd. The photosensitive materials thus obtained were used as a printing plate. After printing with the plate on a printer, Heidel KOR-D, the number of printed sheets was compared as an index of printing durability (assuming the value of EXAMPLE 21 as 100). Those having an index of 100 or more are particularly preferable because they are suitable for a long run printing.

Evaluation of Storage Stability

The photosensitive materials before a laser-exposure were stored under a condition of a high temperature and a high humidity (75% RH, 60° C.) during three days, and then the photosensitive materials after the incubation were used for printing in the same manner as that described in the above and stains in a non-image area were examined. Those having poor storage stability show stains in a non-image area.

Both of these results are shown in TABLE 6.

TABLE 5

Photosensitive Materials

| | X | Y | Z | A | Exposure Light Source (nm) |
|---|---|---|---|---|---|
| EXAMPLE 21 | P-1 | Y-1 | None | A-1 | 351 |
| EXAMPLE 22 | P-5 | Y-1 | None | A-1 | 351 |
| EXAMPLE 23 | P-8 | Y-1 | None | A-2 | 351 |
| EXAMPLE 24 | P-10 | Y-2 | None | A-2 | 351 |
| EXAMPLE 25 | P-15 | Y-2 | None | A-3 | 351 |
| EXAMPLE 26 | P-19 | Y-3 | None | A-1 | 351 |
| EXAMPLE 27 | P-30 | Y-3 | None | A-1 | 351 |
| EXAMPLE 28 | P-41 | None | None | A-2 | 351 |
| EXAMPLE 29 | P-72 | None | None | A-3 | 351 |
| EXAMPLE 30 | P-2 | Y-1 | Z-1 | A-1 | 830 |
| EXAMPLE 31 | P-4 | Y-1 | Z-2 | A-2 | 830 |
| EXAMPLE 32 | P-34 | Y-2 | Z-2 | A-3 | 830 |
| EXAMPLE 33 | P-48 | Y-2 | Z-2 | A-1 | 830 |
| EXAMPLE 34 | P-52 | Y-3 | Z-1 | A-1 | 830 |
| EXAMPLE 35 | P-66 | Y-3 | Z-1 | A-2 | 830 |
| EXAMPLE 36 | P-74 | None | Z-2 | A-2 | 830 |
| EXAMPLE 37 | P-80 | None | Z-2 | A-1 | 830 |
| COMPARATIVE EXAMPLE 21 | X-1 | Y-1 | None | A-1 | 351 |
| COMPARATIVE EXAMPLE 22 | X-2 | Y-1 | None | A-1 | 351 |
| COMPARATIVE EXAMPLE 23 | X-3 | Y-1 | None | A-2 | 351 |
| COMPARATIVE EXAMPLE 24 | X-4 | Y-2 | None | A-2 | 351 |
| COMPARATIVE EXAMPLE 25 | X-5 | Y-2 | None | A-3 | 351 |
| COMPARATIVE EXAMPLE 26 | X-6 | Y-3 | None | A-1 | 351 |
| COMPARATIVE EXAMPLE 27 | X-7 | Y-3 | None | A-1 | 351 |
| COMPARATIVE EXAMPLE 28 | X-8 | None | None | A-2 | 351 |
| COMPARATIVE EXAMPLE 29 | X-9 | None | None | A-3 | 351 |
| COMPARATIVE EXAMPLE 30 | X-10 | Y-1 | Z-1 | A-1 | 830 |
| COMPARATIVE EXAMPLE 31 | X-11 | Y-1 | Z-2 | A-2 | 830 |
| COMPARATIVE EXAMPLE 32 | X-12 | Y-2 | Z-2 | A-3 | 830 |
| COMPARATIVE EXAMPLE 33 | X-13 | Y-2 | Z-2 | A-1 | 830 |
| COMPARATIVE EXAMPLE 34 | X-14 | Y-3 | Z-1 | A-1 | 830 |
| COMPARATIVE EXAMPLE 35 | X-15 | Y-3 | Z-1 | A-2 | 830 |
| COMPARATIVE EXAMPLE 36 | X-16 | None | Z-2 | A-2 | 830 |
| COMPARATIVE EXAMPLE 37 | X-17 | None | Z-2 | A-1 | 830 |

TABLE 6

| | Evaluation Results | |
|---|---|---|
| | Printing Durability (Index) | Storage Stability (Stain) |
| EXAMPLE 21 | 100 | None |
| EXAMPLE 22 | 100 | None |
| EXAMPLE 23 | 100 | None |
| EXAMPLE 24 | 100 | None |
| EXAMPLE 25 | 100 | None |
| EXAMPLE 26 | 110 | None |
| EXAMPLE 27 | 120 | None |
| EXAMPLE 28 | 120 | None |
| EXAMPLE 29 | 100 | None |
| EXAMPLE 30 | 100 | None |
| EXAMPLE 31 | 150 | None |
| EXAMPLE 32 | 120 | None |
| EXAMPLE 33 | 120 | None |
| EXAMPLE 34 | 130 | None |
| EXAMPLE 35 | 130 | None |
| EXAMPLE 36 | 100 | None |
| EXAMPLE 37 | 120 | None |
| COMPARATIVE EXAMPLE 21 | 80 | Stained |
| COMPARATIVE EXAMPLE 22 | 90 | Stained |
| COMPARATIVE EXAMPLE 23 | 70 | Stained |
| COMPARATIVE EXAMPLE 24 | 70 | Stained |
| COMPARATIVE EXAMPLE 25 | 80 | Stained |
| COMPARATIVE EXAMPLE 26 | 90 | Stained |
| COMPARATIVE EXAMPLE 27 | 70 | Stained |
| COMPARATIVE EXAMPLE 28 | 80 | Stained |
| COMPARATIVE EXAMPLE 29 | 90 | Stained |
| COMPARATIVE EXAMPLE 30 | 80 | Stained |
| COMPARATIVE EXAMPLE 31 | 80 | Stained |
| COMPARATIVE EXAMPLE 32 | 80 | Stained |
| COMPARATIVE EXAMPLE 33 | 70 | Stained |
| COMPARATIVE EXAMPLE 34 | 70 | Stained |
| COMPARATIVE EXAMPLE 35 | 80 | Stained |
| COMPARATIVE EXAMPLE 36 | 80 | Stained |
| COMPARATIVE EXAMPLE 37 | 70 | Stained |

Each compound described in TABLE 5 will be indicated hereinafter.

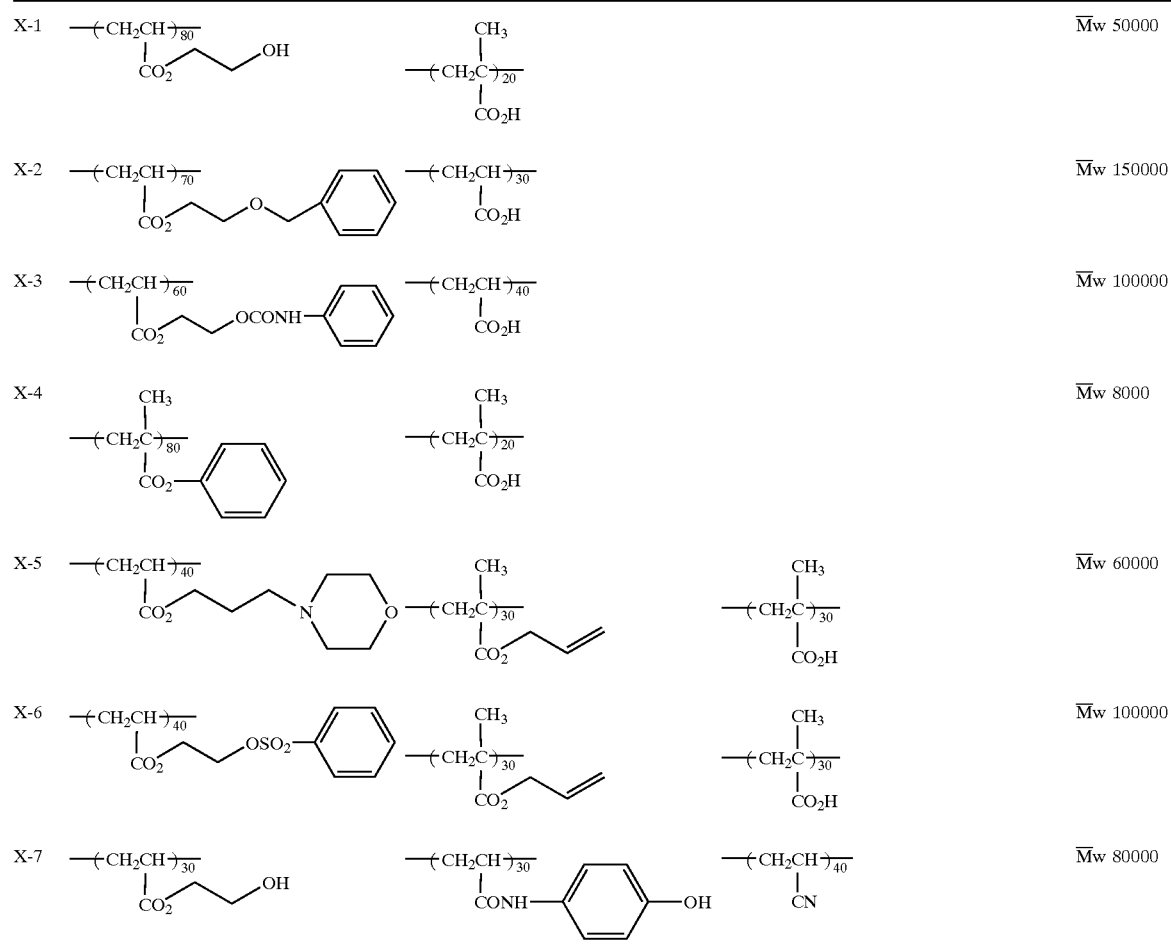

-continued
| | | | | |
|---|---|---|---|---|
| X-8 | 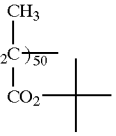 | 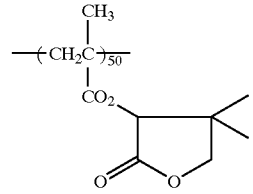 | 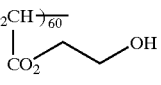 | $\overline{M}w$ 40000 |
| X-9 | 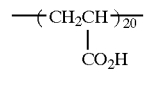 | 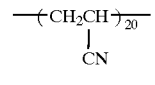 | | $\overline{M}w$ 70000 |
| X-10 | 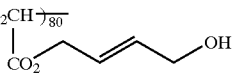 | 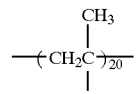 | 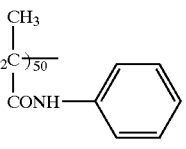 | $\overline{M}w$ 60000 |
| X-11 | 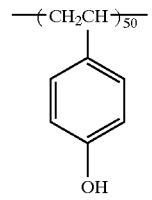 | 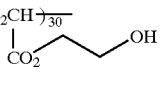 | | $\overline{M}w$ 100000 |
| X-12 | 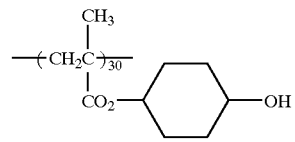 | 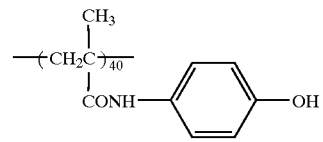 | | $\overline{M}w$ 80000 |
| X-13 | 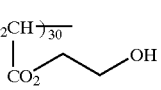 | 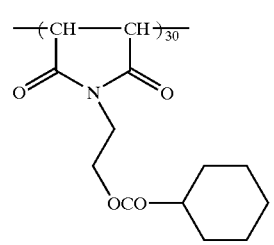 | 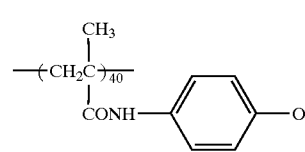 | $\overline{M}w$ 60000 |
| X-14 | 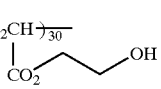 | 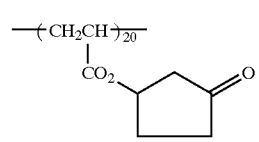 | 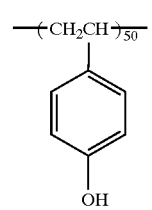 | $\overline{M}w$ 40000 |
| X-15 | 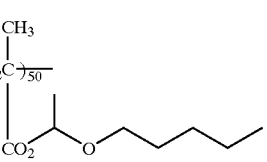 | 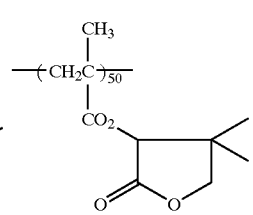 | | $\overline{M}w$ 40000 |
| X-16 | | | | $\overline{M}w$ 70000 |

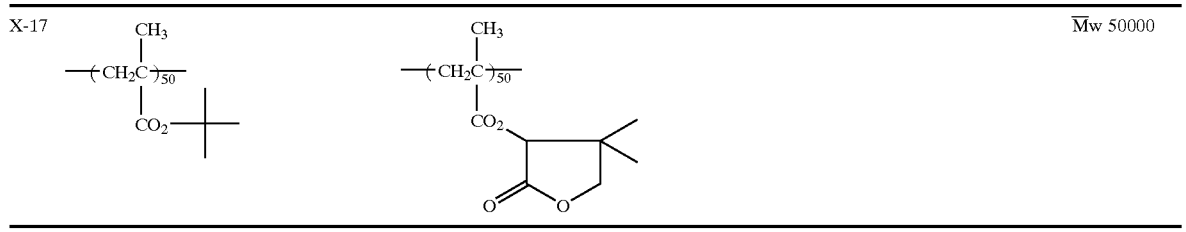

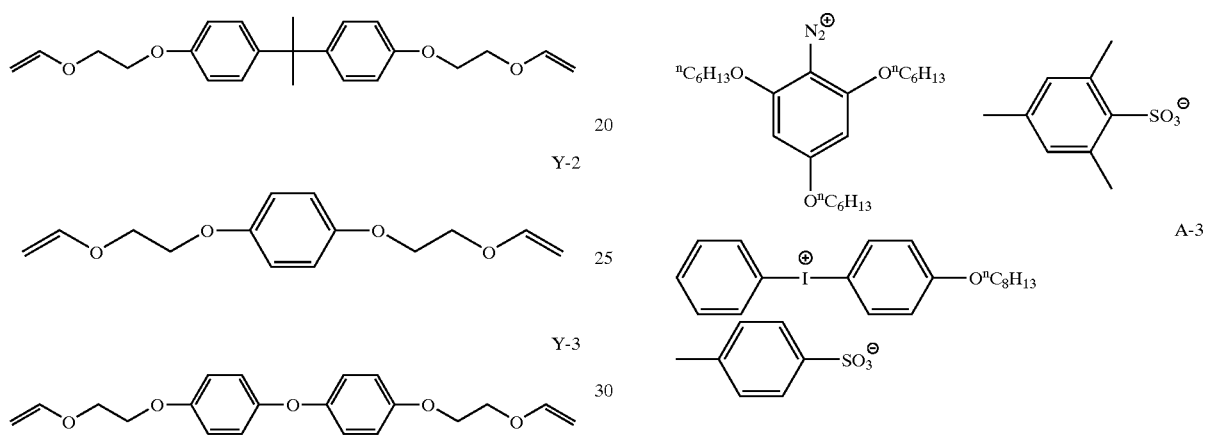

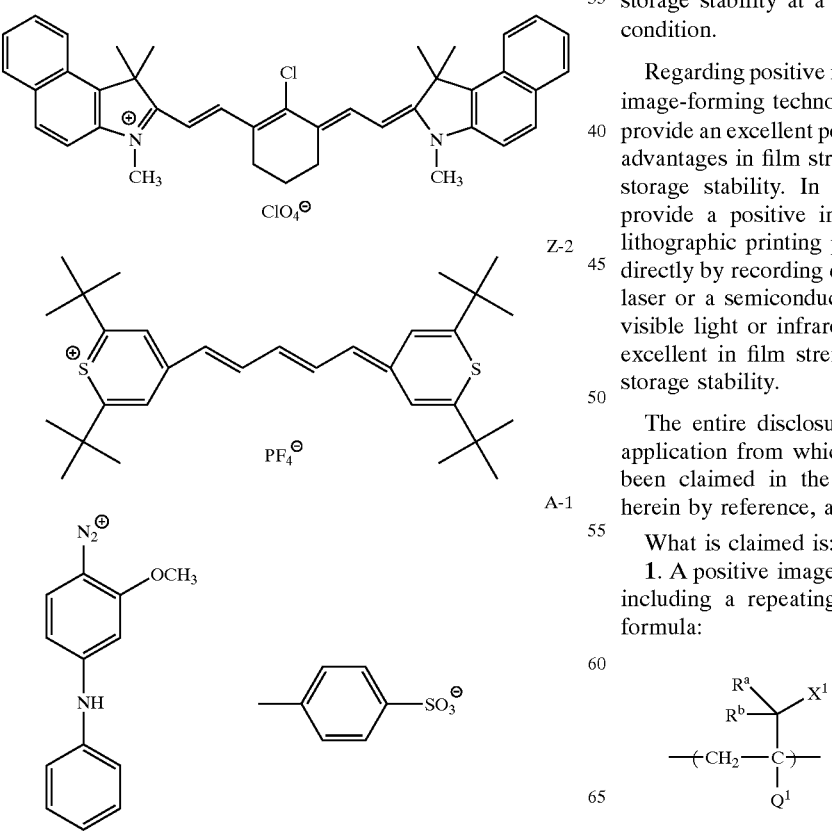

TABLE 6 shows that photosensitive materials of the invention have high durability in printing as well as good storage stability at a high temperature and high humidity condition.

Regarding positive image-forming materials in the field of image-forming technology, the present invention is able to provide an excellent positive image-forming material having advantages in film strength of the photosensitive layer and storage stability. In particular, the invention is able to provide a positive image-forming material suitable to a lithographic printing plate material possible to plate-make directly by recording digital data in a computer with a solid laser or a semiconductor laser irradiating ultraviolet light, visible light or infrared light as well as to result in being excellent in film strength of the photosensitive layer and storage stability.

The entire disclosure of each and every foreign patent application from which the benefit of foreign priority has been claimed in the present application is incorporated herein by reference, as if fully set forth.

What is claimed is:

1. A positive image-forming material comprising a resin including a repeating unit represented by the following formula:

wherein $Q^1$ represents a cyano group (CN) or a group represented by —$COX^2$; $X^1$ and $X^2$ each independently represents a hetero atom or a halogen atom; $R^a$ and $R^b$ each independently represents a hydrogen atom, a halogen atom, a cyano group or an organic residual group; and each of $X^1$ and $X^2$, $R^a$ and $R^b$, $X^1$ and $R^a$, and $X^1$ and $R^b$ may combine with each other to form a cyclic structure.

2. The positive image-forming material as claimed in claim 1, wherein the resin contains an aliphatic cyclic structure in at least one of the main chain and the side chain.

3. The positive image-forming material as claimed in claim 2, wherein the resin contains a repeating unit having an aliphatic cyclic structure in an amount of 10 mol % or more based on the entire repeating units.

4. The positive image-forming material as claimed in claim 1, wherein the resin further contains a repeating unit corresponding to a monomer having an aliphatic cyclic structure.

5. The positive image-forming material as claimed in claim 1, wherein the resin contains the repeating unit corresponding to a monomer having a structure represented by formula (I) in an amount of 5 mol % or more based on the entire repeating units.

6. The positive image-forming material as claimed in claim 1, wherein the resin contains an alkali-soluble group.

7. The positive image-forming material as claimed in claim 1, which comprises the resin in an amount of 5 wt % to 100 wt % based on the amount of entire resins in the positive image-forming material.

8. The positive image-forming material as claimed in claim 1, which further comprises a photosensitive agent.

9. The positive image-forming material as claimed in claim 1, which further comprises a water-insoluble and alkali-soluble resin.

10. The positive image-forming material as claimed in claim 1, wherein $X^1$ and $X^2$ in the formula each independently represents a halogen atom or a non-metallic atom.

11. The positive image-forming material as claimed in claim 10, wherein the non-metallic atom is an oxygen atom, a sulfur atom, a nitrogen atom or a phosphorus atom.

12. The positive image-forming material as claimed in claim 10, wherein the non-metallic atom has a substituent.

13. The positive image-forming material as claimed in claim 1, wherein $X^1$ represents a halogen atom, a hydroxyl group, a substituted oxy group, a mercapto group, a substituted thio group, an amino group, a substituted amino group, a sulfo group, a sulfonato group, a substituted sulfinyl group, a substituted sulfonyl group, a phosphono group, a substituted phosphono group, a phosphonato group, a substituted phosphonato group, a nitro group or a heterocyclic group.

14. The positive image-forming material as claimed in claim 1, wherein $X^2$ represents a halogen atom, a hydroxyl group, a substituted oxy group, a mercapto group, a substituted thio group, an amino group, a substituted amino group or a heterocyclic group.

15. A lithographic printing plate precursor comprising an image-forming layer containing the positive image-forming material as claimed in claim 1.

16. A positive lithographic printing plate precursor comprising: a support that has been subjected to a hydrophilizing treatment; and a positive image-forming layer containing the image-forming material as claimed in claim 1.

17. The positive image-forming material as claimed in claim 1, which further comprises an infrared light-absorbing agent sensitive to an infrared light laser and is capable of being exposed by an infrared laser.

18. The positive image-forming material as claimed in claim 17, wherein the infrared light absorbing agent is an onium-based infrared light-absorbing pigment.

19. The positive image-forming material as claimed in claim 1, which further comprises: a photosensitive material sensitive to an UV or visible light laser having a wavelength of 300 to 700 nm; and a dissolution-inhibiting compound, and is capable of being exposed by an UV or visible light laser.

20. An acid-decomposable photosensitive composition comprising: a photo-acid generator; and a resin including a repeating unit represented by the following formula:

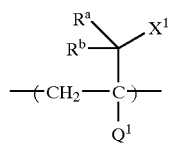

wherein $Q^1$ represents a cyano group (CN) or a group represented by —$COX^2$; $X^1$ and $X^2$ each independently represents a hetero atom or a halogen atom; $R^a$ and $R^b$ each independently represents a hydrogen atom, a halogen atom, a cyano group or an organic residual group; and each of $X^1$ and $X^2$, $R^a$ and $R^b$, $X^1$ and $R^a$, and $X^1$ and $R^b$ may combine with each other to form a cyclic structure.

21. An acid-decomposable lithographic printing plate precursor comprising a photosensitive layer containing the acid-decomposable photosensitive composition as claimed in claim 20.

* * * * *